(12) United States Patent
Lutsen et al.

(10) Patent No.: US 11,557,440 B2
(45) Date of Patent: Jan. 17, 2023

(54) LAYERED HYBRID ORGANIC-INORGANIC PEROVSKITE MATERIALS

(71) Applicants: IMEC VZW, Leuven (BE); UNIVERSITEIT HASSELT, Hasselt (BE)

(72) Inventors: Laurence Lutsen, Hasselt (BE); Dirk Vanderzande, Hasselt (BE)

(73) Assignees: IMEC vzw, Leuven (BE); Universiteit Hasselt, Hasselt (BE)

( * ) Notice: Subject to any disclaimer, the term of this patent is extended or adjusted under 35 U.S.C. 154(b) by 0 days.

(21) Appl. No.: 16/744,686

(22) Filed: Jan. 16, 2020

(65) Prior Publication Data

US 2020/0152395 A1    May 14, 2020

Related U.S. Application Data

(63) Continuation of application No. PCT/EP2018/070011, filed on Jul. 25, 2017.

(30) Foreign Application Priority Data

Jul. 25, 2017 (EP) ..................................... 17182942

(51) Int. Cl.
*H01L 31/042* (2014.01)
*H02N 6/00* (2006.01)
(Continued)

(52) U.S. Cl.
CPC ............ *H01G 9/2009* (2013.01); *C07F 7/24* (2013.01); *H01G 9/0036* (2013.01);
(Continued)

(58) Field of Classification Search
CPC ........................... H01G 9/2009; H01G 9/2018
See application file for complete search history.

(56) References Cited

U.S. PATENT DOCUMENTS

| | | | |
|---|---|---|---|
| 6,420,056 B1* | 7/2002 | Chondroudis | ...... H01L 51/0077 313/506 |
| 2001/0032665 A1* | 10/2001 | Han | ...... H01G 9/2009 429/111 |
| 2016/0099397 A1* | 4/2016 | Maruyama | ...... C01B 19/002 252/519.33 |

FOREIGN PATENT DOCUMENTS

| WO | WO 2017/066160 A1 | 4/2017 | |
|---|---|---|---|
| WO | WO-2017066160 A1 * | 4/2017 | ............... C30B 7/14 |

OTHER PUBLICATIONS

Saparov ("Organic-Inorganic Perovskites: Structural Versatility for Functional Materials Design"), Chem. Rev. 2016, 116, 7, 4558-4596 (Year: 2016).*

(Continued)

*Primary Examiner* — Angelo Trivisonno
(74) *Attorney, Agent, or Firm* — Knobbe Martens, Olson & Bear, LLP

(57) ABSTRACT

In a first aspect, the present invention relates to a perovskite material comprising negatively charged layers alternated with and neutralized by positively charged layers; the negatively charged layers having a general formula selected from the list consisting of: $L_{n-1}M_nX_{3n+1}$, $L_nM_nX_{3n+2}$, and $L_{n-1}M'_nX_{3n+3}$, and the positively charged layers comprising: one or more organic ammonium cations independently selected from monovalent cations Q and divalent cations Q', or a polyvalent cationic conjugated organic polymer Z, wherein Q, Q' and Z comprise each a π-conjugated system in which at least 8 and preferably at least 10 atoms participate, L is a monovalent cation, $M_n$ are n independently selected metal cations averaging a valence of two, $M'_n$ are n independently selected metal cations averaging a valence equal to $2+2/n$, X is a monovalent anion, and n is larger than 1.

20 Claims, 14 Drawing Sheets

(51) Int. Cl.
*H01G 9/20* (2006.01)
*C07F 7/24* (2006.01)
*H01G 9/00* (2006.01)
*H01L 51/00* (2006.01)
*H01L 51/42* (2006.01)

(52) U.S. Cl.
CPC ....... *H01G 9/2018* (2013.01); *H01L 51/0007* (2013.01); *H01L 51/0028* (2013.01); *H01L 51/0077* (2013.01); *H01L 51/4253* (2013.01)

(56) References Cited

OTHER PUBLICATIONS

Wouter T. M. Van Gompel et al., Low-Dimensional Hybrid Perovskites Containing an Organic Cation with an Extended Conjugated System: Tuning the Excitonic Absorption Features, ChemNanoMat, Dec. 9, 2018, 323-327, vol. 5, Issue 3.

Wouter T. M. Van Gompel et al., Towards 2D layered hybrid perovskites with enhanced functionality: introducing charge-transfer complexes via self-assembly, Chem Commun, Feb. 1, 2019, 2481-2484, 55.

* cited by examiner

LAYERED HYBRID ORGANIC-INORGANIC PEROVSKITE MATERIALS

INCORPORATION BY REFERENCE TO RELATED APPLICATIONS

Any and all priority claims identified in the Application Data Sheet, or any correction thereto, are hereby incorporated by reference under 37 CFR 1.57. This application is a continuation of PCT International Application No. PCT/EP2018/070011, filed on Jul. 24, 2018 under the Patent Cooperation Treaty (PCT), which was published by the International Bureau in English on Jan. 31, 2019, which designates the United States and claims the benefit of European Application No. EP 17182942.7 filed Jul. 25, 2017. Each of the aforementioned applications is incorporated by reference herein in its entirety, and each is hereby expressly made a part of this specification.

TECHNICAL FIELD OF THE INVENTION

The present invention relates to hybrid organic-inorganic perovskite materials and in particular to such perovskite materials for use in photovoltaic applications.

BACKGROUND OF THE INVENTION

Three-dimensional (3D) hybrid organic-inorganic perovskites (HOIPs) have emerged over the last few years as promising materials with favourable optoelectronic properties, such as strong absorption coefficients, tunable bandgap, long carrier diffusion lengths and small exciton binding energy. Thanks to those characteristics, 3D perovskite thin-film photovoltaic cells demonstrated drastic improvements in efficiency, together with low material and manufacturing costs. Indeed, they showed an incredibly fast and impressive efficiency improvement going from just 3.8% in 2009 to 22.1% in 2016 with the first solid state photovoltaic cells based on $CH_3NH_3PbI_3$ appearing in the middle of 2012. The cell efficiencies of 3D perovskite-based devices are now approaching those of commercialized second generation photovoltaic technologies. However, today, the stability of perovskite photovoltaic cells is the main bottleneck impeding their commercialization.

Two-dimensional (2D) layered hybrid organic-inorganic perovskite materials are conceptually derived from the 3D HOIPs. Such a transition occurs spontaneously when the organic cation is too large to fit in the cubo-octahedral space of the perovskite structure. Layered perovskite materials are crystalline compounds that self-assemble into a multilayer structure in which layers comprising the coordinated metal ions alternate with layers comprising the large organic cations. The greater tolerance of layered perovskite materials towards structural modification of the organic cations offers new opportunities for tuning the properties of the perovskite materials.

Cao et al. (2015) obtained layered HOIP thin films showing enhanced moisture stability, but at the expense of a poor initial power conversion efficiency (PCE) of 4.0% (Cao, Duyen H., et al. "2D homologous perovskites as light-absorbing materials for solar cell applications." *Journal of the American Chemical Society* 137.24 (2015): 7843-7850.). Tsai et al. (2016) reported a photovoltaic efficiency of 12.5% for devices obtained for the same layered HOIPs, $(BA)_2(MA)_2Pb_3I_{10}$ and $(BA)_2(MA)_3Pb_4I_{13}$ processed under different conditions (Tsai, Hsinhan, et al. "High-efficiency two-dimensional Ruddlesden-Popper perovskite solar cells." *Nature* 536.7616 (2016): 312-316.). The layered HOIP thin films were fabricated using a hot-casting technique allowing the crystallographic planes of the inorganic perovskite component to adopt a strong preferential out-of-plane alignment with respect to the contacts in planar photovoltaic cells. As a result, the PCE was shown to increase drastically from 4% to 12.5%. Further, the devices showed no hysteresis and exhibited an improved stability in comparison to their 3D counterparts. Although promising, the layered perovskite material photovoltaic cells obtained by this approach still exhibit a relatively low PCE (~12.5%) compared to their 3D counterparts (~22%).

There is thus still a need in the art for perovskite materials and photovoltaic cells based thereon with the potential to alleviate some or all of the problems outlined above.

SUMMARY OF THE INVENTION

It is an object of the present invention to provide good perovskite materials.

It is an advantage of embodiments of the present invention that the perovskite materials may be suitable for use in photovoltaic applications.

It is an advantage of embodiments of the present invention that the perovskite materials may have good charge transport properties (e.g. charge mobility).

It is an advantage of embodiments of the present invention that the perovskite materials may have good moisture resistance properties.

It is an advantage of embodiments of the present invention that the perovskite materials have good optoelectronic properties, such as a low exciton binding energy and/or a small bandgap. It is a further advantage of embodiments of the present invention that these optoelectronic properties can be tuned with relative ease.

It is an advantage of embodiments of the present invention that the perovskite materials can be relatively cheap to produce and to manufacture into devices. It is a further advantage of embodiments of the present invention that the perovskite materials can be relatively easily provided in larger scale for coating on larger areas.

It is an advantage of embodiments of the present invention that photovoltaic cells made based on the perovskite materials may have a high power conversion efficiency and good moisture resistance.

The above objective is accomplished by a method and device according to the present invention.

In a first aspect, the present invention relates to a perovskite material comprising negatively charged layers (100) alternated with and neutralized by positively charged layers (200); the negatively charged layer (100) having a general formula selected from the list consisting of:

$$L_{n-1}M_nX_{3n+1} \quad (AI),$$

$$L_nM_nX_{3n+2} \quad (AII), \text{ and}$$

$$L_{n-1}M'_nX_{3n+3} \quad (AIII), \text{ and}$$

the positively charged layer comprising:
  one or more organic ammonium cations independently selected from monovalent cations Q (210) and divalent cations Q' (220), or
  a polyvalent cationic conjugated organic polymer Z,
wherein
Q, Q' and Z comprise each a π-conjugated system in which at least 6 atoms, preferably at least 8 atoms and most preferably at least 10 atoms participate, L (130) is a monovalent cation, $M_n$ (110) are n independently selected metal cations averaging a valence of two, $M'_n$ (110) are n independently selected metal cations averaging a valence equal to $2+2/n$, X (120) is a monovalent anion, and n is larger than 1.

The perovskite material is a single self-assembling material.

In a second aspect, the present invention relates to a method for forming the perovskite material as defined in any embodiment of the first aspect, comprising:

a. forming a precursor mixture by mixing $MX_2$ or $M'X_2$,

LX and

One or more organic ammonium salts independently selected from QX and $Q'X_2$, or a conjugated organic polymer salt $ZX_v$, wherein v is the valence of the polyvalent cationic conjugated organic polymer Z, b. annealing the precursor mixture;

wherein M, M', X, L, Q and Q' are as defined in the first aspect.

In a third aspect, the present invention relates to a use of the perovskite material as defined in any embodiment of the first aspect in a photovoltaic cell.

In a fourth aspect, the present invention relates to a photovoltaic cell comprising an active layer, the active layer comprising the perovskite material as defined in any embodiment of the first aspect.

In a fifth aspect, the present invention relates to a perovskite material comprising negatively charged parts (100) neutralized by positively charged parts (200); the negatively charged parts (100) having a general formula selected from the list consisting of:

$MX_3$, $L_{n-1}M_nX_{3n+1}$, $L_nM_nX_{3n+2}$, and $L_{n-1}M'_nX_{3n+3}$, and the positively charged parts comprising:

one or more organic ammonium cations independently selected from monovalent cations Q (210) and divalent cations Q' (220), or a polyvalent cationic conjugated organic polymer Z, wherein Q, Q' and Z comprise each a π-conjugated system in which at least 6 atoms, preferably at least 8 atoms and most preferably at least 10 atoms participate, L (130) is a monovalent cation, $M_n$ (110) are n independently selected metal cations M averaging a valence of two, $M'_n$ (110) are n independently selected metal cations M' averaging a valence equal to $2+2/n$, X (120) is a monovalent anion, and n is 1 or larger than 1, wherein the one or more organic ammonium cations are two organic ammonium cations forming a charge transfer complex or wherein each positively charged part comprises a further compound (230) capable of forming a charge-transfer complex with at least one of the one or more organic ammonium cations.

In a sixth aspect, the present invention relates to a method for forming crystals of a perovskite material according to the fifth aspect, comprising a. forming a precursor mixture by mixing in a solvent:

one or more compounds independently selected from MX, $MX_2$, and $MX_3$ in such a way that the molar average of the metal M valence is equal to 2, One or more organic ammonium salts independently selected from QX and $Q'X_2$, or a conjugated organic polymer salt $ZX_v$, wherein v is the valence of the polyvalent cationic conjugated organic polymer Z, One or more further compounds (230) capable of forming a charge-transfer complex with at least one organic ammonium cation of the one or more organic ammonium salts, and b. Adding gradually a nonsolvent to the precursor mixture;

wherein M (110), X (120), Q (210), Q' (220), and Z are as defined in the fifth aspect.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
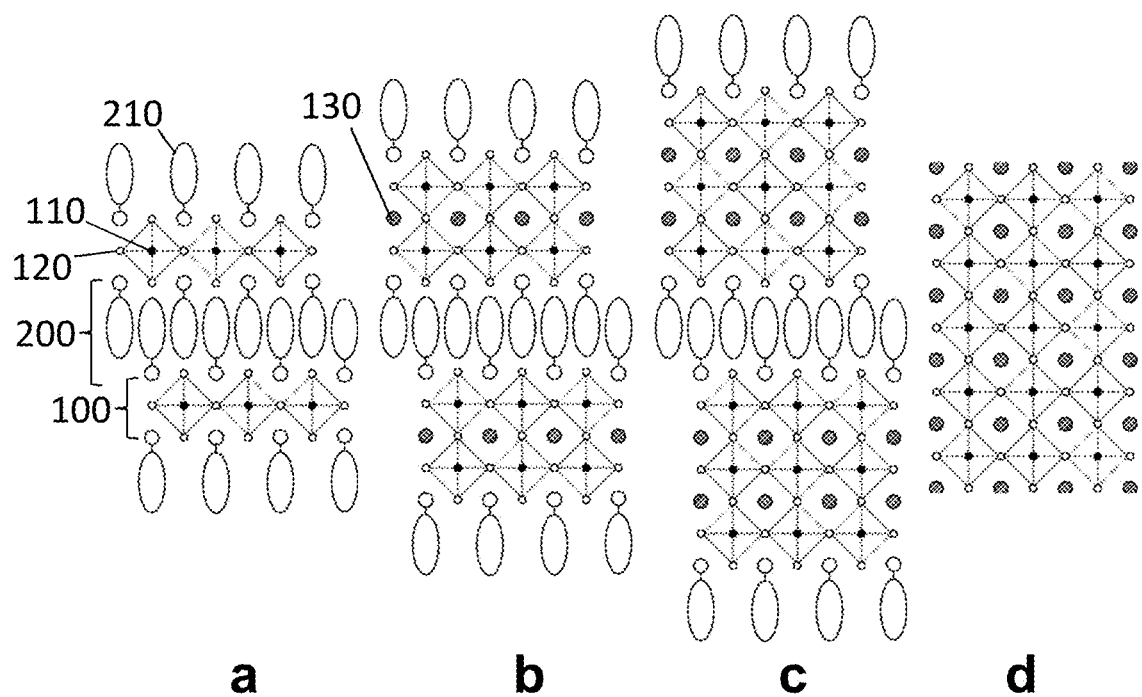
FIG. 1 is a schematic representation of perovskite materials with different n.

In the different figures, the same reference signs refer to the same or analogous elements.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms over, under and the like in the description and the claims are used for descriptive purposes and not necessarily for describing relative positions. It is to be understood that the terms so used are interchangeable with their antonyms under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

The following terms are provided solely to aid in the understanding of the invention.

As used herein, perovskite materials are a class of compounds comprising perovskites as such (i.e. compounds with the same type of crystal structure as $CaTiO_3$; also referred to as 3D perovskites) as well as compounds structurally derived therefrom (e.g. layered perovskite materials)

As used herein, a layered perovskite material is a perovskite material comprising layers structurally derived from 3D perovskites alternating with layers comprising counter ions too large to fit in the first layer. Alternative terms used in the art to refer to layered perovskite materials include 2D perovskites, layered perovskites and 2D layered perovskites. The layers may also be referred to as slabs. It is clear that the terms 2D and 3D, when relating to perovskite materials and unless otherwise specified, refer to the structural motifs inside the material and not to the overall dimensions of the material. For instance, 2D perovskites are called "2D" because they are composed of layers. Within the present invention, the layers derived from 3D perovskites correspond to the negatively charged layers, while the layers comprising the counter ions too large to fit in the negatively charged layer correspond to the positively charged layers. In the present invention, the perovskite material is one single neutral self-assembling material composed of negatively charged layers alternated with positively charged layers.

As used herein and unless provided otherwise, 1D perovskites are perovskite material comprising strings of negatively charged metal halide octahedra which are corner sharing, edge sharing, or face-sharing (i.e. they share halide atoms), and which are surrounded by organic cations. In some embodiments, the strings may be parallel to each other. Adjacent strings do not share atoms with each other. In some embodiments, the strings may be coplanar and may be considered as forming part of a discontinuous layer. A difference with 2D perovskites is that, although 2D perovskites can also be seen as being formed of strings of negatively charged metal halide octahedra, these strings do share halide atoms with each other, thereby forming continuous sheets.

As used herein, a hybrid organic-inorganic perovskite material is a perovskite material comprising both organic and inorganic species (e.g. ions). When the hybrid organic-inorganic perovskite material is also a layered perovskite material and when the layers comprising the too large counter ions comprise organic counter ions, the art may also refer to said layers comprising the too large counter ions as 'the organic layers', while the layers derived from 3D perovskites may be referred to as 'the inorganic layers'. It is however noteworthy that the layers derived from 3D perovskites nevertheless often also comprise smaller organic counter ions, particularly when n>1.

As used herein, reference will be made to layered perovskite materials with n=1, n=2, etc. The n herein refers to the index n as defined in the general formulae AI, AII and AIII in claim 1. The index n further relates to the thickness of the layers derived from 3D perovskites (i.e. the negatively charged layers), wherein such a layer is typically only one $MX_6$ octahedron thick when n=1, two $MX_6$ octahedra thick when n=2 and formally n=∞ for a 3D perovskite; this is schematically depicted in FIG. 1 (see also example 2). "<n>" will be used to denote the nominal composition that was targeted based on the stoichiometry of the precursor solution and "n" will be used to denote the multi-layered $(CA-C_x)_2MA_{n-1}Pb_nI_{3n+1}$ perovskite with that specific number of layers (n), as identified in the mixture. Indeed, when multi-layered $(CA-C_x)_2MA_{n-1}Pb_nI_{3n+1}$ perovskites are targeted, a mixture of perovskites with a different number of layers (n) can often be obtained in thin-film.

As used herein, an atom is said to participate in a π-conjugated system when it has p-orbitals which contribute to the π-conjugated system. Atoms contributing to a π-conjugated system are typically carbon atoms or heteroatoms (e.g. nitrogen, oxygen, sulfur or phosphorus). Hydrogen atoms typically do not contribute to a π-conjugated system and are thus not counted as participating therein.

As used herein, and unless provided otherwise, the term "small molecule" refers to a molecule which is not a polymer, i.e. which is not obtained from the polymerization of a monomer.

As used herein, and unless provided otherwise, the term charge-transfer complex refers to an intermolecular or intramolecular compound composed of an electron donating molecule or part (electron donor) and an electron accepting molecule or part (electron acceptor), the compound exhibiting charge transfer interaction. The charge transfer theory based on the molecular orbital theory has been defined by R. S. Mulliken. When the amount of charge transfer made by a complex DA composed of an electron donor D and an electron acceptor A is represented by δ, the following formula is established, and a new absorption band (charge transfer absorption band) that is not exhibited by an electron donor or an electron acceptor alone appears at a longer wavelength than the wavelength of maximal absorption of the electron donor and than the wavelength of maximal absorption of the electron acceptor. Also, as the electron affinity of the electron acceptor becomes larger and the wavelength of the maximum absorption is shifted toward the longer wavelength side.

$$D+A \leftrightarrows D^{+\delta} \ldots A^{-\delta} \, 0 \leq \delta \leq 1$$

The intermolecular charge transfer complexes used for the invention is an organic charge transfer complex composed of an organic electron donor and an organic electron acceptor. The relevant organic electron donor and organic electron acceptor are both neutral compounds that are not ionized or partially ionized before the donor and the acceptor form a complex, and when these are mixed and the molecules begin to approach, charge transfer occurs, and a complex is formed.

In a first aspect, the present invention relates to a perovskite material comprising negatively charged layers alternated with and neutralized by positively charged layers; each negatively charged layer having a general formula selected from the list consisting of:

$L_{n-1}M_nX_{3n+1}$, $L_nM_nX_{3n+2}$, and $L_{n-1}M'_nX_{3n+3}$, and each positively charged layer comprising:
  one or more organic ammonium cations independently selected from monovalent cations Q and divalent cations Q', or
  a polyvalent cationic conjugated organic polymer Z, wherein
Q, Q' and Z comprise each a π-conjugated system in which at least 6 atoms, preferably at least 8 atoms and most preferably at least 10 atoms participate,
L is a monovalent cation,
$M_n$ are n independently selected metal cations M averaging a valence of two,
$M'_n$ are n independently selected metal cations M' averaging a valence equal to 2+2/n,
X is a monovalent anion, and
n is larger than 1.

Optionally, one or more X in the formulae above may be substituted by a corresponding number of anions independently selected from $Se^{2-}$ and $S^{2-}$ if a corresponding number of divalent metal cations M or M' are replaced by a corresponding number of trivalent metal cations M or M'.

In any embodiment of the first aspect, n is preferably from 2 to 60, more preferably from 2 to 19, yet more preferably from 2 to 9, yet more preferably from 2 to 4 and most preferably 2 or 3.

It is an advantage of embodiments of the present invention that the positively charged layers comprising a π-conjugated system in which at least 6 atoms, preferably at least 8 atoms and most preferably at least 10 atoms participate i, advantageously improves the charge transport properties of the perovskite material as a whole. Without being bound by theory, it is believed that the π-conjugated systems facilitate transport between the negatively charged layers and the positively charged layers as well as inside the positively charged layers. This is particularly so when these π-conjugated systems can interact with each other (e.g. through π-π stacking or the formation of charge transfer complexes) and/or form part of an extended conjugated system (e.g. as is the case for π-conjugated polymers). It is expected that more atoms participating in the π-conjugated system would bring better charge transport properties. Furthermore, the compounds Q and Q' and the polymer Z typically advantageously absorb light themselves, thereby improving the optoelectronic properties of the perovskite material as a whole. For example, the Q; Q'; Q and Q'; or Z may be selected such that the positively charged layers absorb light in a range which complements the absorption by the negatively charged layers.

A perovskite material comprising negatively charged layers having the general formula $L_{n-1}M'_nX_{3n+3}$ with n>2 are less preferred than other perovskite materials covered by the first aspect because they require the presence of two or more metal cations having different valences and being present in well-defined proportions. This makes their synthesis more complicated in practice even if it proceeds generally in a similar way to the synthesis of the other perovskite material described herein.

Preferred are perovskite materials comprising negatively charged layers having the general formula $L_{n-1}M_nX_{3n+1}$.

The perovskite material of the present invention is a layered perovskite material and is a hybrid organic-inorganic layered perovskite material. In embodiments, the perovskite material may have the general chemical formula $Q_2L_{n-1}M_nX_{3n+1}$, $Q_2L_nM_nX_{3n+2}$, $Q_2L_{n-1}M'_nX_{3n+3}$, $Q'L_{n-1}M_nX_{3n+1}$, $Q'L_nM_nX_{3n+2}$, $Q'L_{n-1}M'_nX_{3n+3}$, $Z(L_{n-1}M_nX_{3n+1})_v$, $Z(L_nM_nX_{3n+2})_v$, $Z(L_{n-1}M'_nX_{3n+3})_v$, wherein v is the average valence of the polymer Z. These nine global chemical formulae correspond to the combinations obtained when selecting one of AI, AII or AIII for the negatively charged layer and wherein the positively charged layer consists of Q, Q' or Z. Nevertheless, in more general cases, more than one Q, more than one Q' or a combination of one or more Q and one or more Q' may simultaneously enter the general chemical formula of the perovskite material. Examples are $Q^aQ^bL_{n-1}M_nX_{3n+1}$, $Q'^a_{1/2}Q'^b_{1/2}L_nM_nX_{3n+2}$, or $QQ'_{1/2}L_{n-1}M'_nX_{3n+3}$, wherein the superscripts a and b denote cations of different chemical natures. In preferred embodiments, Q may be selected from CA, CA', (TTF-C$_2$—NH$_3$)$_2$ and (TCNQ-C$_2$—NH$_3$)$_2$. For instance, the perovskite material may be $CA_2MA_{n-1}Pb_nI_{3n+1}$, $CA'_2MA_{n-1}Pb_nI_{3n+1}$, $(TTF-C_2—NH_3)_2MA_{n-1}Pb_nI_{3+1}$ or $(TCNQ-C_2—NH_3)_2MA_{n-1}Pb_nI_{3+1}$ (wherein CA is carbazole pentyl ammonium CA' is carbazole butyl ammonium, MA is methylammonium, TTF-C$_2$—NH$_3$ is 3-([2,2'-bi(1,3-dithiolylidene)]-4-yl)prop-2-en-1-ammonium iodide and TCNQ-C$_2$—NH$_3$ is 2-ammonium iodide ethyl 2-cyano-2-(4-(dicyanomethylene)cyclohexa-2,5-dien-1-ylidene)acetate). In these embodiments, n is preferably from 2 to 60, more preferably from 2 to 19, yet more preferably from 2 to 9, yet more preferably from 2 to 4 and most preferably 2 or 3.

The negatively charged layers can be seen as layers which are structurally derived from 3D perovskites. The formulae AI to AIII result in layers with a different orientation, i.e. layers with formula AI are <100> oriented, AII <110> oriented and AIII <111> oriented. Index n may in general be selected independently for each negatively charged layer. This means that n in the general formula of the material may take a fractional value. In some embodiments, the perovskite material may further comprise one or more negatively charged layers for which n=1. Nevertheless, when looking globally (as opposed to only at a single negatively charged layer), the value of n averaged over all negatively charged layers, i.e. the value of n in the general formula, is always larger than 1 for the perovskite materials in the present invention. In preferred embodiments, the negatively charged layers may be selected from the list consisting of $MA_{n-1}Pb_nI_{3n+1}$, $MA_nPb_nI_{3n+2}$, $FA_{n-1}Pb_nI_{3n+1}$, and $FA_nPb_nI_{3n+2}$ (wherein MA is methylammonium and Fa is formamidinium). In these embodiments, n may preferably be 2 or 3.

In most preferred embodiments, the negatively charged layers may be selected from the list consisting of $MA_{n-1}Pb_nI_{3n+1}$ and $MA_nPb_nI_{3n+2}$ (wherein MA is methylammonium). In these embodiments, n may preferably be 2 or 3.

Certain selections of M, X and L are more stable than others. based for example on their relative volume. For example, if a very small M would be selected in combination with a very large L, this mismatch may result in the material adopting a less stable crystal structure than if M is larger and L is smaller. These considerations are well known to the person skilled in the art. Multiple possible combinations for forming stable perovskite structures have been described in the art and throughout this text. Furthermore, computational studies may be performed to assess the stability of a certain combination of M, X and L, e.g. Kieslich et al. (2015) investigated the stability of over 2000 possible L-M-X permutations using an extended tolerance factor approach (Kieslich, Gregor, Shijing Sun, and Anthony K. Cheetham. "An extended tolerance factor approach for organicinorganic perovskites." *Chemical Science* 6.6 (2015): 3430-3433.). Moreover, the skilled person may always adopt a trial-and-error approach, wherein a combination of M, X and L is made and subsequently the crystal structure of the obtained material is investigated.

In embodiments, each $M_n$ may consist of one or more divalent metal cations, of a combination of trivalent and monovalent metal cations in equimolar amounts or of one or more divalent metal cations on one hand and a combination of trivalent and monovalent metal cations in equimolar amounts on another hand. In embodiments, each M in $M_n$ may be independently selected from the list consisting of $Be^{2+}$, $Mg^{2+}$, $Ca^{2+}$, $Sr^{2+}$, $Ba^{2+}$, $Mn^{2+}$, $Fe^{2+}$, $Co^{2+}$, $Ni^{2+}$, $Pd^{2+}$, $Pt^{2+}$, $Cu^{2+}$, $Zn^{2+}$, $Cd^{2+}$, $Hg^{2+}$, $Ge^{2+}$, $Sn^{2+}$, $Pb^{2+}$, $Eu^{2+}$, $Tm^{2+}$, $Yb^{2+}$ $Bi^{3+}$ and $Ag^+$ as long as their valence average two. For instance, if $Bi^{3+}$ is present in the general formula of the perovskite material, an equimolar amount of a monovalent metal cation such as $Ag^+$ should be present as well. In embodiments, each M in $M_n$ may be the same. In preferred embodiments, M may be $Pb^{2+}$. $Pb^{2+}$ is advantageously the most commonly used divalent metal cation for hybrid organic-inorganic perovskite materials, and its chemistry and properties in this field have been well investigated.

In embodiments, each M in $M'_n$ may be independently selected from the list consisting of $Be^{2+}$, $Mg^{2+}$, $Ca^{2+}$, $Sr^{2+}$, $Ba^{2+}$, $M_n^{2+}$, $Fe^{2+}$, $Co^{2+}$, $Ni^{2+}$, $Pd^{2+}$, $Pt^{2+}$, $Cu^{2+}$, $Zn^{2+}$, $Cd^{2+}$, $Hg^{2+}$, $Ge^{2+}$, $Sn^{2+}$, $Pb^{2+}$, $Eu^{2+}$, $Tm^{2+}$, $Yb^{2+}$ $Bi^{3+}$ and $Ag^+$ as long as their valence average 2+2/n.

In embodiments, X may be selected from the list consisting of halides (e.g. $F^-$, $Cl^-$, $Br^-$, $I^-$ or $At^-$), borohydrides (e.g. $BH_4^-$), cyanides (i.e. $CN^-$), azides ($N_3^-$), carboxylates (e.g. formate, acetate or ethyl trifluoroacetate), sulfonates (e.g. trifluoromethanesulfonate or methyl methanesulfonate) and borates (e.g. fluoroborate), or may be a combination thereof. In preferred embodiments, X may be $Cl^-$, $Br^-$, $I^-$, or combinations thereof. $Cl^-$, $Br^-$ and $I^-$ are advantageously the most commonly used monovalent anions for hybrid organic-inorganic perovskite materials, and their chemistry and properties in this field have been well investigated. Furthermore, also mixed halide (i.e. combining two or more halides) perovskite materials, have been routinely studied.

In embodiments, L may be a monovalent cation comprising a nitrogen atom with a formal positive charge. In some embodiments, L may be a monovalent organic ammonium cation of formula $R'NH_3$ (wherein R' is an aliphatic group having up to 4 carbon atoms), such as methylammonium, dimethylammonium, ethylammonium or tetramethylammonium. In other embodiments, L may be ammonium, hydroxylammonium, hydrazinium, azetidinium, formamidinium, imidazolium, guanidinium, thiazolium, 3-pyrrolinium, tropylium or pyridinium. In preferred embodiments, L may be methylammonium or formamidinium. Methylammonium and formamidinium are advantageously the most commonly used monovalent cations for hybrid organic-inorganic perovskite materials, and their chemistry and properties in this field have been well investigated.

In embodiments, the positively charged layers may comprise one or more compounds Q. In embodiments, the positively charged layer may comprise one or more compounds Q'. In embodiments, the positively charged layer may comprise one or more compounds Q and one or more compounds Q'. In embodiments, the positively charged layer may consist of the one or more compounds Q and/or Q'. When a monovalent cations Q is present in the positively charged layer, two monovalent cations Q are needed per unit of the formula AI, AII or AIII in order to obtain a neutral charge; this situation is schematically depicted in FIG. 2a (see also example 2). Contrary thereto, only one divalent molecule Q' is needed to achieve the same; this situation is schematically depicted in FIG. 2b (see also example 2). Similarly, when the positively charged layers comprise both molecules Q and Q', twice the molar amount of molecules Q will be present as compared to the molar amount of molecules Q' which have been formally exchanged therefor. The divalent Q' may preferably interact with two negatively charged layers, i.e. a first ionic group in the molecule may interact with a first negatively charged layer and a second ionic group in the molecule may interact with a second negatively charged layer; this situation is also visualized in FIG. 2b.

In embodiments, the Q may have a general chemical formula $R—(CH_2)_m—NH_3^+$ and the Q' may have a general chemical formula $NH_3^+—(CH_2)_m—R—(CH_2)_{m'}—NH_3^+$; wherein R comprises the π-conjugated system; wherein $0 \leq m \leq 20$; and $0 \leq m' \leq 20$. In preferred embodiments, an ammonium group in the Q or the Q' may be directly attached to the conjugated system. By having the ammonium group directly attached to the conjugated system (which implies that m and/or m' is 0), the spatial distance between the negatively charged layer and the conjugated system is advantageously reduced, thereby facilitating charge transport between the negatively charged layer and the conjugated system.

In embodiments, a plurality of the Q and/or Q' may interact with one another by π-π stacking of the π-conjugated systems they comprise. π-π stacking advantageously facilitates charge transport from one π-conjugated system to another, thereby improving the charge transport properties of the layer and of the perovskite material as a whole.

In a first type of embodiments, Q may for example have a structure: $NH_3^+—R'-J$ such as $NH_3^+—R'-D'$, $NH_3^+—R'-A'$, $NH_3^+—R'-A'-D'$, or $NH_3^+—R'-D'-A'$ wherein J is a conjugated group comprising a pi conjugated system in which at least 6, preferably at least 8 and more preferably at least 10 atoms participate, R' is either a single bond or a hydrocarbon, saturated or not, having up to 20 carbon atoms, D' is one or more covalently linked electron rich groups, A' is one or more covalently linked electron poor groups. For instance, each Q may be independently selected from:

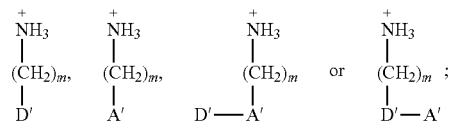

wherein $0 \leq m \leq 20$, D' is one or more covalently linked electron rich groups and A' is one or more covalently linked electron poor groups. This is schematically depicted in FIG. 2a (see also example 2).

In the same type of embodiments, Q' may for example have a structure $NH_3^+—R'-J-R''—NH_3^+$ wherein R' and R'' are independently selected from a single bond or a hydrocarbon, saturated or not, having up to 20 carbon atoms. For instance, each Q' may be independently selected from:

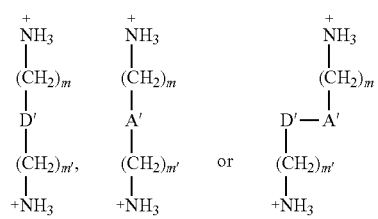

wherein $0 \leq m \leq 20$, $0 \leq m' \leq 20$, D' is one or more covalently linked electron rich groups and A' is one or more covalently linked electron poor groups. This is schematically depicted in FIG. 2b (see also example 2). Donor groups (or electron-rich groups) may for example be, but not limited to, any of the structures:

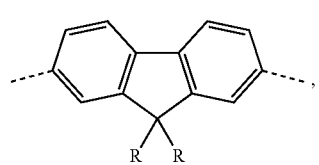
D1

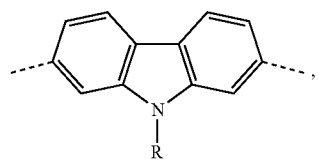
D2

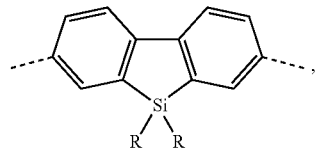
D3

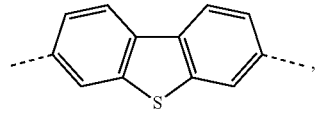
D4

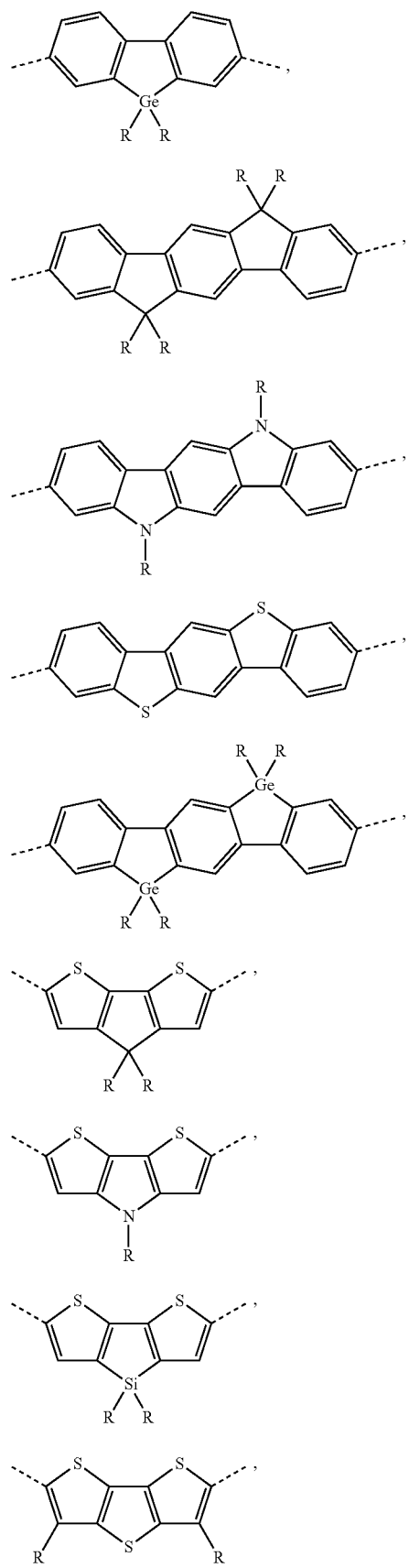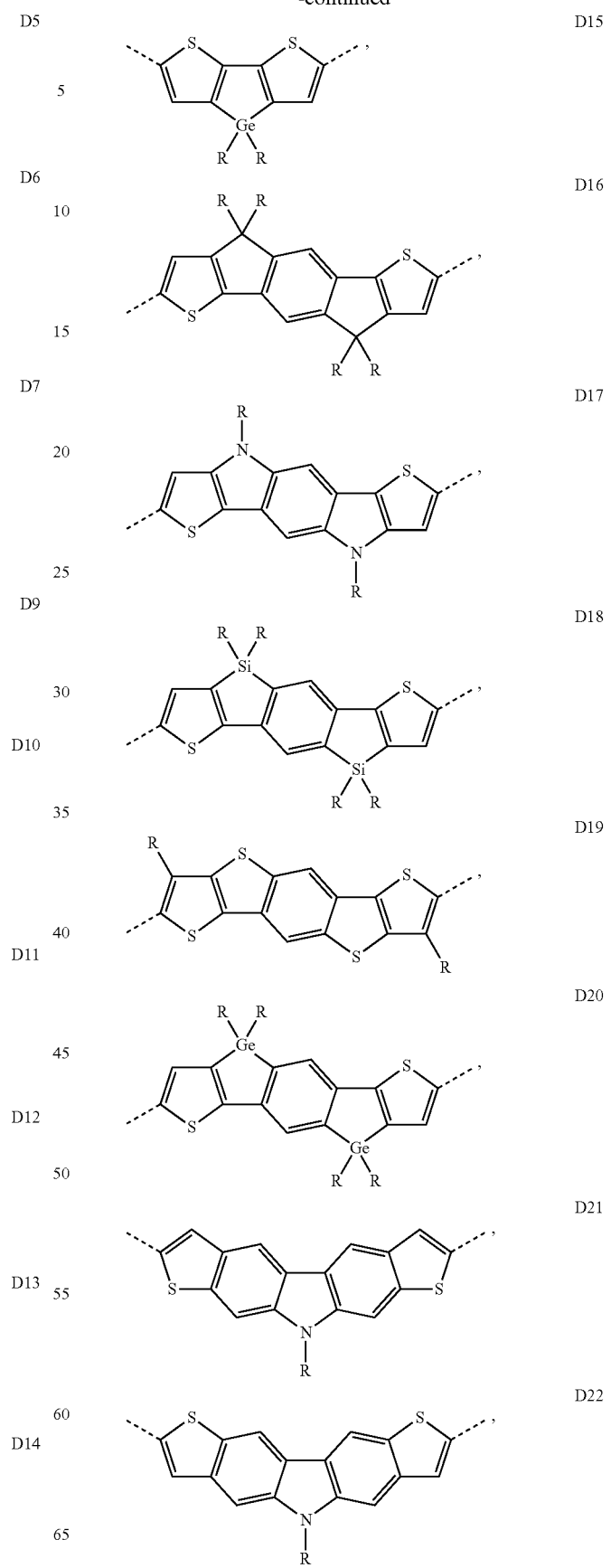

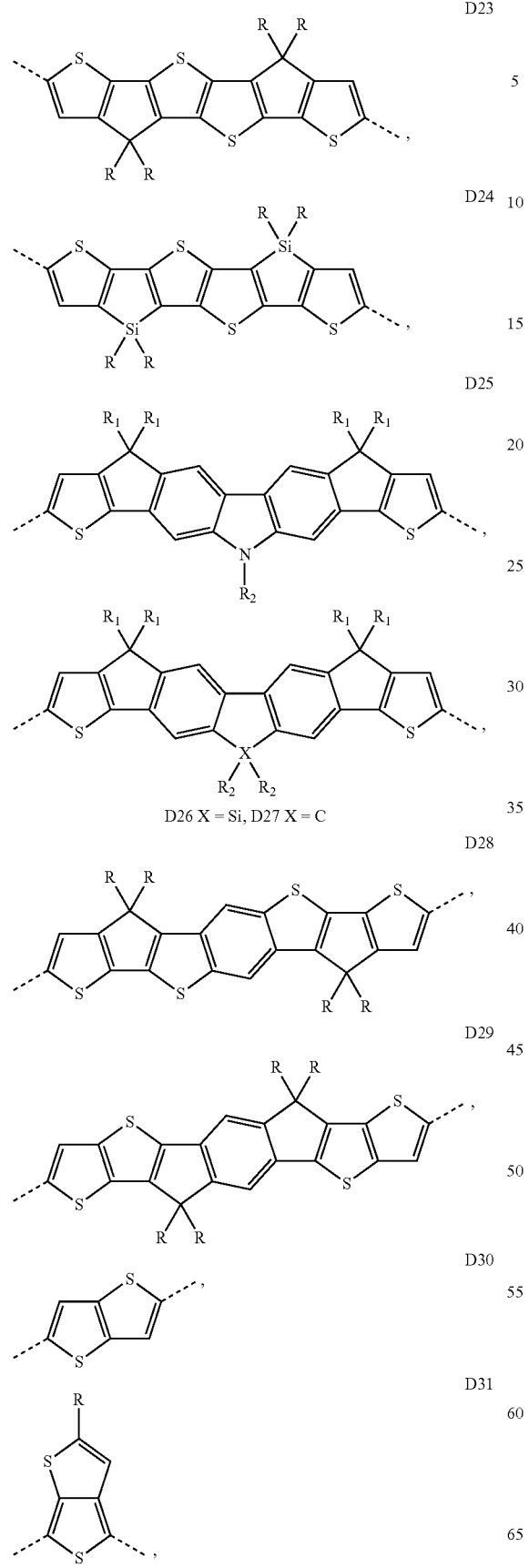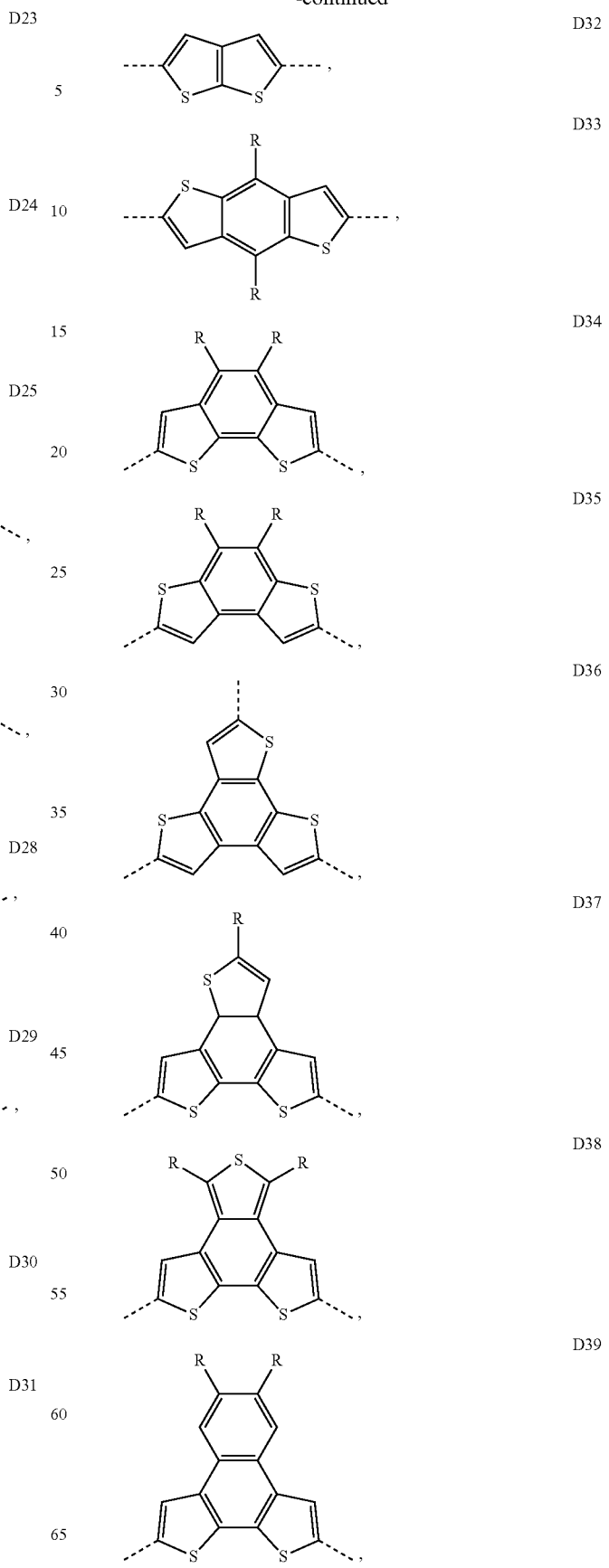

-continued

D40, D41, D42, D43, D44, D45, D46 wherein R may be H, an organic group, such as an alkyl chain comprising up to 12 carbon atoms, or a point of attachment to the rest of the compound Q or Q'. The dotted or dashed lines indicate possible points of attachment of these groups to the rest of the compound Q or Q'. Electron poor groups may for example be, but not limited to, any of the structures:

A1, A2, A3, A4, A5, A6

A7 X = N-R
A8 X = O
A9 X = Se
A10 X = Te

A11 X = S, Y = F, Z = H
A12 X = S, Y = F, Z = F
A13 X = S, Y = H, Z = OC$_8$H$_{17}$
A14 X = N-R, Y = F, Z = F

A15

-continued
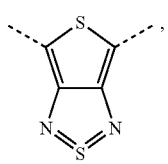
A16
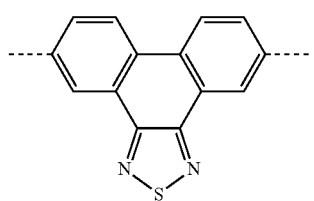
A17
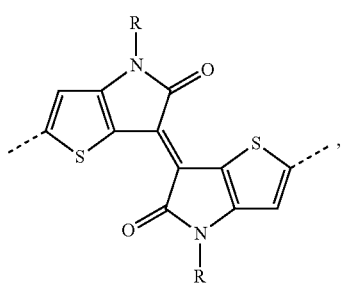
A47
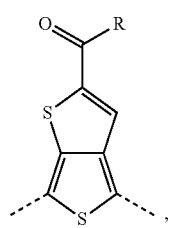
A48
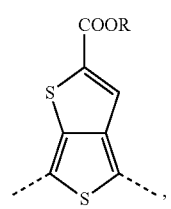
A49
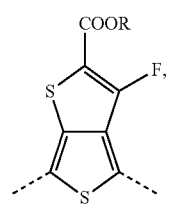
A50
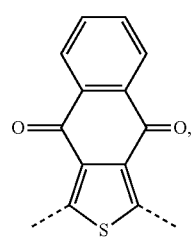
A51
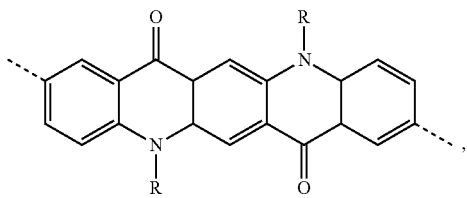
A52
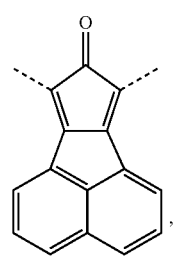
A53
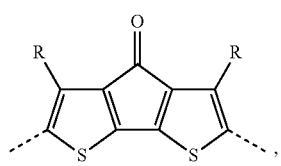
A54
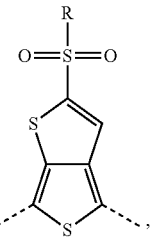
A55
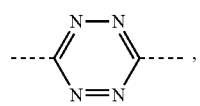
A56
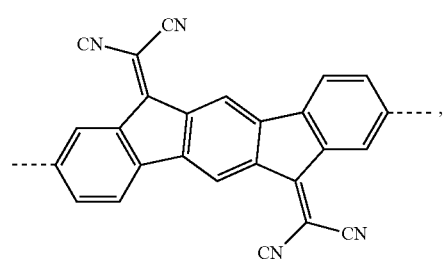
A57
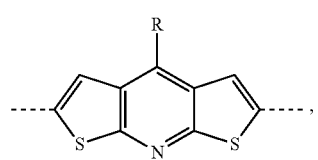
A58

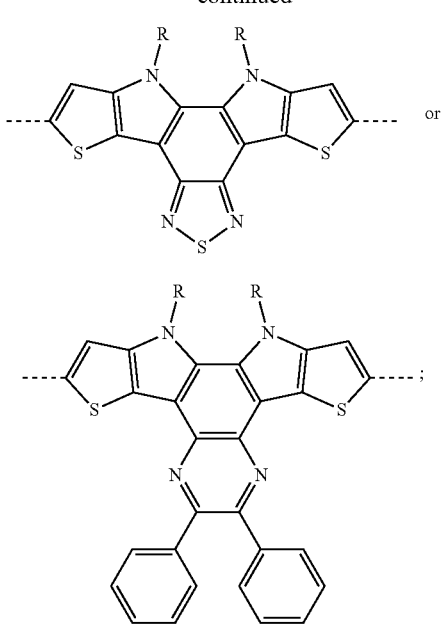

wherein R may be H, an organic group, such as an alkyl chain comprising up to 10 carbon atoms, or a point of attachment to the rest of the compound Q or Q'. The dotted lines indicate possible points of attachment of these groups to the rest of the compound Q or Q'.

In order to form the compounds Q or Q', one and respectively two ammonium groups must be provided to these groups J. One way to achieve this is to proceed analogously to example 1b. Another way to achieve this is to provide these groups with a first functional group at one or both of the positions indicated by the dotted lines, and to react them with a protected amine-functionalised aryl compound bearing a second functional group capable to react with the first functional group. Preferably, a cross-coupling reaction is used. For instance, the first functional group could be a halogen group and the second group could be a boronic acid or boronic ester group (Suzuki coupling) or a stannane group (Stille coupling). Alternatively, the first functional group could be a boronic acid or boronic ester group (Suzuki coupling) or a stannane group (Stille coupling) and the second functional group could be a halogen or a pseudo-halogen. The protecting groups can then be removed at the final stage of the reaction. Ammonium salts can then be formed through the reaction of the amine with the acid of the corresponding anion. The protected amine-functionalised aryl compound can for instance have the formula Pr—R'—Ar$^1$—Ar$^2$-Fu wherein Pr is a protected amine group, R' is as defined above, Ar$^1$ is either a single bond or an aryl group selected from the electron rich and electron poor groups as defined above, Ar$^2$ is an aryl group such as, but not limited to, a phenyl substituted or not with one or more alkyl chains or a thiophene group substituted or not with an alkyl chain, and Fu is the second functional group which can for instance be a stannane group, a boronic acid or ester group, an halogen or a pseudo-halogen.

In a second type of embodiments, the perovskite material may comprise a further compound capable of forming a charge-transfer complex with the Q and/or the Q'. This further compound is typically present in the positively charged layers. In embodiments, the further compound may be a compound which is intercalated with the Q and/or Q' in the positively charged layer. This is schematically depicted in FIG. 2c (see also example 2). In embodiments, the further compound may be a further compound Q or Q'. In this case, the further compound Q or Q' will typically also interact with the negatively charged layers. As used herein, a charge-transfer complex (or electron-donor-acceptor complex) is an association of two or more molecules in which a fraction of electronic charge is transferred between the molecular entities. The resulting electrostatic attraction provides a stabilizing force for the molecular complex. While the parent compounds tend to be unipolar semiconductors, the charge-transfer complex typically has advantageously different properties, such as a high charge mobility. The charge-transfer complex can for example be an ambipolar semiconductor, an organic metal or a superconductor. Q may, but not limited to, for example have a structure selected from:

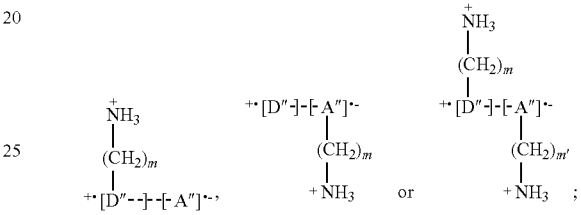

or analogous structures wherein $(CH_2)_m$ and $(CH_2)_{m'}$ are replaced by R' and R" respectively,
wherein $0 \leq m \leq 20$, preferably $2 \leq m \leq 5$, $0 \leq m' \leq 20$, preferably $2 \leq m \leq 5$, D" is a charge-transfer donor groups and A" is a charge-transfer acceptor group. The dotted line indicated a non-covalent interaction between the donor and the acceptor. As depicted in the formulas for Q above, the ratio D"/A" is typically equal to 1 or is close to 1 (e.g. from 0.9 to 1.1). An acceptor or donor which is covalently linked to R' or R" can in some embodiments form a charge transfer complex with more than one donor or acceptor simultaneously. Charge transfer donor groups may for example be, but not limited to, any of the structures:

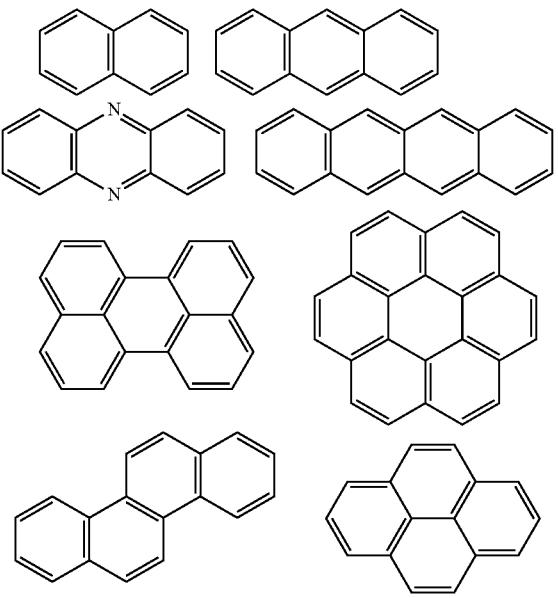

-continued

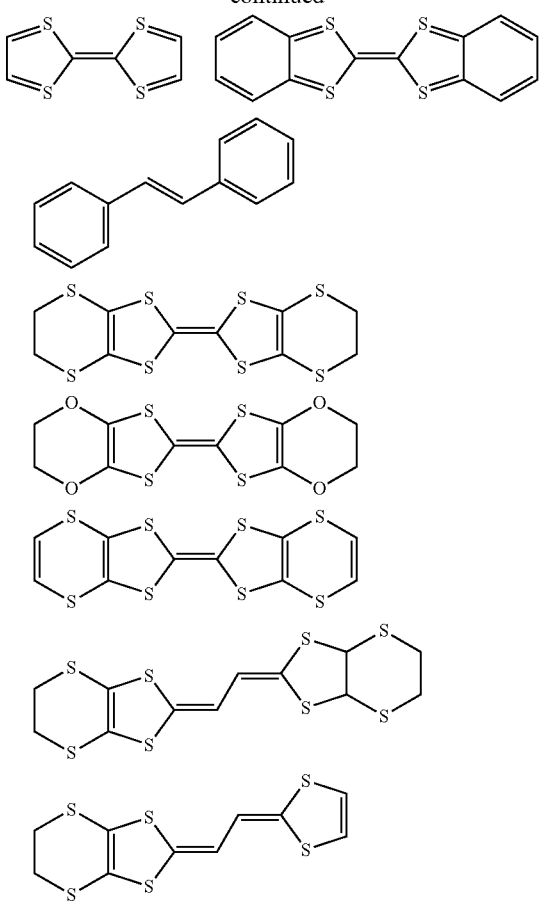

or phenanthrene, triphenylene, pentacene, benzo-pyrene, corannulene, ovalene, benzo(c)fluorene, or an oligothiophene having from 2 to 10 thiophene repeat units (e.g. terthiophene). An example of how to form a Q or Q' from a group D" is given in example 1c.

Charge transfer acceptor groups may for example be any of the structures:

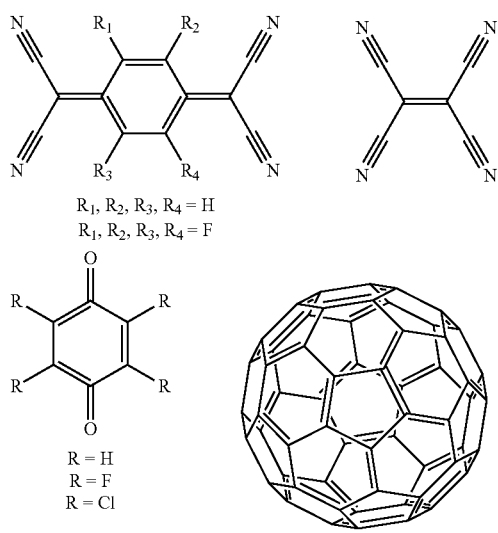

-continued

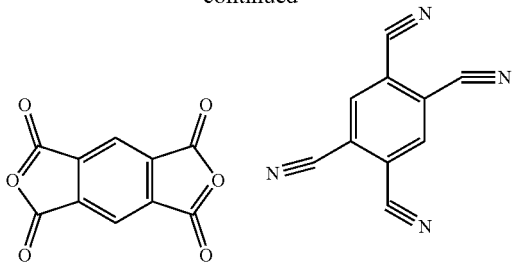

An example of how to form a Q or Q' from a group A" is given in example 1d.

In a third type of embodiments, the positively charged layer may comprise a polyvalent cationic conjugated polymer Z. This is schematically depicted in FIG. 2d (see also example 2). In embodiments, this polymer Z may be formed of a plurality of the Q and/or of the Q' linked together. In some embodiments, the plurality of the Q and/or Q' may be linked together by an aliphatic chain. In preferred embodiments, the polymer Z may be a π-conjugated polymer. In embodiments, the π-conjugated system of the Q and/or Q' may form part of a π-conjugated system of the π-conjugated polymer Z. The π-conjugated polymer Z may for example be, but not limited to, selected from the list of cationic polymers having one of the following backbone: polyphenylenes (e.g. polyfluorenes, polycarbazoles and stepladder polymers), polythiophenes, polymers base on monomers comprising fused thiophenes, conjugated polymers based on monomers comprising polycyclic aromatic hydrocarbons, conjugated macrocycles and alternating electron rich-electron poor copolymers (which may be low band gap copolymers). The alternating electron rich-electron poor copolymers may, but not limited to, for example have a structure:

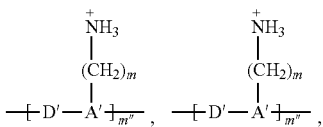

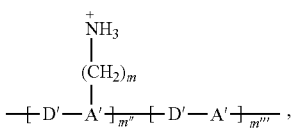

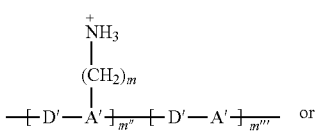

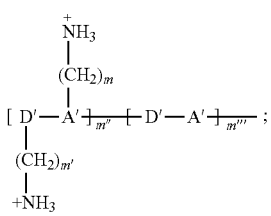

or analogous structures wherein $(CH_2)_m$ and $(CH_2)_{m'}$ are replaced by R' and R" respectively,
wherein $0 \leq m \leq 20$, $0 \leq m' \leq 20$, $0 \leq m'' \leq 200$, $0 \leq m''' \leq 200$, D' is one or more covalently linked donor groups and A' is one or more covalently linked acceptor groups. Donor groups may for example be any of the structures as outlined for the first type of embodiments. Acceptor groups may for example be any of the structures as outlined for the first type of embodiments.

In embodiments, the polymer Z may be cationic by virtue of the presence of ammonium groups. For instance, these ammonium groups may be directly attached to the conjugated system or may be attached via a linker.

In embodiments, a bandgap of a compound Q or Q' or of a polymer Z, comprised in the positively charged layer may be within 0.5 eV of a bandgap of the material making the negatively charged layer. In embodiments, a top of a valence band of a compound Q or Q' or of a polymer Z, comprised in the positively charged layer may be within 0.5 eV, preferably 0.1 eV, of a top of a valence band of the material making the negatively charged layer, and/or a bottom of a conduction band of a compound Q or Q' or of a polymer Z, comprised in the positively charged layer may be within 0.5 eV, preferably 0.1 eV, of a bottom of a conduction band of the material making the negatively charged layer. Since Q, Q', and polymer Z, in the positively charged layer are organic molecules, the top of their valence band relates to their HOMO (highest occupied molecular orbital). Likewise, the bottom of the conduction band of a compound Q or Q' or of a polymer Z, comprised in the positively charged layer typically relates to the LUMO (lowest unoccupied molecular orbital) of Q or Q' or of the polymer Z. Alignment between the amplitude of the bandgap (between the valence and conduction band) of the material making a negatively charged layer and the amplitude of the bandgap of a compound Q or Q' or of a polymer Z, comprised in a positively charged layer facilitates charge transport from one layer to another, thereby improving the charge transport properties of the perovskite material as a whole.

Alignment of both top of the valence bands on one hand and bottom of the conduction bands on another hand is particularly advantageous when the positively charged layers comprise a polyvalent cationic conjugated organic polymer Z. Indeed, in the polymer Z, the charge transport preferentially occurs perpendicularly to the organic plane, i.e. through the $\pi$-$\pi$ stacking of the aromatic groups within the organic section, with the charge carriers jumping into the positively charged layers ("organic" layers) into the negatively charged layers ("inorganic" layers). Charge transport along the polymer chain also occurs but this is not the dominant transport direction. In the case of a polymer Z, the positions of the HOMO/LUMO and of the edge valence/conduction bands electronic levels for respectively the polymer Z and for the negatively charged layer are preferably as similar as possible to facilitate the electron transfer (whose efficiency depends on the inverse of the exponential of the energy difference ($\Delta E$)). Therefore, for these systems, a band alignment of type I with both the difference in the top of the valence band ($\Delta Ev$) and in the bottom of the conduction ($\Delta Ec$) inferior to 0.1 eV is preferred.

In embodiments, a band gap of a compound Q or Q' or of a polymer Z comprised in the positively charged layer may be from 1.2 eV to 1.8 eV, such as 1.4 eV to 1.8. A band gap in the range 1.2-1.5 eV may be preferred if the perovskite material is used as the only active layer in photovoltaics cell. A band gap in the range 1.5-1.8 eV may be preferred if the perovskite material is used in conjunction with a further active layer, e.g. in a tandem cell.

When the positively charged layers comprise one or more organic ammonium cations independently selected from monovalent cations Q and divalent cations Q' (and no polymer Z is present), their slanted orientation allows an additional possibility to this first preferred type of band alignment: Aside from the band alignment of type I described above, a type II can also potentially be exploited. In a type II band alignment, the bottom of the conduction band and the top of the valence band of the material forming the negatively charged layer are either both above or both below the corresponding energy levels (LUMO and HOMO respectively) in Q or Q'. In this configuration, the splitting of the exciton in the inorganic layer can lead to either a hole (h) or an electron (e) transfer and transport into the positively charged layer, with the remaining charge being transported in the negatively charged layer. By accounting for the difference in charge carrier mobility (band transport in the negatively charged layer versus a hopping mechanism in positively charged layer), we can selectively favour electrons or hole transport in the device. Given that the band gap of the conjugated materials can be tuned by their composition, their length or by their functionalization, simulations can be performed to identify the most promising combinations to build Type I or II band alignments.

Evaluating the electronic properties of the negatively charged layer and of Q, Q' or Z, such as the position of the top of the valence band and of the bottom of the conduction band and the value of the band gap for these compounds, can be performed via a computational approach. Density Functional Theory (DFT) methods provide the basic framework to describe most of the desired materials properties. This approach is described in Filippo De Angelis, "*Modeling materials and processes in hybrid/organic photovoltaics: from dye-sensitized to perovskite solar cells*". Acc. Chem. Res. 2014, 47, 3349-3360. A quantitative band gap can be computed from the many-body perturbation theory in the GW approximation with a spin-orbit coupling description of the metallic sites. This approach is described in Umari, P. et al., "*Relativistic GW calculations on $CH_3NH_3PbI_3$ and $CH_3NH_3SnI_3$ perovskites for solar cell applications*". Sci. Rep. 2014, 4, 4467. These theoretical approaches are computationally intensive but can be applied in embodiments of the present invention. The advantage of these theoretical approaches is that they can be used before to synthesize the compounds in order to predict their suitability. Once a compound synthesized, its electronic properties can also be evaluated experimentally from optical absorption.

In embodiments, any feature of any embodiment of the first aspect may independently be as correspondingly described for any embodiment of any of the other aspects.

In a second aspect, the present invention relates to a method for forming the perovskite material as defined in any embodiment of the first aspect, comprising:
 a. forming a precursor mixture by mixing
  one or more compounds independently selected from MX, MX2, and MX3 in such a way that the molar average of the metal M valence is equal to 2 if the perovskite material is selected from Ln−1MnX3n+1 and LnMnX3n+2, and is equal to 2+2/n if the perovskite material is Ln−1M'nX3n+3,
  a compound LX,
  One or more organic ammonium salts independently selected from QX and Q'X2, or a conjugated organic polymer salt ZXv, wherein v is the valence of the polyvalent cationic conjugated organic polymer Z,
 b. annealing the precursor mixture;
 wherein M, M', X, L, Q, Q', and Z are as defined in the first aspect.

$MX_2$ may for example be $PbI_2$. MX may for example be AgI. $MX_3$ may for example be BiI3. LX may for example be methylammonium iodide. QX may for example be carbazole pentyl ammonium iodide, a tetrathiafulvalene derivative (e.g. 3-([2,2'-bi(1,3-dithiolylidene)]-4-yl)prop-2-en-1-ammonium iodide) or a tetracyanodimethane derivative (e.g. 2-ammonium iodide ethyl 2-cyano-2-(4-(dicyanomethylene)cyclohexa-2,5-dien-1-ylidene)acetate). Q'$X_2$ may for example be a di-ammonium functionalized iodide salt such as e.g. a di-ammonium functionalized 6,6' iso-indigo iodide salt (compound A below) or a di-ammonium functionalized carbazole/oxidiazole iodide salt (compound B below)

ZXv may for instance be Poly{trimethyl-[7-(3-thienylsulfanyl)heptyl]ammonium iodideco-thiophene}.

Annealing the precursor mixture may for example comprise heating the precursor mixture coated as (thin) film on a substrate at a temperature of from 80° C. to 200° C., preferably from 100° C. to 180° C., more preferably 100° C. to 160° C. Annealing the precursor mixture may also comprise growing a single crystal, e.g. using a method involving gradually reducing a temperature from a temperature within the range 200° C. to 80° C., preferably from 100 to 180° C.,

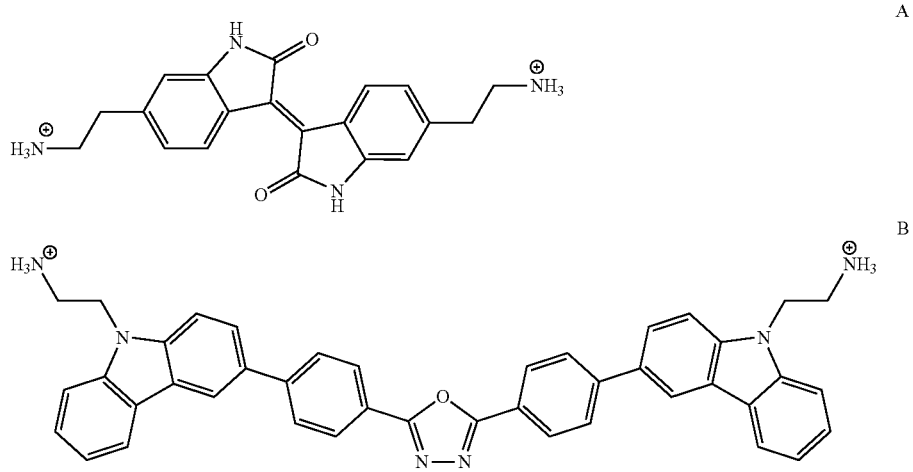

The di-ammonium functionalized 6,6' iso-indigo iodide salt can for instance be synthesized as follow:

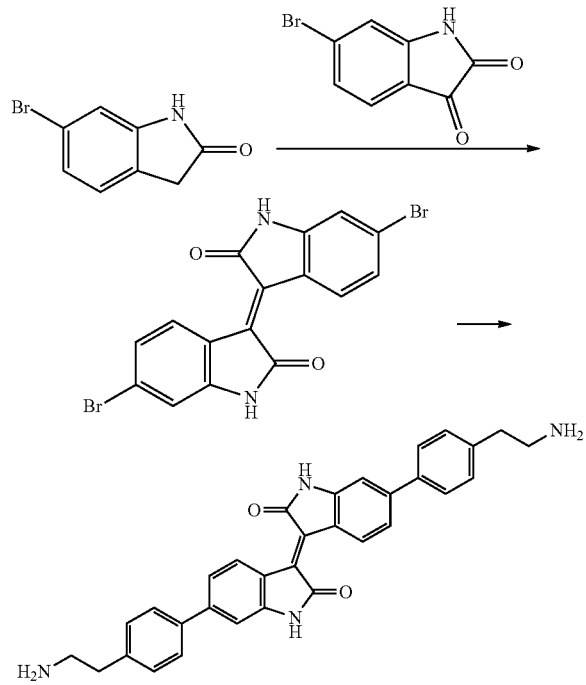

The first step is a condensation where a water molecule is eliminated. The second step may be a cross-coupling reaction with a boronic ester or a boronic acid of the compound phenylethylamine.

more preferably 100° C. to 160° C., to a lower temperature (which can still be in that range) or a gradual evaporation technique. Annealing the precursor mixture may also comprise hot-casting the film on a substrate at a temperature within the range 80° C. to 200° C., preferably 100° C. to 180° C., more preferably from 100° C. to 160° C. Hot-casting comprises contacting the precursor mixture with a pre-heated substrate. Hot-casting is advantageous because it permits to obtain films of enhanced crystallinity and larger grain size when compared to post-annealed films (films formed on a cold substrate which is only later heated up). Also, for n>4, hot-casting permits to change the morphology from needle-like to planar columnar structures expected to be more beneficial towards solar cell performance. Typically, the annealing time may be at least 5 min, preferably at least 10 min, more preferably at least 15 min. There is no upper limit for the annealing time but an annealing time longer than 1 h is typically not necessary to improve the properties of the film.

In embodiments, step a may comprise dissolving the one or more compounds independently selected from MX, $MX_2$, and $MX_3$, the LX, the polymer $ZX_v$ or the QX and/or Q'$X_2$ in a solvent. The solvent may for example be DMF or DMSO.

The morphology of the thin films of perovskite materials obtained can be tuned by playing on one or more of the following factors: the deposition method, the nature of the substrate, the temperature of the substrate, the annealing temperature, the concentration of the precursors, and the type and number of solvents used.

Optical images and electron microscopy (TEM, SEM) images can be used to explore the morphology of the crystals and the layers deposited on the substrates (coverage, uniformity, pinholes). The use of advanced scanning probe microscopy techniques (SPM) such as C-AFM allow the study of both local nanoscale morphology and local nanoscale electrical properties of the films obtained. Differential scanning calorimetry can be employed to probe the crystal phase structure of the films obtained, revealing subtle differences depending on the deposition method. With grazing incidence wide angle X-ray scattering (GIWAXS), the molecular arrangement of the perovskite material can be probed. GIWAXS is sensitive to the crystalline parts and allow for the determination of the crystal structure and the orientation of the crystalline regions with respect to the electrodes/substrates.

In embodiments, the method may further comprise a step a', after step a and before step b, of:

a'. providing the precursor mixture on a substrate.

Providing the precursor mixture on the substrate may for example comprise spin coating, drop casting, blade casting or hot-casting the precursor mixture on the substrate.

In embodiments, mixing the $MX_2$, the MX, the $MX_3$ the LX and the QX and/or $Q'X_2$ may consist of mixing stoichiometric amounts thereof. Mixing stoichiometric amounts may comprise selecting a stoichiometry (e.g. selecting one or more of AI-III and BI to BII) to be achieved and mixing the corresponding amounts without excess.

In embodiments, any feature of any embodiment of the second aspect may independently be as correspondingly described for any embodiment of any of the other aspects.

In a third aspect, the present invention relates to a use of the perovskite material as defined in any embodiment of the first aspect in a photovoltaic cell.

In embodiments, the perovskite material may be used in or as an active layer.

In embodiments, any feature of any embodiment of the third aspect may independently be as correspondingly described for any embodiment of any of the other aspects.

In a fourth aspect, the present invention relates to a photovoltaic cell comprising an active layer, the active layer comprising the perovskite material as defined in any embodiment of the first aspect.

In embodiments, the active layer may be interposed between two charge collection layers. In embodiments, the negatively charged layers may be oriented such that there is an angle between the negatively charged layers on the one hand and the charge collection layers on the other hand of between 30° and 150°, preferably between 60° and 120°, yet more preferably between 80° and 100°. These angles can be determined by grazing incidence wide angle X-ray scattering. The presence of such angles is particularly advantageous when the positively charged layers comprise Q and/or Q' and the band alignments of the material in the negatively charged layers on one hand and Q or Q' on another hand are of Type II. The charge collection layers may for example be the contacts or a charge transport layer in between the active layer and the contacts. When the negatively charged layers (or likewise the positively charged layers) are oriented parallel to the charge collection layers, charges typically need to repeatedly cross over from a negatively charged layer to a positively charged layer and vice versa; this crossing is typically a relatively slow process and negatively affects the charge transport properties of the perovskite material when the band alignment is not of Type I. Conversely, when the band alignment is of Type II, a tilt of the negatively charged layers (and of the positively charged layer) with respect to the charge collection layers advantageously allows the charges to travel a longer distance within one layer before a crossing needs to occur; this in turn improves the charge transport properties of the perovskite material. In such embodiments, a single negatively charged layer (or positively charged layer) may for example contact both charge collection layers, thus allowing a charge to remain within one layer for the entire transport.

In embodiments, the photovoltaic cell may comprise:
a first electrode on a substrate;
optionally a first charge transport layer overlaying the first electrode;
the active layer, comprising the perovskite material, overlaying the first charge transport layer if present or the substrate;
optionally a second charge transport layer overlaying the active layer, and
a second electrode overlaying the second charge transport layer if present or the active layer.

In embodiments, the active layer may have a thickness of from 10 nm to 5 µm, preferably from 200 nm to 1 µm, such as 400 nm.

In embodiments, any feature of any embodiment of the fourth aspect may independently be as correspondingly described for any embodiment of any of the other aspects.

In a fifth aspect, the present invention relates to a perovskite material comprising negatively charged parts (100) neutralized by positively charged parts (200); the negatively charged parts (100) having a general formula selected from the list consisting of:

$MX_3$, $L_{n-1}M_nX_{3n+1}$, $L_nM_nX_{3n+2}$, and $L_{n-1}M'_nX_{3n+3}$, and the positively charged parts comprising:
one or more organic ammonium cations independently selected from monovalent cations Q (210) and divalent cations Q' (220), or
a polyvalent cationic conjugated organic polymer Z, wherein Q, Q' and Z comprise each a π-conjugated system in which at least 6 atoms, preferably at least 8 atoms and most preferably at least 10 atoms participate, L (130) is a monovalent cation, $M_n$ (110) are n independently selected metal cations M averaging a valence of two, $M'_n$ (110) are n independently selected metal cations M' averaging a valence equal to 2+2/n, X (120) is a monovalent anion, and n is 1 or larger than 1, wherein the one or more organic ammonium cations are two organic ammonium cations forming a charge transfer complex or wherein each positively charged part comprises a further compound (230) capable of forming a charge-transfer complex with at least one of the one or more organic ammonium cations.

In embodiments, the negatively charged parts may be negatively charged layers and the positively charged parts may be positively charged layers, and the negatively charged layers may alternate with and be neutralized by positively charged layers.

Hence, in embodiments, the perovskite material may comprise negatively charged layers (100) alternated with and neutralized by positively charged layers (200); the negatively charged layers (100) having a general formula selected from the list consisting of:

$MX_3$, $L_{n-1}M_nX_{3n+1}$, $L_nM_nX_{3n+2}$, and $L_{n-1}M'_nX_{3n+3}$, and the positively charged layers comprising:
one or more organic ammonium cations independently selected from monovalent cations Q (210) and divalent cations Q' (220), or
a polyvalent cationic conjugated organic polymer Z,
wherein
Q, Q' and Z comprise each a π-conjugated system in which at least 6 atoms, preferably at least 8 atoms and most preferably at least 10 atoms participate,
L (130) is a monovalent cation,
$M_n$ (110) are n independently selected metal cations M averaging a valence of two,
$M'_n$ (110) are n independently selected metal cations M' averaging a valence equal to 2+2/n,
X (120) is a monovalent anion, and
n is 1 or larger than 1,
wherein the one or more organic ammonium cations are two organic ammonium cations forming a charge transfer complex or wherein each positively charged layer comprises a further compound (230) capable of forming a charge-transfer complex with at least one of the one or more organic ammonium cations.

In embodiments, the negatively charged parts may have a general formula $MX_3$, wherein each negatively charged part is formed of parallel strings, each string having the general formula $MX_3$ and sharing no atom with another string. Such perovskites are typically referred to as 1D perovskites. In such embodiments, the strings may be coplanar.

In preferred embodiments, the negatively charged parts may have a general formula $MX_3$ and the positively charged parts may be an organic monovalent ammonium cation Q.

Any feature of the fifth aspect may be as correspondingly described in any of the other aspects of the present invention In a sixth aspect, the present invention relates to a method for forming crystals of a perovskite material according to the fifth aspect, comprising
a. forming a precursor mixture by mixing in a solvent:
one or more compounds independently selected from $MX$, $MX_2$, and $MX_3$ in such a way that the molar average of the metal M valence is equal to 2,
One or more organic ammonium salts independently selected from QX and $Q'X_2$, or a conjugated organic polymer salt $ZX_v$, wherein v is the valence of the polyvalent cationic conjugated organic polymer Z,
One or more further compounds (230) capable of forming a charge-transfer complex with at least one organic ammonium cation of the one or more organic ammonium salts, and
b. Adding gradually a nonsolvent to the precursor mixture;
wherein M (110), X (120), Q (210), Q' (220), and Z are as defined in the fifth aspect.

This method permits to form single crystals of 1D or 2D perovskites, but typically of 1D perovskites.

The nonsolvent is preferably chosen such as to be miscible with the solvent.

In embodiments, the nonsolvent may be continuously added to the precursor mixture over the course of at least 30 minutes, such as at least 1 hour or at least 12 h, in such a way that after this period of time the resulting mixture of solvent is a nonsolvent for the precursor mixture.

In embodiments, adding gradually the nonsolvent to the precursor mixture may be done by making communicate in a closed environment the vapor phases of the nonsolvent and of the precursor mixture in the solvent. Alternatively, the nonsolvent could be added dropwise or via a micropump to the precursor mixture and the solvent.

Any features of the sixth aspect may be as correspondingly described in any other aspects of the present invention.

The invention will now be described by a detailed description of several embodiments of the invention. It is clear that other embodiments of the invention can be configured according to the knowledge of the person skilled in the art without departing from the true technical teaching of the invention, the invention being limited only by the terms of the appended claims.

EXAMPLES

For Material Synthesis:
Lead iodide ($PbI_2$, 99.999%) was purchased from Lumtec and used as received. Methylamine (MA, 40% w/w aq.) was obtained from Alfa Aesar and used without purification. Hydroiodic acid (HI, 57 wt % aq., distilled, unstabilized) and phenethylamine (PEA, 99%) were obtained from Acros Organics and used as received. The dry dimethylformamide (DMF) that was used, was obtained from an in-house solvent-purification system (MBRAUN SPS-800).
7,7,8,8-Tetracyanoquinodimethane (TCNQ, >98.0%) was bought from TCI and 1,2,4,5-Tetracyanobenzene (TCNB, 99%) was obtained from Fluorochem. These chemicals were used without further purification.

For Films Formation:
Quartz substrates (25 mm×25 mm) were cleaned through consecutive sonication steps in a series of solvents (deionized water, detergent water, acetone, isopropanol) for 15 min each, followed by a UV-ozone treatment for 30 min at 80° C. The precursor solutions were spin coated in a glovebox with nitrogen atmosphere (<0.1 ppm $O_2$, <0.1 ppm $H_2O$) onto the quartz substrates at 2000 rpm for 20 s. Annealing was performed via hot-casting or by post-annealing on a hotplate in the glovebox, annealing time and temperature differ for different number of "inorganic" layers (n). Prepared samples were kept in a glovebox and were only removed for analysis.

Analysis:
Optical absorption spectra were obtained on a Cary 5000 UV-Vis-NIR spectrophotometer from Agilent Technologies, a cleaned quartz substrate was used as calibration background. For temperature-controlled UV-Vis, precursor solutions were spin coated onto a cleaned round quartz disk at room temperature and transferred to a temperature-controlled cell (Harrick). The temperature was controlled using a temperature-controller from Watlow. Photoluminesence spectra were taken with a Horiba-Jobin Yvon Fluorolog-3 device, equipped with double-grating excitation and emission monochromators and a 450 W Xe lamp as a light source. An excitation wavelength of either 300 nm or 430 nm was used and the sample was placed at an angle of 45° relative to the incident beam.

X-ray diffraction measurements were performed at room temperature in ambient atmosphere on a Bruker D8 Discover diffractometer with $CuK_\alpha$ radiation.

SEM measurements were performed on a Philips XL30 FEG-SEM.

For device fabrication: the SnO$_2$ water dispersion (15 wt %) was purchased from Alfa Aesar and was diluted to 2.5 wt % for use. Lead Iodide (99.99%, trace metals basis) was obtained from TCI. Methylammonium iodide was obtained from Dyesol. Spiro-OMeTAD was obtained from Lumtec. Lithium bis(trifluoromethanesulfonyl) imide, 4-tert-butylpyridine, dimethylformamide, acetonitrile and chlorobenzene were purchased from Sigma Aldrich.

Example 1: Synthesis of Perovskite Material Precursors

Example 1a: Methylammonium Iodide (MAI) and Phenethylammonium Iodide (PEAI)

Methylammonium iodide (MAI) and phenethylammonium iodide (PEAI) were synthesized by neutralizing equimolar amounts of hydroiodic acid and methylamine or phenethylamine respectively at 0° C. in an ice bath. In both cases, an off-white precipitate was obtained by evaporation of the solvent using rotary evaporation at 70° C. under reduced pressure. The resulting precipitate was recrystallized three times from ethanol, washed with diethyl ether and dried under reduced pressure.

Example 1b: Carbazole Pentyl Ammonium Iodide (Carb-C$_5$—NH$_3$I or CAI) and Carbazole Butyl Ammonium Iodide (Carb-C$_4$—NH$_3$I or CA'I)

Shown below is a scheme used for synthesising carbazole pentyl ammonium iodide (carb-C$_5$—NH$_3$I or CAI; V' where x=5) or carbazole butyl ammonium iodide (carb-C$_4$—NH$_3$I or CA'I; V' where x=4):

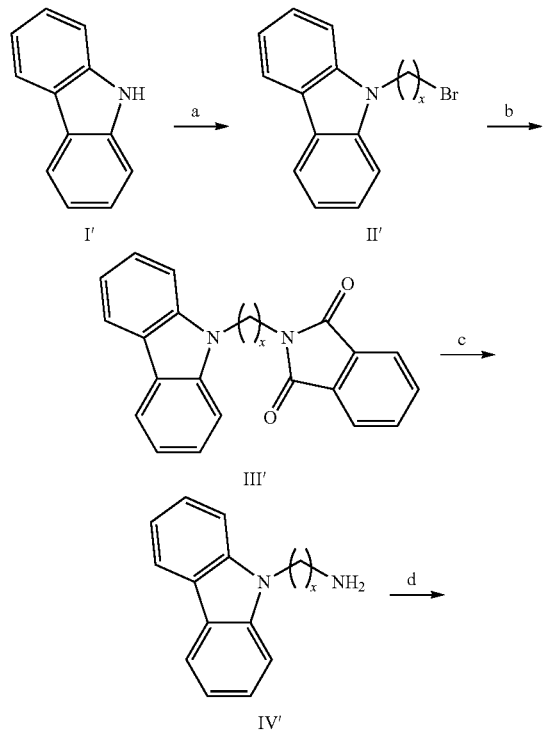

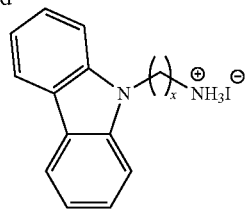

a) 1,n-dibromoalkyl, KO-tBu, THF, 55° C., 10 h. b) Potassium phthalimide, DMF, 80° C., 6 h. c) Hydrazine monohydrate (65%), EtOH, 100° C., 2 h. d) HI, EtOH, RT.

9-(bromoalkyl)-9H-carbazole (II'): 1,5-dibromopentane or 1,4-dibromobutane (135 mmol) was added dropwise to a mixture of 9H-carbazole (15.00 g, 90 mmol; I') and potassium tert-butoxide (10.07 g, 90 mmol) in tetrahydrofuran (THF, 130 mL). The reaction mixture was heated to 55° C. and stirred under nitrogen atmosphere for 10 h. The reaction was followed with thin layer chromatography (TLC). After the reaction was completed, the mixture was allowed to cool down to room temperature and extracted with H$_2$O (100 mL) and dichloromethane (DCM) (3×45 mL). Next, the organic layer was dried with magnesium sulphate, filtered and the solvent was removed by vacuum elimination. The residue was purified by flash chromatography (DCM/petroleum ether 1/5), to obtain II' as a colorless solid. $^1$H NMR (400 MHz, chloroform-d) x=5: δ 8.11 (dt, J=7.8, 1.0 Hz, 2H), 7.48 (ddd, J=8.2, 7.0, 1.2 Hz, 2H), 7.41 (dt, J=8.2, 0.9 Hz, 2H), 7.24 (ddd, J=7.9, 7.0, 1.1 Hz, 2H), 4.33 (t, J=7.1 Hz, 2H), 3.36 (t, J=6.7 Hz, 2H), 1.98-1.80 (m, 4H), 1.59-1.50 (m, 2H). x=4: δ 8.12 (dt, J=7.7, 1.0 Hz, 2H), 7.48 (ddd, J=8.2, 7.0, 1.2 Hz, 2H), 7.41 (dt, J=8.2, 0.9 Hz, 2H), 7.25 (ddd, J=7.9, 7.0, 1.1 Hz, 2H), 4.36 (t, J=6.9 Hz, 2H), 3.39 (t, J=6.5 Hz, 2H), 2.12-2.03 (m, 2H), 1.97-1.86 (m, 2H).

2-((9H-carbazol-9-yl)alkyl)isoindoline-1,3-dione (III'): potassium phthalimide (25.70 g, 139 mmol) was added to a solution of II' (29.20 g, 92 mmol) in dimethylformamide (135 mL, DMF). The reaction mixture was heated to 80° C. and stirred for 6 h. Afterwards, the mixture was allowed to cool down to room temperature and aqueous ammonium chloride and chloroform were added. Next, the reaction mixture was extracted with H$_2$O (2×100 mL) and saturated aqueous natrium chloride (2×100 mL). The organic layer was dried with magnesium sulphate, filtered and the filtrate was evaporated by vacuum elimination. The residue was purified by column chromatography (ethyl acetate/hexane 1:5) and recrystallization (methanol) to obtain III' as a colorless solid. $^1$H NMR (400 MHz, chloroform-d) x=5: δ 8.08 (dt, J=7.8, 0.9 Hz, 2H), 7.83 (dd, J=5.5, 3.0 Hz, 2H), 7.70 (dd, J=5.4, 3.1 Hz, 2H), 7.49-7.36 (m, 4H), 7.21 (ddd, J=7.9, 6.9, 1.2 Hz, 2H), 4.30 (t, J=7.2 Hz, 2H), 3.65 (t, J=7.2 Hz, 2H), 1.92 (p, J=7.4 Hz, 2H), 1.74-1.67 (m, 2H), 1.51-1.38 (m, 2H). x=4: δ 8.09 (dt, J=7.7, 1.0 Hz, 2H), 7.83 (dd, J=5.4, 3.0 Hz, 2H), 7.70 (dd, J=5.4, 3.0 Hz, 2H), 7.51-7.39 (m, 4H), 7.22 (ddd, J=7.9, 6.7, 1.3 Hz, 2H), 4.36 (t, J=7.0 Hz, 2H), 3.71 (t, J=7.0 Hz, 2H), 2.02-1.88 (m, 2H), 1.84-1.73 (m, 2H).

(9H-carbazol-9-yl)alkyl-1-amine (carb-C$_5$—NH$_2$ or CA, IV' where x=5; carb-C$_4$—NH$_2$ or CA'; IV' where x=4): Hydrazine monohydrate (65 wt. % in H$_2$O, 6.24 mL, 129 mmol) was added to a solution of III' (19.78 g, 51.7 mmol) in ethanol (500 mL) and refluxed overnight. Over the course of the reaction, large white crystals precipitate. After the reaction was completed, the reaction mixture was allowed to cool down to room temperature and the precipitate was filtered off and the solvent was removed by vacuum elimination. Next, the residue was dissolved in chloroform and again filtered. The filtrate was concentrated by rotary evaporation, to obtain IV'. $^1$H NMR (400 MHz, chloroform-d) x=5: δ 8.11 (dt, J=7.7, 1.0 Hz, 2H), 7.50-7.38 (m, 4H), 7.23 (ddd, J=8.0, 7.0, 1.1 Hz, 2H), 4.32 (t, J=7.2 Hz, 2H), 2.65 (t, J=6.8 Hz, 2H), 1.90 (p, J=7.3 Hz, 2H), 1.53-1.37 (m, 4H). x=4: δ 8.11 (dt, J=7.8, 1.0 Hz, 2H), 7.47 (ddd, J=8.2, 7.0, 1.2 Hz, 2H), 7.41 (dt, J=8.3, 0.9 Hz, 2H), 7.23 (ddd, J=8.0, 7.0, 1.1 Hz, 2H), 4.33 (t, J=7.1 Hz, 2H), 2.69 (t, J=7.1 Hz, 2H), 1.98-1.86 (m, 2H), 1.56-1.47 (m, 2H).

(9H-carbazol-9-yl)alkyl-1-ammonium iodide (carb-C$_5$—NH$_3$I or CAI, V' where x=5; carb-C$_4$—NH$_3$I or CA'I, V' where x=4): Hydroiodic acid (57 wt. % in H$_2$O) was generated in situ and added to a solution of IV' in ethanol at room temperature. Afterwards, the solvent was evaporated. Next, the residue was redissolved in ethanol and precipitated in a large amount of cooled diethyl ether. The residue was further purified by recrystallization in ethanol to obtain V' as a colorless solid. $^1$H NMR (400 MHz, DMSO-d6) x=5: δ 8.15 (d, J=7.7 Hz, 2H), 7.60 (d, J=8.2 Hz, 2H), 7.45 (ddd, J=8.3, 7.0, 1.2 Hz, 2H), 7.20 (t, J=7.4 Hz, 2H), 4.39 (t, J=7.0 Hz, 2H), 2.72 (t, J=7.6 Hz, 2H), 1.79 (p, J=7.2 Hz, 2H), 1.54 (p, J=7.6 Hz, 2H), 1.34 (p, J=7.8 Hz, 2H). x=4: δ 8.16 (dt, J=7.7, 1.0 Hz, 2H), 7.63 (dt, J=8.2, 0.8 Hz, 2H), 7.54 (s, 3H), 7.46 (ddd, J=8.3, 7.1, 1.2 Hz, 2H), 7.20 (ddd, J=7.9, 7.1, 0.9 Hz, 2H), 4.45 (t, J=6.8 Hz, 2H), 2.77 (t, J=7.6 Hz, 2H), 1.89-1.78 (m, 2H), 1.62-1.46 (m, 2H).

CAI and CA'I were optically characterized by drop casting them onto quartz substrates and measuring their UV-vis absorption spectrum and photoluminescence emission spectrum. CAI mainly absorbed in the UV-region of the light spectrum with an absorbance maximum at about 350 nm. The corresponding photoluminescence emission, for an excitation wavelength of 300 nm, was also in the UV-region and had an emission maximum at about 372 nm.

Example 1c: Ammonium Salt of a Tetrathiafulvalene Derivative (TTF-C$_2$—NH$_3$I)

Shown below is a scheme for synthesising a tetrathiafulvalene derivative (TTF-C$_2$—NH$_3$I; V):

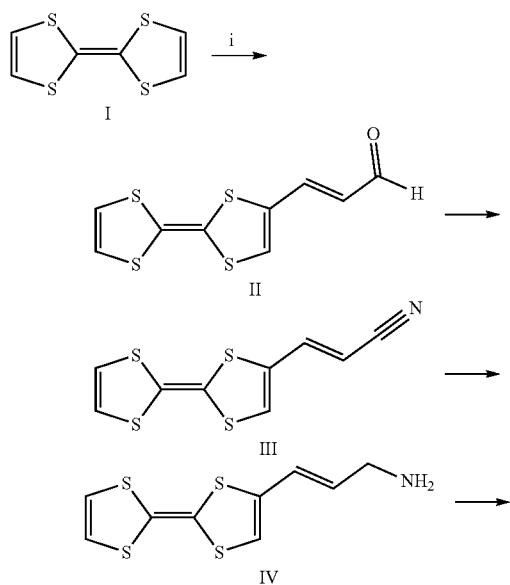

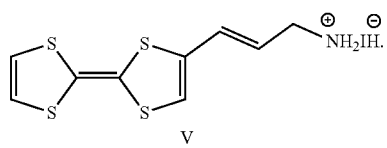

3-([2,2'-bi(1,3-dithiolylidene)]-4-yl)acrylaldehyde (II): Under nitrogen atmosphere at −78° C., 3.00 mL of a solution of lithium diisopropylamide (LDA, 2M) in dry tetrahydrofuran was added to a solution of 1.00 g (4.89 mmol) of tetrathiafulvalene (TTF; I) in dry THF. Then, 0.970 g (9.79 mmol) of 3-(dimethylamino)-acrolein was added. The reaction progress was monitored via TLC. After 1 hour, the reaction was completed and the reaction mixture was poured over a 2M aqueous solution of hydrochloric acid. The organic layer was extracted with diethyl ether and dried over magnesium sulfate. The solvent was removed by vacuum elimination. The residue was chromatographed (hexane/dichloromethane) to yield 0.7262 g (57.4%) of II as a red solid. $^1$H NMR (400 MHz, chloroform-d) δ 9.58 (d, J=7.4 Hz, 1H), 7.17 (dd, J=15.4, 0.6 Hz, 1H), 6.87 (d, J=0.7 Hz, 1H), 6.35 (d, J=1.8 Hz, 2H), 5.95 (ddd, J=15.4, 7.5, 0.6 Hz, 1H).

3-([2,2'-bi(1,3-dithiolylidene)]-4-yl)acrylonitrile (III): 282 mg NH$_2$OH.HCl (4.06 mmol) was added to a solution of II (700 mg, 2.71 mmol) in dry acetonitrile (MeCN). Then, NaHCO$_3$ (341 mg, 4.06 mmol) and SnCl$_2$ (122 mg, 0.542 mmol) were added. The reaction was stirred, heated to 80° C. and monitored by TLC. After the completion of the reaction, the organic layer was extracted with diethyl ether and dried over magnesium sulfate. The solvent was removed by vacuum elimination. The residue was chromatographed (hexane/dichloromethane) to yield 0.460 g (66.5%) of III as a red solid. $^1$H NMR (400 MHz, chloroform-d) δ 7.08 (dd, J=15.9, 0.7 Hz, 1H), 6.77 (s, 1H), 6.35 (s, 2H), 5.10 (dd, J=15.9, 0.8 Hz, 1H).

3-([2,2'-bi(1,3-dithiolylidene)]-4-yl)prop-2-en-1-amine (IV): 1,1,3,3-Tetramethyldisiloxane and titanium isopropoxide (Ti(O-i-Pr)$_4$) are added to a solution of III in toluene under nitrogen atmosphere at room temperature. The reaction mixture is heated at 60° C. for 24 h, turning the red solution to a black mixture. The reaction is followed by TLC. Afterwards, the reaction is allowed to cool down to room temperature and the solvent is removed by vacuum elimination. The residue is washed with hexane to obtain IV.

3-([2,2'-bi(1,3-dithiolylidene)]-4-yl)prop-2-en-1-ammonium iodide (V): Hydriodic acid (57 wt. % in H$_2$O) is added to a solution of IV in ethanol at room temperature. Afterwards, the solvent is evaporated. The residue is recrystallized (EtOH:diethyl ether) to obtain V as a red solid.

Example 1d: Ammonium Salt of a Tetracyanodimethane Derivative (TCNQ-C$_2$—NH$_3$I)

Shown below is a scheme for synthesising a tetracyanodimethane derivative (TCNQ-C$_2$—NH$_3$I; XIV):

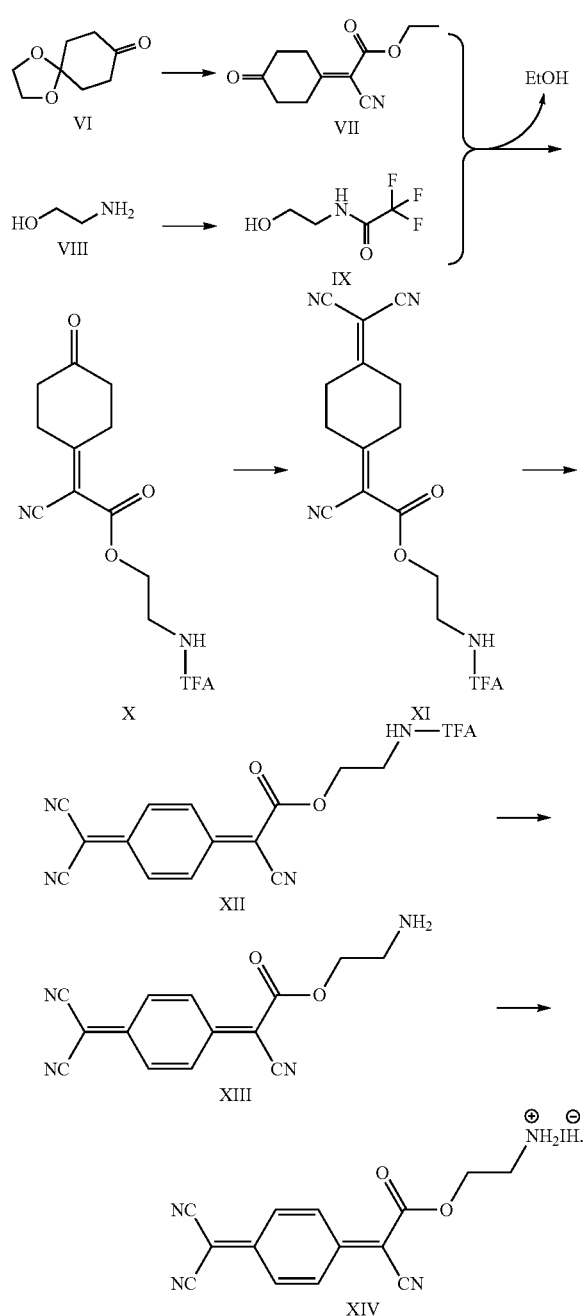

Ethyl 2-cyano-2-(4-oxocyclohexylidene)acetate (VII): Acetic acid (2 mL, 34.9 mmol), ammonium acetate (0.4 g, 5.19 mmol) and ethyl 2-cyanoacetate (7.97 g, 70.4 mmol) were added to a solution of 1,4-dioxaspiro[4.5]decan-8-one (10.0 g, 64.0 mmol) in toluene (150 mL). The reaction mixture was refluxed for 48 h using a Dean-Stark water separator to isolate water. Afterwards, the mixture was washed with water (2×100 mL), dried over magnesium sulfate and the solvent was evaporated to yield a pale yellow solid. Aqueous sulfuric acid (2%, 200 mL) was added and the mixture was refluxed for 1 h. The reaction mixture was allowed to cool down to room temperature and extracted with chloroform (3×100 mL), washed with water (2×100 mL) and dried over magnesium sulfate. The solvent was removed by vacuum elimination. The residue was purified by flash chromatography ($CHCl_3$) and recrystallization (hexane:DCM). VII was obtained as a white solid. $^1H$ NMR (400 MHz, chloroform-d) δ 4.29 (q, J=7.1 Hz, 2H), 3.43-3.36 (m, 2H), 3.15-3.08 (m, 2H), 2.59-2.51 (m, 4H), 1.35 (t, J=7.1 Hz, 3H).

2,2,2-trifluoro-N-(2-hydroxyethyl)acetamide (IX): Ethanolamine (8.5 mL, 141 mmol) was cooled to 0° C. Trifluoro acetic acid (22.3 mL, 289 mmol) was added dropwise. The reaction mixture was allowed to warm up to room temperature. The product precipitates as a white solid.

2-(2,2,2-trifluoroacetamido)ethyl 2-cyano-2-(4-oxocyclohexylidene)acetate (X): Sulfuric acid is added to a stirring solution of VII and IX in toluene. The reaction mixture is refluxed overnight and is allowed to cool to room temperature. The reaction mixture is poured onto water and the organic layer is separated with DCM, dried by magnesium sulfate and the solvent is removed by vacuum elimination. The crude product is purified by flash chromatography on silica gel (Hexane:DCM).

2-(2,2,2-trifluoroacetamido)ethyl 2-cyano-2-(4-(dicyanomethylene)cyclohexylidene)acetate (XI): Acetic acid, ammonium acetate and malonitrile are added to a solution of X in toluene. The reaction mixture is refluxed for 24 h using a Dean-Stark water separator to isolate water. Afterwards, the reaction mixture is extracted with a saturated aqueous solution of sodium chloride and sodium bicarbonate and dried over magnesium sulfate. The solvent is removed by vacuum elimination. The residue is purified by recrystallization.

2-(2,2,2-trifluoroacetamido)ethyl 2-cyano-2-(4-(dicyanomethylene)cyclohexa-2,5-dien-1-ylidene)acetate (XII): N-Bromosuccinimide is added to a solution of XI in acetonitrile at −20° C. under nitrogen atmosphere. Next, a solution of pyridine in diethyl ether is added. The reaction mixture is stirred for 15 minutes at −20° C. and afterwards allowed to warm up to room temperature. Cold water is added, resulting in the precipitation of XII crystals. The reaction product is recrystallized in ethyl acetate.

2-aminoethyl 2-cyano-2-(4-(dicyanomethylene)cyclohexa-2,5-dien-1-ylidene) acetate (XIII): Potassium carbonate is added to a solution of XII in methanol at room temperature. The reaction can be followed by TLC. After completion of the reaction, the solvent is removed by vacuum elimination. Next, the residue is extracted with water and chloroform, and dried with magnesium sulfate. The solvent is removed by vacuum elimination to obtain XIII.

2-ammonium iodide ethyl 2-cyano-2-(4-(dicyanomethylene)cyclohexa-2,5-dien-1-ylidene)acetate (XIV): Hydriodic acid (57 wt. % in $H_2O$) is added to a solution of XII in ethanol at room temperature. Afterwards, the solvent is evaporated. The residue is recrystallized (EtOH:diethyl ether) to obtain XIV.

Example 2: Synthesis of a Perovskite Material

We now refer to FIG. 1, in which perovskite materials with negatively charged layers (100), comprising M (110), X (120) and L (130), alternating with positively charged layers (200), comprising Q (210), are schematically depicted for different n: n=1 (FIG. 1a), n=2 (FIG. 1b), n=3 (FIG. 1c) and n=∞ (FIG. 1d).

Figure 2:
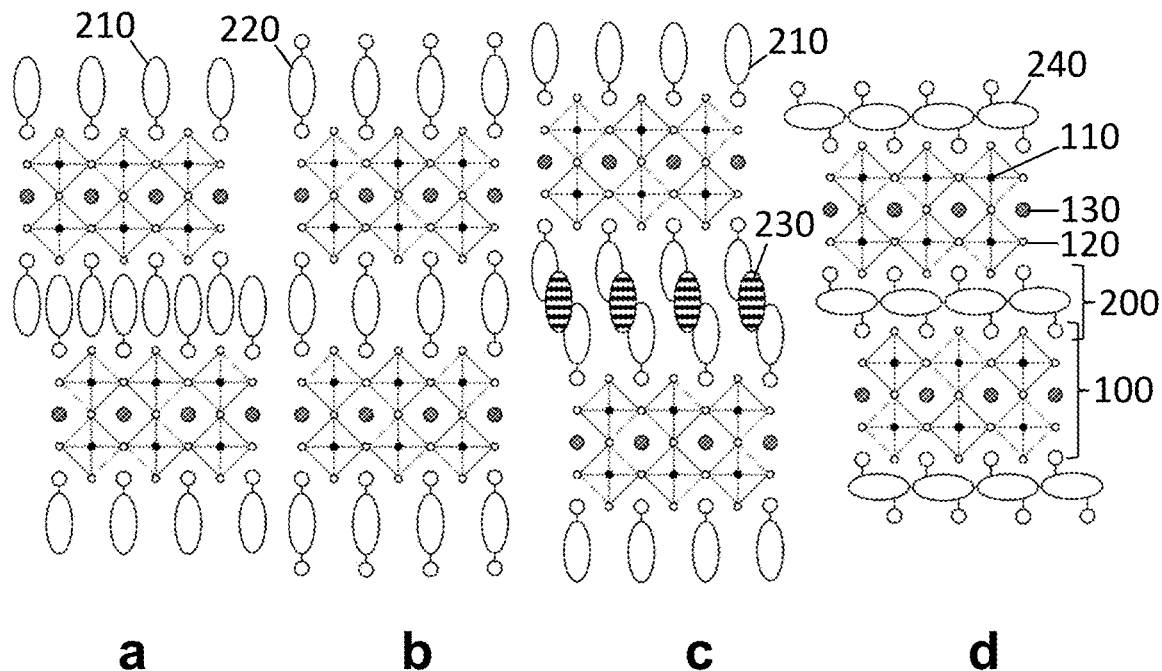
FIG. 2 is a schematic representation of perovskite materials with a different composition of the positively charged layers.

We now refer to FIG. 2, in which perovskite materials with negatively charged layers (100), comprising M (110), X (120) and L (130), alternating with different positively charged layers (200) are schematically depicted. The positively charged layers (200) comprise:

a monovalent organic ammonium cation Q (210) (FIG. 2a);

a divalent organic ammonium cation Q' (220) (FIG. 2b);

a compound Q (210) with a further compound (230) intercalated therebetween to form a charge transfer complex (FIG. 2c); alternatively (not depicted) a charge transfer complex may also be formed by a compound Q' and the further compound, two compounds Q, two compounds Q', a compound Q and a compound Q', etc.; or a polymer Z (240), which may be a conjugated polymer, for instance linking together a plurality of Q or Q' (FIG. 2d).

Example 2a: Precursor Mixtures of a $(CA-C_x)_2 MA_{n-1}Pb_n I_{3n+1}$ Perovskite Material Where x is 4 or 5

Precursor mixtures (see table below) were prepared according to the nominal molecular formula $(CA-C_x)_2 MA_{n-1}Pb_n I_{3n+1}$ where x is either 4 or 5. Stoichiometric amounts of $(CA-C_x)I$, MAI and $PbI_2$ were dissolved in dry dimethylformamide (DMF) at 70° C. for 1 h under constant stirring. The resulting solutions were filtered through a syringe filter (0.45 µm).

| $<n>$ | Nominal structural formula | $PbI_2$ (mmol/ml) | MAI (mmol/ml) | CAI (mmol/ml) |
|---|---|---|---|---|
| 1 | $(CA-C_x)_2PbI_4$ | 0.3 | 0 | 0.6 |
| 2 | $(CA-C_x)_2MAPb_2I_7$ | 0.3 | 0.15 | 0.3 |
| 3 | $(CA-C_x)_2MA_2Pb_3I_{10}$ | 0.3 | 0.2 | 0.2 |
| 4 | $(CA-C_x)_2MA_3Pb_4I_{13}$ | 0.3 | 0.225 | 0.15 |
| 10 | $(CA-C_x)_2MA_9Pb_{10}I_{31}$ | 0.3 | 0.27 | 0.06 |
| 40 | $(CA-C_x)_2MA_{39}Pb_{40}I_{121}$ | 0.3 | 0.2925 | 0.015 |
| 60 | $(CA-C_x)_2MA_{59}Pb_{60}I_{181}$ | 0.3 | 0.295 | 0.01 |

Example 2b: Thin Film of a $(CA-C_x)_2PbI_4$ (n=1) Perovskite Material $CA_2PbI_4$ thin films were obtained via spin coating at 2000 RPM for 20 s of the precursor solution and annealing at 110° C. for 15 min.

For both x=4 and x=5, the diffraction pattern of the thin film was measured and clearly consisted of a series of (0 0 l) reflections characteristic for an n=1 layered 2D perovskite with preferential growth along the (1 1 0) direction such that the organic layers are oriented parallel to the substrate. Layered n=1 lead iodide hybrid perovskites generally crystallize in the orthorhombic space group Pbca (group 61). The reflection conditions for this space group contain the condition: 0 0 l, l=2 m (with m from $m\lambda=2 d \sin(\theta)$, wherein $\lambda$ corresponds to the $CuK_\alpha$ wavelength of 0.15418 nm). Hence the reflections could be indexed accordingly. An interlayer spacing (d) of about 25.5 Å for x=4 and about 26.6 Å for x=5 was calculated using Bragg's law (see table below). In comparison: the end-to-end distance of a completely flat carbazole derivative molecule with x=5, as measured in the PerkinElmer Chem3D® suit, corresponds to a distance of 13.4 Å. Therefore, the calculated lattice spacing corresponds very well with 2 end-to-end carbazole derivative molecules filling the gap between the inorganic Pb—I slabs.

| $2\theta$ (°) | $\theta$ (°) | $\sin(\theta)$ | m | d (Å) |
|---|---|---|---|---|
| 3.295 | 1.648 | 0.029 | 1 | 26.812 |
| 6.631 | 3.316 | 0.058 | 2 | 26.659 |
| 9.967 | 4.984 | 0.087 | 3 | 26.623 |

As expected, the interplanar spacing increases when using a carbazole derivative with a longer alkyl chain.

Apart from the diffraction pattern, also the optical properties of the film were indicative of the formation of a layered perovskite. The absorption spectra for the n=1 $CA-C_4$ and $CA-C_5$ perovskites contain clear signatures corresponding to absorption by the carbazole molecules, as well as excitonic absorption peaks at ~506 nm (2.45 eV) for $CA-C_5$ and ~494 nm (2.51 eV) for $CA-C_4$. The corresponding photoluminescence emission peak for the $CA-C_5$ perovskites, using an excitation wavelength of 430 nm, possessed a peak wavelength of 510 nm (about 2.43 eV). For the $CA-C_4$ perovskites, the photoluminescence emission peak had a peak wavelength of 501 nm (about 2.47 eV) In both cases, there was a small Stokes shift of about 4-5 nm between the absorption and emission peaks. For $CA-C_4$ n=1, a broad emission feature at lower energy is present while it is not present for $CA-C_5$ n=1. Without being bound by theory, this could be assigned to luminescence from self-trapped excitons or long-lived color centers.

Example 2c: Thin Film of a $(CA-C_x)_2MAPb_2I_7$ (n=2) Perovskite Material $(CA-C_x)_2MAPb_2I_7$ thin films were obtained for x=4 and x=5 via spin coating at 2000 RPM for 20 s of the precursor solution and annealing at 150° C. for 15 min. It was possible to follow the formation of the $(CA-C_x)_2MAPb_2I_7$ perovskite material as a function of temperature through the use of a temperature-controlled UV-Vis via the appearance of an excitonic feature at about 572 nm.

The diffraction pattern of the thin film was measured. For the $<n>$=2 film using $CA-C_5$, (0 k 0) reflections are present, together with a low-intensity (1 1 1) reflection at ~14.2° $2\theta$. An interplanar spacing ($d_{0k0}$) of ~32.4 Å is obtained. This is a difference of ~5.8 Å compared to the interplanar spacing of the n=1 perovskite, which matches with the height of a single $PbI_6$ octahedron (~6 Å). A reflection at ~4.2° belongs to an impurity phase, this is likely the (0 4 0) reflection of the n=3 layered perovskite. The pattern of the $<n>$=2 film obtained using $CA-C_4$ is practically identical, but with all the (0 k 0) reflections shifted towards a higher angle (smaller d-spacing) due to the shorter alkyl chain.

Interestingly, carbazole multi-layered perovskites with a different number of layers (n) clearly have a different optimal annealing temperature. This could be related to a difference in formation temperature for perovskites with a different number of inorganic layers (n). The crystalline n=1 phase is already obtained by annealing at 110° C. at 15 min, with the pattern consisting of the ordered series of (0 0 l) reflections as discussed above (example 2b). However, the n=2 phase is only fully formed at a higher annealing temperature of 150° C. for the same annealing time, as could be seen when comparing the XRD pattern of spin-coated (with the same spin settings) $<n>$=2 films annealed at different temperatures and time. When a film deposited at room temperature is not heat treated, the XRD pattern is mostly consistent with that of an amorphous film apart from two broad very low intensity reflections at ~14.2° (1 1 1) and 28.3° (2 0 2), likely corresponding to a low amount of small quasi-3D crystallites (based on the width of the reflections). Upon annealing at 110° C. for 15 min, an additional broad reflection at ~5.3° (d=16.7 Å) is present in the pattern of the film. This is thought to correspond to an unidentified intermediate precursor phase. When annealing at 110° C. for a longer time (30 min and 45 min), a reflection at low angle (~2.3°) appears, indicative of the formation of a layered phase. However, in terms of relative intensity compared to the reflections of the phase obtained at 150° C., the intensity of this reflection is still very low (one can also still distinguish the substrate background). The pattern for the <n>=2 film annealed at 150° C. for 15 min corresponds mainly to an n=2 phase (apart from a small amount of n=3). It was observed that the intensity of the reflections is much higher than for the films annealed at 110° C. Annealing at 200° C. degrades the n=2 phase, with the appearance of different layered phases. The same conclusions can be reached when examining the UV-Vis absorption spectra of these films, namely by the appearance of an excitonic absorption peak in the spectrum for the film annealed at 150° C. for 15 min (see below).

In summary, the n=2 phase seems to possess a higher formation temperature compared to n=1. The above analysis was done for $CA-C_5$, for $CA-C_4$ the n=2 phase is also fully formed at 150° C.

Absorption and emission spectra of the $(CA-C_x)_2MAPb_2I_7$ thin films were measured and compared; two features stood out in this comparison. Firstly, two distinct peaks were clearly present in both of the spectra (but most clearly in the emission spectrum). This points to the presence of a secondary phase, which was attributed to an n=3 perovskite phase (which is expected to emit at lower energy than the n=2 phase; indeed, the peak emission wavelength for the n=3 of the $(CA-C_5)_2MAPb_2I_7$ thin films is around 607 nm and for the n=2 around 572 nm). The difficulty of obtaining phase pure films of 2D perovskite materials is also described in literature. Secondly, the observed Stokes shift is again small (about 7 nm for the peaks assigned to n=2). When the spectra are compared between $CA-C_4$ and $CA-C_5$, a slight shift toward higher energy is observed for $CA-C_4$ based perovskites.

Comparing the UV-Vis absorption spectra of the $(CA-C_x)_2 PbI_4$ (n=1) and $(CA-C_x)_2MAPb_2I_7$ (n=2) perovskite material films, one notices that the exciton peak is shifted towards higher wavelength (lower energy) when going from n=1 to n=2 (from about 2.45 eV to about 2.19 eV). Such a shift is consistent with what is reported in literature for 2D hybrid perovskites materials with phenylethylammonium and butylammonium.

Example 2d: Thin Film of a $(CA-C_x)_2MA_2Pb_3I_{10}$ (n=3) Perovskite Material

A $(CA-C_5)_2MA_2Pb_3I_{10}$ thin film was obtained by spin coating at 2000 RPM for 20 s of the precursor solution and annealed.

This annealing could be performed inside an X-ray diffraction (XRD) machine to obtain diffraction patterns in function of temperature. To this end, an untreated film (i.e. prior to annealing) was transferred to the heating chamber of a temperature-controlled XRD machine and the film was heated to 110° C. at about 3.4° C./min followed by heating at about 1.15° C./min to 140° C. whilst measuring diffraction patterns. For the diffraction pattern measured at 140° C., the reflection at the lowest angle is located at about 2.39° (2θ). This is linked to an interlayer spacing (d) of about 36.9 Å. Comparing this value to the interlayer spacing calculated for the lowest angle reflection of the film with nominal composition $(CA-C_5)_2MAPb_2I_7$ (example 2c; ~32.2 Å), a difference of about 4.7 Å was found; this value is smaller than the height of a single $PbI_6$ octahedron. Reasons for this apparent discrepancy may include a change in the configuration of the carbazole derivatives and/or a tilt of the octahedra of the structure when moving to higher n.

For the <n>=3 film using $CA-C_5$, a new film was obtained by spin-coating at 2000 RPM for 20 s the precursor solution and annealing 15 min at 130° C. XRD was measured at room temperature. The (1 1 1) and (2 0 2) reflections of the perovskite structure become much more pronounced, indicating that the preferential growth direction is changing towards vertical growth, but the (0 2 0) reflection of the n=2 structure at ~2.7° and the (0 4 0) reflection of the n=3 structure at ~4.2° are also clearly present.

For <n>=3 using $CA-C_4$, a film was obtained by spin coating as above. The reflections for $CA-C_4$ <n>=3, measured at room temperature after annealing 15 min at 130° C., are shifted to lower angle compared to <n>=2 and also compared to <n>=3 of $CA-C_5$, such that the (0 2 0) reflection for n=3 can still be observed within the 2θ range.

In summary, for the n=3 phase, a clear optimal annealing temperature is more difficult to determine than for the n=2 phase due to the clear presence of both n=2 and n=3 phases in <n>=3 films. For <n>=3 an annealing temperature of 130° C. was used.

The absorption spectrum of the film was again measured and excitonic features at about 506 nm, 565 nm and 600 nm could be observed when x=5. Based on these observations, it may be possible that the $CA_2MA_2Pb_3I_{10}$ (n=3) thin film comprise a mixture of layered perovskites with n=1, 2, 3 and possibly even n=4 perovskite materials. When the spectra are compared between $CA-C_4$ and $CA-C_5$, a slight shift toward higher energy is observed for $CA-C_4$ based perovskites.

Example 2e: Thin Films of $(CA-C_x)_2MA_{n-1}Pb_nI_{3n+1}$ Perovskite Materials with <n>=4, 10, 40 and 60

$(CA-C_x)_2MA_{n-1}Pb_nI_{3n+1}$ thin films with <n>=4, 10, 40 and 60 were prepared following the same procedure as outlined in examples 2a, 2b and 2c.

Diffraction patterns of the different thin films were again measured. It was observed for these thin films with <n>=10, 40 and 60, that the layered perovskite materials oriented themselves more along the (1 0 1) direction. As a result, the (0 k 0) reflections, which were used to characterize the layered perovskite material films with lower <n>, do not appear in the diffraction pattern of the films with <n>=10, 40 and 60. Instead, the primary reflections which are present overlap with those of the 3D perovskite $MAPbI_3$; i.e. the (1 1 1) and (2 0 2) reflections of layered perovskite materials that grow oriented along the (1 0 1) direction overlap with the (1 1 0) and (2 2 0) reflections of an ordered $MAPbI_3$ film. Hence, for the higher-n layered perovskite materials, it is difficult to prove that a layered structure is present through XRD patterns of thin films alone. Nevertheless, it was observed for <n>=10 that the relative intensity of the (1 1 1) and (2 0 2) reflections compared to the other reflections in the pattern is smaller compared to the patterns for <n>=40 and <n>=60. For <n>=4, reflections at low angle, corresponding to a mixture of low-n phases, are still clearly present.

In summary, starting from <n>=4 also a non-negligible amount of quasi-3D perovskite phase starts to be present in the films and hence higher annealing temperatures lead to degradation of this quasi-3D phase with formation of lead iodide. Therefore, an annealing temperature similar to that of 3D perovskites (110° C.) was chosen for <n>≥4.

UV-vis absorption and emission spectra were again obtained and the optical properties of the films prepared with the different nominal compositions was consistent with what is expected for layered perovskite materials with an increasing number of negatively charged layers. Comparing the absorption spectra of the layered perovskite materials with n=10, 40 and 60 to one another, it was seen that the absorption onset shifts to lower energy (higher wavelength) for increasing n. The peak excitonic absorption intensity, the optical band gap, and the photoluminescence emission intensity followed a similar trend as a function of n (see tables below).

| $CA-C_m$ | n | Excitonic absorption peak energy (eV/nm) |
|---|---|---|
| $CA-C_5$ | 1 | 2.45/506 |
|  | 2 | 2.19/566 |
|  | 3 | 2.06/602 |
|  | 4 | 1.95/636 |
| $CA-C_4$ | 1 | 2.51/494 |
|  | 2 | 2.21/561 |
|  | 3 | 2.06/602 |
|  | 4 | 1.96/633 |

| $CA-C_m$ | <n> | Optical band gap energy (eV/nm) |
|---|---|---|
| $CA-C_5$ | <4> | 1.631/760 |
|  | <10> | 1.627/762 |
|  | <40> | 1.590/780 |
| $CA-C_4$ | <4> | 1.688/735 |
|  | <10> | 1.626/763 |
|  | <40> | 1.617/767 |

| $CA-C_m$ | n | Excitonic emission peak energy (eV/nm) |
|---|---|---|
| $CA-C_5$ | 1 | 2.43/510 |
|  | 2 | 2.18/569 |
|  | 3 | 2.05/604 |
|  | 4 | 1.94/640 |
| $CA-C_4$ | 1 | 2.47/501 |
|  | 2 | 2.15/576 |
|  | 3 | 2.03/610 |
|  | 4 | 1.93/642 |

This is conform with the expectation that when the number of negatively charged layers in the structure is increased, the electronic confinement is decreased.

The presence for <n>>3 of a band gap at much lower energy is indicative of the formation of quasi-3D perovskites together with low-n phases.

Similarly, as <n> increases, emission peaks at lower wavelengths correspond to the presence of quasi-3D perovskites (see table below).

| $CA-C_m$ | <n> | Emission peak energy of quasi 3D perovskites (eV/nm) |
|---|---|---|
| $CA-C_5$ | 4 | 1.78/697 |
|  | 10 | 1.70/731 |
|  | 40 | 1.64/755 |
| $CA-C_4$ | 3 | 1.79/694 |
|  | 4 | 1.72/721 |
|  | 10 | 1.66/748 |
|  | 40 | 1.65/751 |

From this analysis it is clear that we can tune the absorption and emission properties of the carbazole containing perovskites by changing the stoichiometry of the precursor solutions.

Example 2f: Thin Films of $(CA-C_x)_2MA_{n-1}Pb_nI_{3n+1}$ Perovskite Materials Obtained by Hot Casting with <n>=4, 10, and 40

A hot-casting procedure at 110° C. was used on the materials to study its influence on the crystallinity and morphology of the films. It was observed that the diffraction background and full-width at half-maximum (FWHM) of the reflections are significantly reduced using the hot-casting procedure compared to room-temperature casting followed by annealing. This indicates that the hot-casting of the films resulted in larger grains (sharper reflections) as well as enhanced crystallinity. A broad diffraction peak from ~16°-30° 2θ was observed and corresponds to diffraction of the quartz substrate.

The film morphology was investigated using scanning electron microscopy (SEM). Films obtained using regular spin-coating and annealing were compared to films obtained using the hot-casting procedure for <n>=4, 10 and 40. In the case of the <n>=4 film, an increased grain size is visible in the SEM images. For both <n>=10 and 40 a more pronounced effect is observed. The morphology changes from needle-like structures to planar columnar structures, expected to be more beneficial towards solar cell performance. Based on the enhanced crystallinity and the superior morphology, the hot-casting method was applied for the active layer of the solar cell devices (described in example 5).

Example 2g: Precursor Mixtures and Thin Films of a $(TTF-C_2—NH_3)_2MA_{n-1}Pb_nI_{3+1}$ Perovskite Material Precursor mixtures of a $(TTF-C_2—NH_3)_2MA_{n-1}Pb_nI_{3+1}$ perovskite material are prepared in the same way as in example 2a, replacing CA with $TTF-C_2—NH_3$. Thin films are made from these precursor mixtures following the procedures outlined in examples 2b to 2d.

Example 2h: Precursor Mixtures and Thin Films of a $(TCNQ-C_2—NH_3)_2MA_{n-1}Pb_nI_{3+1}$ Perovskite Material Precursor mixtures of a $(TCNQ-C_2—NH_3)_2MA_{n-1}Pb_nI_{3+1}$ perovskite material are prepared in the same way as in example 2a, replacing CA with $TCNQ-C_2—NH_3$. Thin films are made from these precursor mixtures following the procedures outlined in examples 2b to 2d.

Example 2i: Precursor Mixtures and Thin Films of a Perovskite Material Based on a Compound Q'

Precursor mixtures of a Q'MA$_{n-1}$Pb$_n$I$_{3+1}$ perovskite material, wherein Q' is one of a di-ammonium functionalized 2,5-dithienylthiazolo[5,4-d]thiazole, a di-ammonium functionalized 6,6' iso-indigo iodide salt (compound A described in the second aspect above) or a di-ammonium functionalized carbazole/oxidiazole iodide salt (compound B described in the second aspect above) are prepared in the same way as in example 2a, replacing CA with the di-ammonium functionalized 2,5-dithienylthiazolo[5,4-d]thiazole, the di-ammonium functionalized 6,6' iso-indigo iodide salt or the di-ammonium functionalized carbazole/oxidiazole iodide salt respectively. Thin films are made from these precursor mixtures following the procedures outlined in examples 2b to 2d.

Example 2j: Precursor Mixtures and Thin Films of a Perovskite Material Based on a Charge Transfer Complex Between a Compound Q (=TCNQ-C$_2$—NH$_3^+$) and a Further Intercalated Compound Precursor mixtures of a (TCNQ-C$_2$—NH$_3^+$)$_2$MA$_{n-1}$Pb$_n$I$_{3+1}$ perovskite material which further comprises TTF are prepared in the same way as in example 2a, replacing CA with TCNQ-C$_2$—NH$_3^+$ and adding an equal molar amount of TTF to the mixture. Thin films are made from these precursor mixtures following the procedures outlined in examples 2b to 2d. The TTF intercalates between the TCNQ-C$_2$—NH$_3$ in the positively charged layers and a charge transfer complex is formed between them.

Alternatively, thin films of the (TCNQ-C$_2$—NH$_3^+$)$_2$MA$_{n-1}$Pb$_n$I$_{3+1}$ perovskite material are prepared in the same way as in example 2h and intercalating TTF compound is subsequently introduced therein by a soaking or dipping technique.

Example 2k: Precursor Mixtures and Thin Films of a 2D Perovskite Material with n=1 Based on a Compound Q (=Pyrene-C$_4$H$_8$—NH$_3^+$) and a Further Intercalated Compound As a further example of 2D layered hybrid perovskites containing charge-transfer complexes, we introduce the combination of pyrene-butylammonium (Pyrene-C$_4$H$_8$—NH$_3^+$; abbreviated as "PyrC$_4$") as a charge transfer donor with the strong charge transfer acceptors tetracyanoquinodimethane (TCNQ) and tetracyanobenzene (TCNB). The chemical of PyrC4 is shown below:

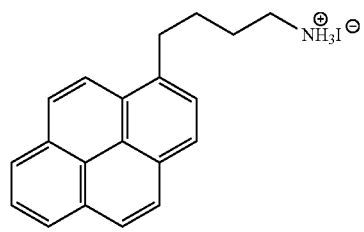

Pyrene is known to form a 1:1 mixed-stack charge-transfer complex with TCNQ and with TCNB. Through self-assembly from a precursor solution containing all the components in the stoichiometric ratios, we obtained films of layered perovskites denoted (PyrC$_4$-TCNQ 1:1)$_2$PbI$_4$ and (PyrC$_4$-TCNB 1:1)$_2$PbI$_4$. We discuss the formation of the layered perovskites containing charge-transfer complexes and compare their structure, optical properties and charge-carrier dynamics with the layered perovskite (PyrC$_4$)$_2$PbI$_4$.

Pyrene is a relatively strong donor molecule (with a relatively low ionization potential of ~7.47 eV)[21] and TCNQ and TCNB are strong acceptors (with relatively high electron affinities of respectively ~2.88 eV and ~2.30 eV). When pyrene is combined in a 1:1 ratio with TCNQ or TCNB, a mixed-stack charge-transfer complex is obtained. Upon addition of TCNQ or TCNB to a solution of PyrC$_4$ a clear color change from colorless to dark brown and dark red, respectively, occurs, indicative of the formation of charge-transfer complexes in the solution. Deposited as a thin-film, the PyrC$_4$-TCNQ charge-transfer complex exhibits a charge-transfer absorption band with a maximum at ~593 nm, in solution the charge-transfer band has a maximum at ~572 nm. The charge-transfer absorption band of the PyrC$_4$-TCNB charge-transfer complex partially overlaps with the absorption of the PyrC$_4$ donor and the TCNB acceptor and is significantly blue shifted compared to the PyrC$_4$-TCNQ CT absorption band (as expected based on the lower electron affinity of TCNB and using the formula $h\nu_{CT}=I_D-E_A-\Delta$ with $\nu_{CT}$ the frequency of the CT transition, $I_D$ is the ionization energy of the donor, $E_A$ is the electron affinity of the acceptor and $\Delta$ the coulombic attraction energy of the complex).

Precursor mixtures of a (PyrC$_4$)$_2$PbI$_4$ perovskite material which optionally further comprises TCNQ or TCNB were prepared in the same way as in example 2a, replacing CA with PyrC$_4$ and optionally adding an equal molar amount of either TCNQ or TCNB to the mixture and by adapting the concentration of the precursor solution as follow:

| Composition | PyrC$_4$ (mol/l) | PbI$_2$ (mol/l) | TCNQ (mol/l) | TCNB (mol/l) |
|---|---|---|---|---|
| (PyrC$_4$)$_2$PbI$_4$ | 0.6 | 0.3 | 0 | 0 |
| (PyrC$_4$:TCNQ 1:1)$_2$PbI$_4$ | 0.6 | 0.3 | 0.6 | 0 |
| (PyrC$_4$:TCNB 1:1)$_2$PbI$_4$ | 0.6 | 0.3 | 0 | 0.6 |

Thin films were made and annealed from these precursor mixtures.

Films of the (PyrC$_4$)$_2$PbI$_4$ layered perovskite (annealed at 150° C.) exhibit an excitonic absorption peak at ~490 nm (2.53 eV) and a corresponding photoluminescence emission peak at ~499 nm (2.48 eV). In the photoluminescence emission spectrum also a broad emission feature from ~550 nm till ~830 nm is present. Interestingly, this broadband emission is only clearly present when the films were annealed at a higher temperature (150° C. for 15 min compared to 110° C. for 15 min). The films that were annealed at higher temperature have much enhanced crystallinity, judging by the diffraction pattern (not shown). Without being bound by theory, it is believed that the broad emission band may be due to luminescence from self-trapped excitons or long-lived color centers.

Figure 18:
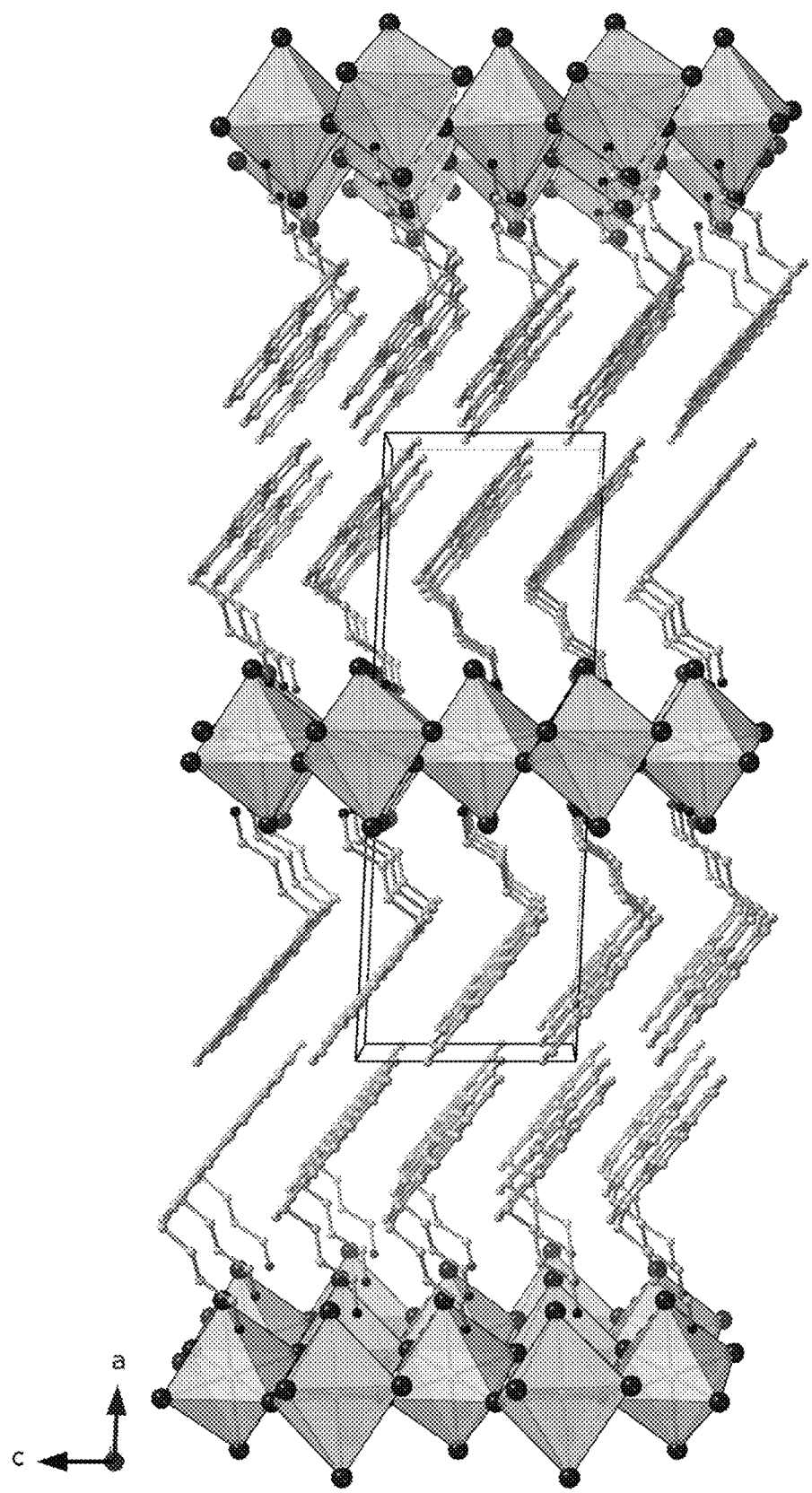
FIGS. 18 and 19 show two views, perpendicular to one another, of the single crystal XRD of a 2D $PyrC_4$ where n=1.
Figure 19:
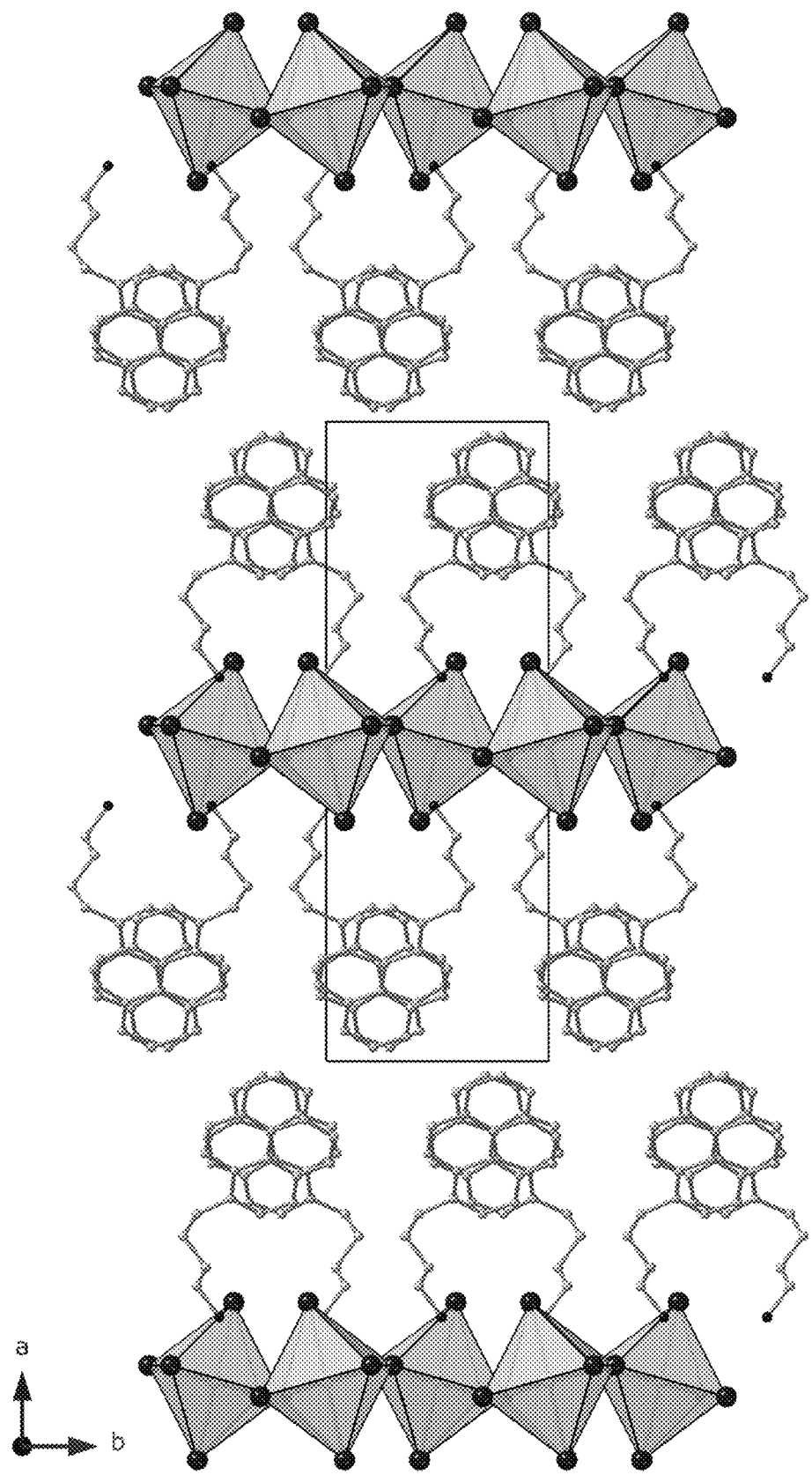

The diffraction pattern of a film of (PyrC$_4$)$_2$PbI$_4$ consists of a series of (0 0 l) reflections characteristic for a n=1 layered 2D perovskite with preferential growth such that the organic layers are oriented parallel to the substrate.[7] An interplanar spacing (d$_{001}$) of ~26.6 Å is obtained. FIGS. 18 and 19 are representations, perpendicular to one another, of the structure of a single crystal as deduced from the XRD results.

Upon incorporation of the TCNQ molecules in a 1:1 ratio with PyrC$_4$, to form (PyrC$_4$-TCNQ 1:1)$_2$PbI$_4$, significant changes in the absorption and emission spectra are apparent. The excitonic absorption peak shifts from ~490 nm (2.53 eV) to ~532 nm (2.33 eV) and the excitonic emission peak shifts from ~499 nm (2.48 eV) to ~541 nm (2.29 eV). Such a shift in excitonic peak position points to a significant change in the Pb—I—Pb angle and/or the Pb—I bond length of the inorganic framework. In the absorption spectrum of (PyrC$_4$-TCNQ 1:1)$_2$PbI$_4$, also the charge-transfer absorption band is clearly present (overlapping with the excitonic absorption peak of the material) at the same position as for the separate charge-transfer complex. In the emission spectrum, the broad feature at higher wavelengths that was present for (PyrC$_4$)$_2$PbI$_4$ is no longer present after the incorporation of TCNQ. Also, no intense emission from the PyrC$_4$-TCNQ charge-transfer complex is present in the spectrum of (PyrC$_4$-TCNQ 1:1)$_2$PbI$_4$, however the spectrum of PyrC$_4$-TCNQ also does not contain a clear charge-transfer emission peak (contrary to the spectrum of pyrene-TCNQ found in literature, using pyrene without the alkylammonium linker; it is noteworthy that the absorption spectrum also differs between PyrC$_4$-TCNQ and pyrene-TCNQ).

Figure 20:
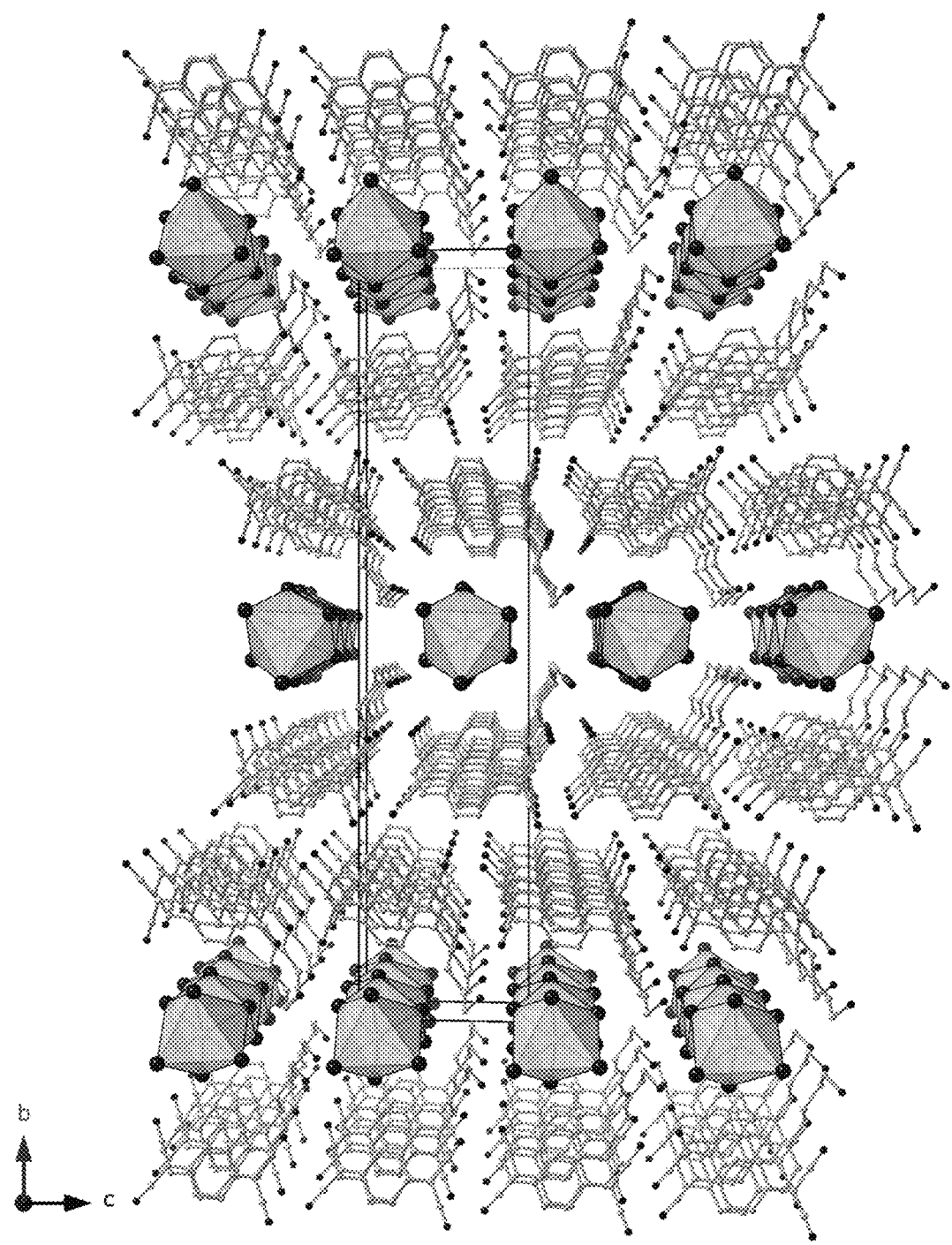
FIGS. 20 and 21 show two views, perpendicular to one another, of the single crystal XRD of a 1D $PyrC_4$:TCNQ 1:1
Figure 21:
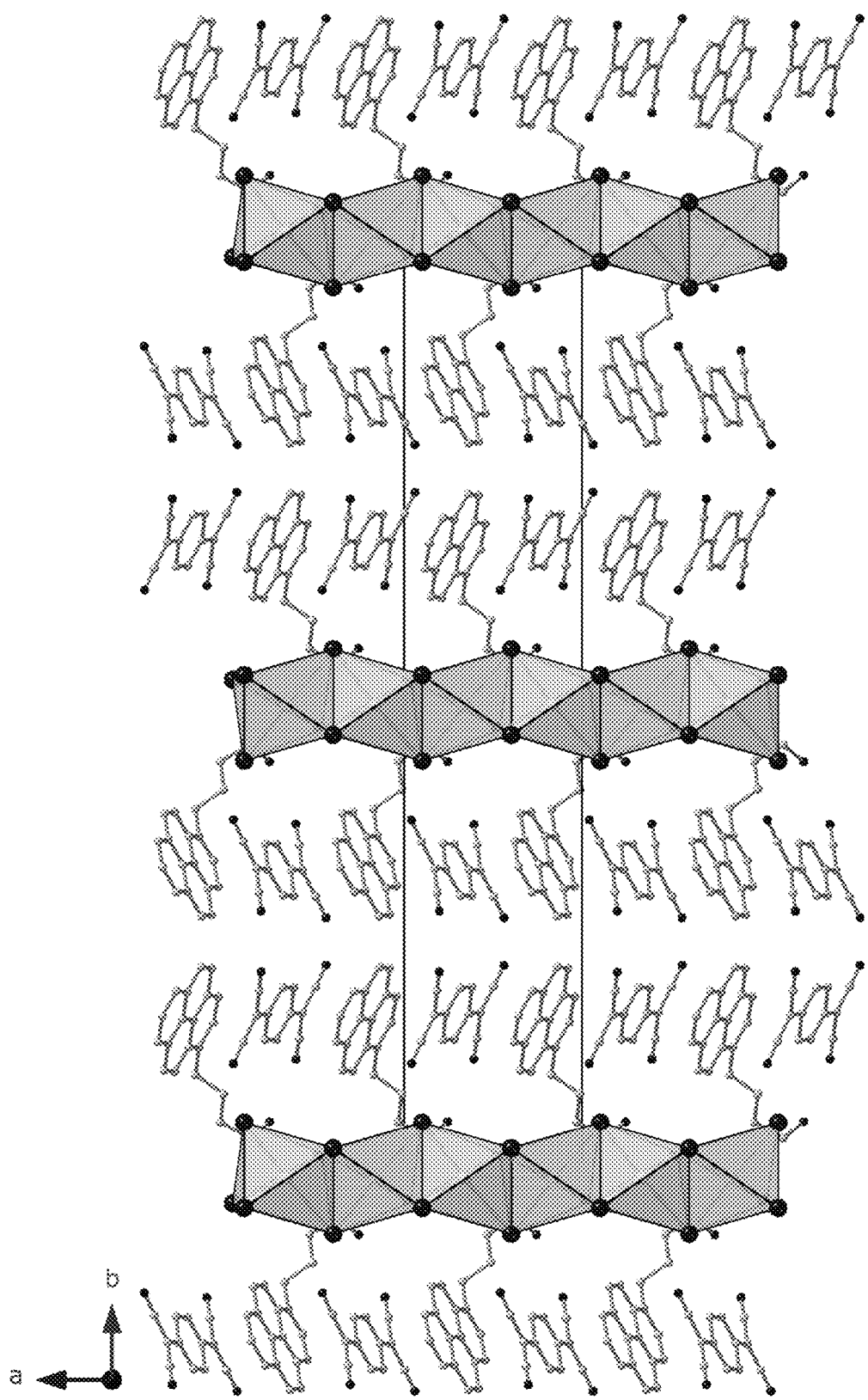

The diffraction pattern of (PyrC$_4$-TCNQ 1:1)$_2$PbI$_4$ films shows a similar series of (0 0 l) reflections as (PyrC$_4$)$_2$PbI$_4$, however shifted towards lower diffraction angles indicating an increased interplanar spacing (d$_{002}$) of ~30 Å. FIGS. 20 and 21 are representations, perpendicular to one another, of the structure of a single crystal as deduced from the XRD results.

With TCNB, the excitonic absorption peak shifts to ~529 nm (~2.34 eV) and the excitonic emission peak shifts to ~542 nm (~2.29 eV). In the emission spectrum of (PyrC$_4$-TCNB 1:1)$_2$PbI$_4$, a charge-transfer emission band is apparent at ~611 nm (at approximately the same position as in the emission spectrum of the PyrC$_4$-TCNB 1:1 charge-transfer complex). From the XRD pattern, an interplanar spacing (d$_{002}$) of ~28.7 Å is obtained for (PyrC$_4$-TCNB 1:1)$_2$PbI$_4$.

When a different PyrC4:TCNQ or PyrC4:TCNB ratio was attempted (e.g. a 2:1 donor:acceptor ratio), the absorption and emission spectra and the diffraction patterns showed clear signs of a secondary phase being present. This indicates that donor:acceptor ratio close to 1:1 is advantageous for the formation of the desired structure.

Example 2l: Precursor Mixtures and Thin Films of a 2D Perovskite Material with n=2 Based on a Compound Q (=Pyrene-C$_4$H$_8$—NH$_3$$^+$) and a Further Intercalated Compound The precursors shown in the table below were dissolved together in dimethylformamide (concentrations in Table 1) by stirring at 50° C. for 15 min.

|  | PyrC$_4$ <n> = 2 (mol/l) | (PyrC$_4$:TCNQ 1:1) <n> = 2 (mol/l) |
|---|---|---|
| PyrC$_4$I | 0.3 | 0.3 |
| TCNQ | N.A. | 0.3 |
| MAI | 0.15 | 0.15 |
| PbI$_2$ | 0.3 | 0.3 |

PyrC$_4$I: pyrene-C$_2$H$_8$—NH$_3$$^+$I$^-$

Films were spin-coated at 2000 rpm, 20 s. The films were annealed at 130° C. for 15 min.

The UV-Vis absorption spectrum of PyrC$_4$ <n>=2 indicates the formation of a film containing mainly the n=2 and n=3 layered perovskites with excitonic absorption peaks at respectively 560 nm and 600 nm.

When TCNQ is added to the precursor solution in a 1:1 molar ratio with respect to PyrC$_4$I, an excitonic absorption peak at 570 nm is obtained. Hence the excitonic absorption peak for the n=2 phase shifts towards higher wavelengths by 10 nm. This shift in excitonic peak indicates that the layered perovskite structure changes when TCNQ is added, which indicates that the PyrC$_4$:TCNQ charge-transfer complex is incorporated into the layered perovskite structure. Mainly the n=2 phase is obtained with the PyrC$_4$:TCNQ charge-transfer complex incorporated into the structure.

Example 2m: Precursor Mixtures and Single Crystals of a 1D Perovskite Material of Formula (PyrC$_4$:TCNQ 1:1)PbI$_3$ Based on a Compound Q (=Pyrene-C$_4$H$_8$—NH$_3$$^+$) and TCNQ as a Further Intercalated Compound To obtain the crystals of the 1D hybrid, the following procedure was used. PyrC$_4$I, TCNQ and PbI$_2$ were dissolved together in gamma-butyrolactone by stirring at 50° C. for 15 min. The precursor solution was filtered through a syringe filter (0.45 μm). The precursor solution (0.75 ml) was transferred to a small glass vial. The small vial (5 ml volume) was capped off with aluminum foil. A small hole was made in the aluminum foil. The small vial with the aluminum foil was put in a larger glass vial (20 ml volume). A small amount of dichloromethane (2 ml) was injected in the gap between the two flasks and the larger flask were capped off with a plastic cap and Parafilm™. The vials were left undisturbed at room temperature. After 1 week, crystals were harvested. The crystals were washed three times with dry dichloromethane and were subsequently dried under reduced pressure at room temperature.

The table below shows the concentration in mmol/l of the precursors in gamma-butyrolactone.

| precursors | concentration (mmol/l) |
|---|---|
| PyrC$_4$I | 33.2 |
| TCNQ | 33.2 |
| PbI$_2$ | 16.6 |

Figure 15:
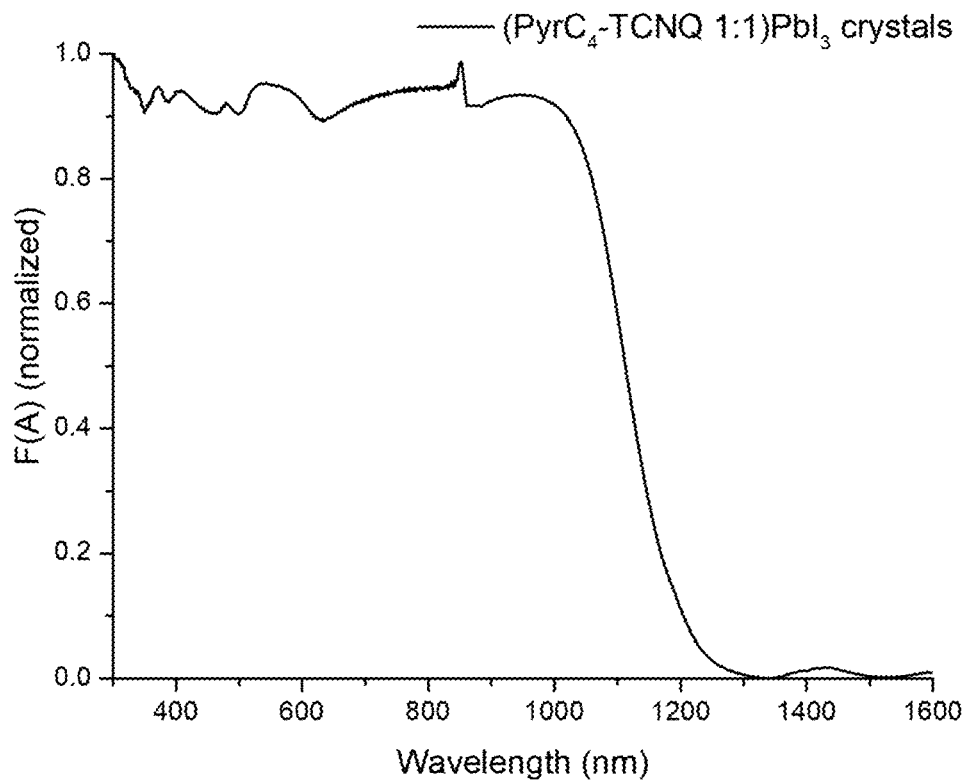
FIG. 15 shows the absorption spectrum of the ($PyrC_4$:TCNQ 1:1)$PbI_3$ crystals.
Figure 16:
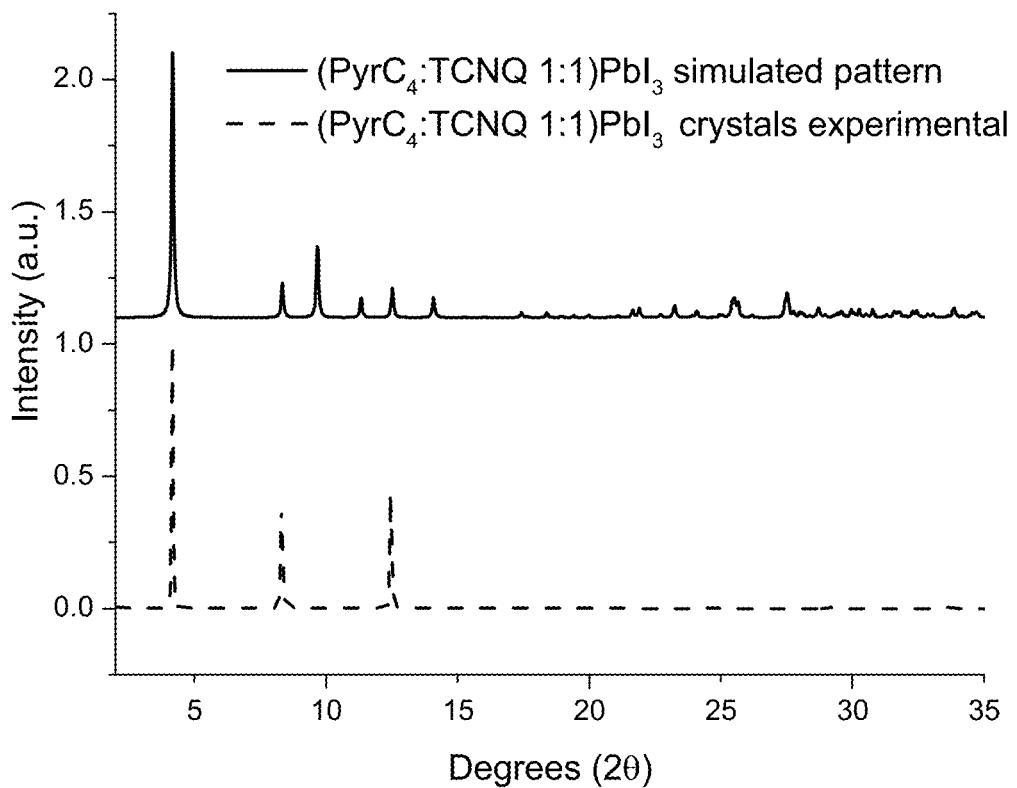
FIG. 16 shows the X-ray diffraction pattern of the ($PyrC_4$:TCNQ 1:1)$PbI_3$ crystals (dashed lines) compared to a simulated pattern (full line) from single-crystal XRD data.

As one can see in FIG. 15, the (PyrC$_4$:TCNQ 1:1)PbI$_3$ crystals have a band gap at ~1.08 eV (1145 nm). This band gap corresponds to the absorption of the PyrC$_4$:TCNQ charge-transfer complex in the 1D hybrid. The powder x-ray diffraction pattern obtained for the single crystals matches very well with the simulated pattern obtained from single-crystal XRD data obtained on the same crystals, indicating that the batch of single crystals is pure and does not contain side phases (see FIG. 16). It is Noteworthy that the crystals possess significant preferential orientation so in the experimental XRD pattern only certain reflections (0 2 0), (0 4 0), (0 6 0) can be distinguished.

Example 2n: Precursor Mixtures and Films of a 1D Perovskite Material of Formula (PyrC$_4$:TCNQ 1:1) PbI$_3$ Based on a Compound Q (=Pyrene-C$_4$H$_8$—NH$_3$$^+$) and TCNQ as a Further Intercalated Compound To obtain films of the 1D hybrid (PyrC$_4$:TCNQ 1:1)PbI$_3$, the precursors were mixed in the exact stoichiometry in dimethylformamide (see table below) for the 1D hybrid (contrary to the single crystals where a different stoichiometry was used).

| precursors | concentration (mol/l) |
|---|---|
| PyrC$_4$I | 0.3 |
| TCNQ | 0.3 |
| PbI$_2$ | 0.3 |

PyrC$_4$I, TCNQ and PbI$_2$ were dissolved together in DMF by stirring at 50° C. for 15 min. The precursor solution was filtered through a syringe filter (0.45 µm). Films were obtained by drop casting followed by annealing at 110° C. for 15 min.

Figure 17:
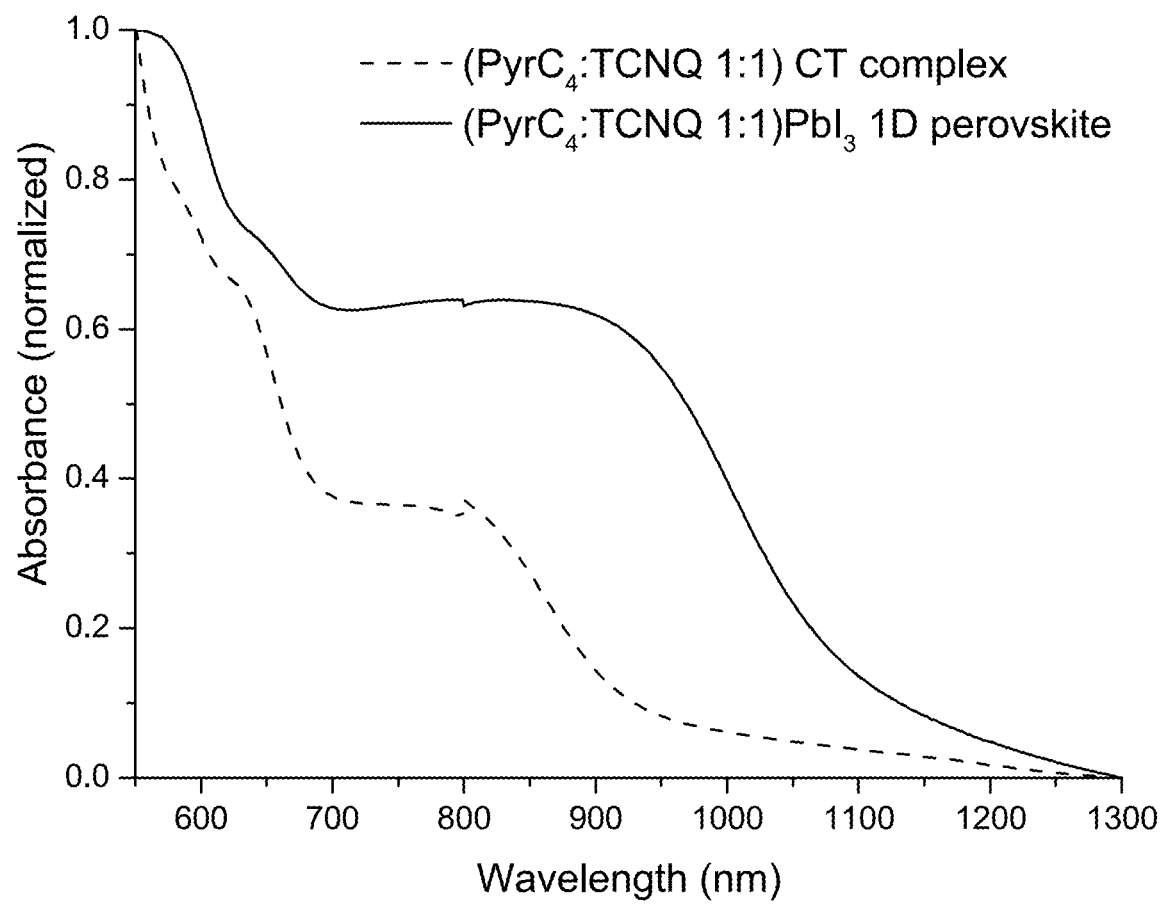
FIG. 17 shows absorption spectra of drop casted films of the ($PyrC_4$:TCNQ 1:1)$PbI_3$ hybrid (full line) and of the ($PyrC_4$:TCNQ 1:1) charge-transfer complex (dashed line).

As can be seen in the absorption spectrum (FIG. 17) of a drop casted film of the 1D hybrid (PyrC$_4$:TCNQ 1:1)PbI$_3$, the band gap is located at ~1.13 eV. This is a bit higher energy than for the single crystals. This could be related to the less perfect packing in film compared to single crystals. It can be seen in FIG. 17 that the band gap of the 1D hybrid is shifted to significantly lower energy compared to the PyrC$_4$I:TCNQ charge-transfer complex, which possesses a band gap of ~1.35 eV. This shows that the packing of the donor and acceptor molecules in the 1D hybrid results in a material with a much lower energy charge-transfer absorption band. As such, the inorganic lattice can be seen as a template for the stacking of the donor and acceptor molecules, leading to new properties compared to the regular charge-transfer complex.

Example 2o: Precursor Mixtures and Films of a Perovskite Material of Formula (Terthiophene-C$_3$—NH$_3$)$_2$PbI$_4$ (n=1) Based on a Compound Q (=Terthiophene-C$_3$H$_6$—NH$_3$$^+$)

To obtain films of the 2D layered perovskite (terthiophene-C$_3$—NH$_3$)$_2$PbI$_4$, the precursors were dissolved together in dimethylformamide (see table below) by stirring at 50° C. for 15 min.

| precursors | concentration (mol/l) |
|---|---|
| Tert-C$_3$—NH$_3$I | 0.6 |
| P6I$_2$ | 0.3 |

The precursor solution was filtered through a syringe filter (0.45 µm). Films were obtained by spin coating (2000 rpm, 20 s) followed by annealing for 15 min on a hotplate. Depending on the temperature, different materials were obtained.

The excitonic absorption peak in the absorption spectra was located at a different position depending on the annealing temperature. At 110° C., the excitonic peak was located at ~2.52 eV, which is in the range expected for a 2D layered perovskite. At 130° C. two excitonic peaks were present; the one at ~2.52 eV and a new one appearing at ~2.84 eV. At higher temperatures (150° C. or 170° C.), only the peak at ~2.84 eV was present. This indicates that around 130° C. the material transitions from one phase to another. An excitonic peak at ~2.84 eV was indicative of a material with a lower electronic dimensionality compared to the 2D layered perovskite phase. Also, the emission spectra significantly differed between the films annealed at the different temperatures. For the film annealed at 110° C., an excitonic emission peak at ~2.47 eV could be distinguished. This is a position that is expected for a 2D layered structure. For the film annealed at 130° C., this peak was still present but the shape of the emission spectra was intermediate between that of the low temperature phase (~110° C.-130° C.) and that of the higher temperature phase (~130° C.-170° C.). The emission spectra for the films annealed at 150° C. and 170° C. were very similar and corresponded to the characteristic emission of the terthiophene molecules in the hybrid structure. This indicates that for the high temperature phase, charges are transferred from the inorganic lattice to the organic terthiophene molecules present in the hybrid. The terthiophene molecules then emit through radiative recombination of the charges. In conclusion, tuning the annealing temperature leads to two different phases with different absorption and emission characteristics. The presence of emission from the terthiophene molecules for the high temperature while such emission is absent for the low temperature phase also indicates that the energy level alignment between the inorganic lattice and the organic layers changes between the two phases.

Example 2p: Precursor Mixtures and Films of a Perovskite Material of Formula (Terthiophene-C$_3$—NH$_3$:TCNQ 1:1)$_2$PbI$_4$ (n=1) Based on a Compound Q (=Terthiophene-C$_3$H$_6$—NH$_3$$^+$) and TCNQ as a Further Intercalated Compound To obtain films of the 2D layered perovskite containing the terthiophene:TCNQ charge-transfer complex, (terthiophene-C$_3$—NH$_3$:TCNQ 1:1)$_2$PbI$_4$, the precursors were dissolved together in dimethylformamide (see table below) by stirring at 50° C. for 15 min.

| precursors | concentration (mol/l) |
|---|---|
| Tert-C$_3$—NH$_3$I | 0.6 |
| TCNQ | 0.6 |
| PbI$_2$ | 0.3 |

The precursor solution was filtered through a syringe filter (0.45 µm). Films were obtained by spin coating (2000 rpm, 20 s) followed by annealing for 15 min on a hotplate. Different annealing temperatures were tested.

Both the absorption characteristics as well as the emission characteristics changed when TCNQ was added to the system. This indicates that the charge-transfer complex is incorporated into the 2D layered perovskite structure. The excitonic absorption peak shifts to ~2.47 eV and remains at this position regardless of the annealing temperature (within the range between 110° C. and 170° C.). This indicates that a 2D layered perovskite structure is preferred by the system when the charge-transfer complex is incorporated. This is contrary to the system without TCNQ (see example 2o) where a phase change happens around 130° C. The charge-transfer absorption can be seen at ~870 nm in the absorption spectrum. Like the absorption spectra, also the emission spectra remains similar over the entire temperature range tested, indicating again that the 2D layered structure containing the charge-transfer complex is stable over this temperature range. Similar to the case of the low temperature phase of the (terthiophene-C$_3$—NH$_3$)$_2$PbI$_4$ system (without TCNQ), the emission spectra contain an excitonic peak at ~2.44-2.40 eV (a slight shift as a function of the annealing temperature can be noticed). This excitonic emission peak position is within the range expected for a 2D layered perovskite structure.

Example 2q: Precursor Mixtures and Thin Films of a Perovskite Material Based on a Charge Transfer Complex Between Two Compounds Q Precursor mixtures of a (TTF-$C_2$—$NH_3$)(TCNQ-$C_2$—$NH_3$)$MA_{n-1}Pb_nI_{3+1}$ perovskite material are prepared in the same way as in example 2a, replacing CA with both TTF-$C_2$—$NH_3$ and TCNQ-$C_2$—$NH_3$. Thin films are made from these precursor mixtures following the procedures outlined in examples 2b to 2d. The TTF-$C_2$—$NH_3$ and TCNQ-$C_2$—NH3 both make up the positively charged layers and form a charge transfer complex between them.

Example 2r: Precursor Mixtures and Thin Films of a Perovskite Material Based on a Conjugated Polymer Precursor mixtures of a (Poly{trimethyl-[7-(3-thienylsulfanyl)heptyl]ammonium iodideco-thiophene})(TCNQ-$C_2$—$NH_3$)$MA_{n-1}Pb_nI_{3+1}$ perovskite material are prepared in the same way as in example 2a, replacing CA with a polythiophene-ammonium. Thin films are made from these precursor mixtures following the procedures outlined in examples 2b to 2d. The Poly{trimethyl-[7-(3-thienylsulfanyl)heptyl]ammonium iodideco-thiophene} is prepared according to Cagnoli et al. (Marcomolecules, 2008, 41, 3785-3792).

Example 3: Environmental Stability of Films

One of the goals in the development of multi-layered perovskites is to increase the stability of these materials, while maintaining a high efficiency, associated with 3D perovskites. The environmental stability of a <n>=40 multi-layered perovskite featuring CA-$C_4$ was followed over time at 77% relative humidity (RH) in the dark, and compared to MAPI and a <n>=40 multi-layered perovskite with PEA. Although for <n>=40 only a relatively small amount (~5 mol % compared to molMA+molCA) of the big cation is incorporated, a significantly enhanced moisture stability is obtained for CA-$C_4$ <n>=40 compared to PEA <n>=40 and to the 3D perovskite MAPI.

Figure 5:
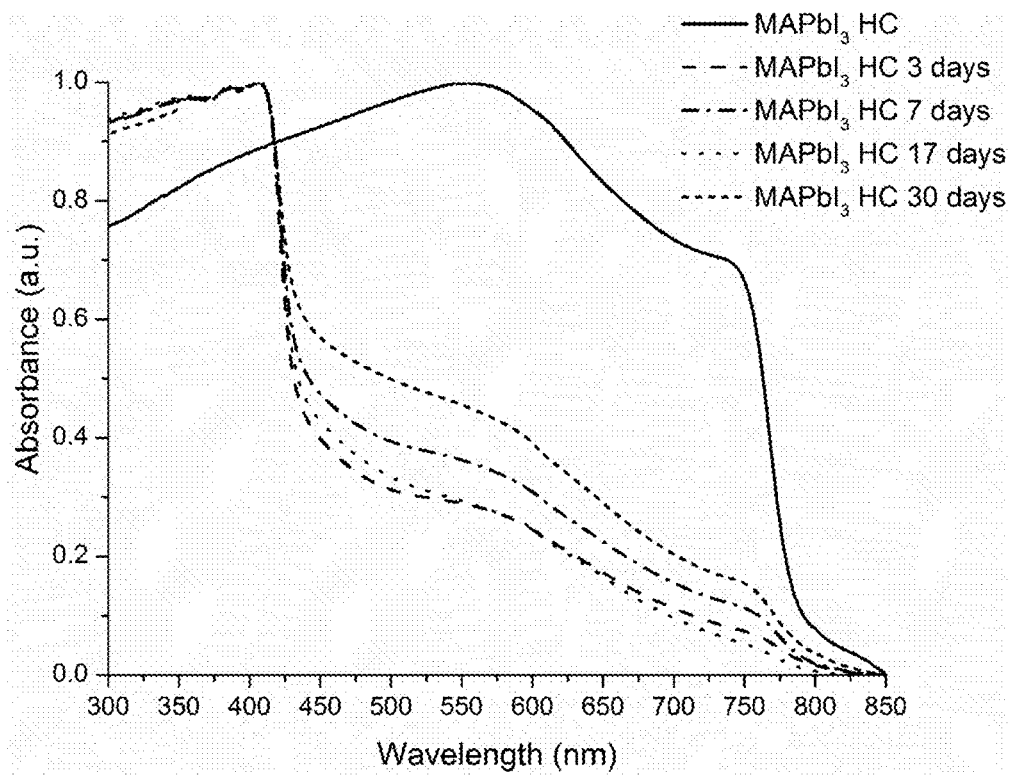
FIG. 5 shows UV-Vis absorption spectra of a MAPI film, hot-cast at 110° C., measured at different times being stored at 77% relative humidity (RH).
Figure 6:
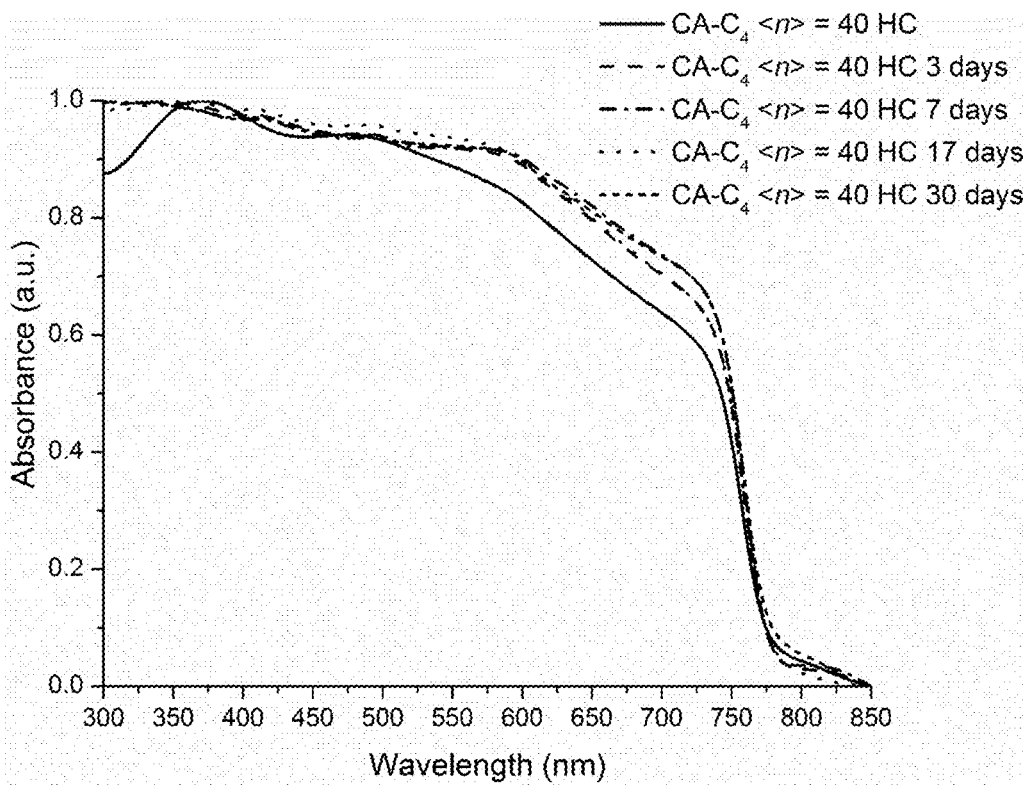
FIG. 6 shows UV-Vis absorption spectra of CA-$C_4$ <n>=40 film, hot-cast at 110° C., measured at different times being stored at 77% RH.

For instance, in the absorption spectrum of a MAPI film exposed to 77% RH (FIG. 5) an absorption feature at ~400 nm be-comes apparent, even after 3 days, which is related to the monohydrate (MAPbI$_3$.H$_2$O). For the CA-$C_4$ <n>=40 film (FIG. 6) no clear changes are noticeable in the spectra, even after 30 days at 77% RH.

Figure 7:
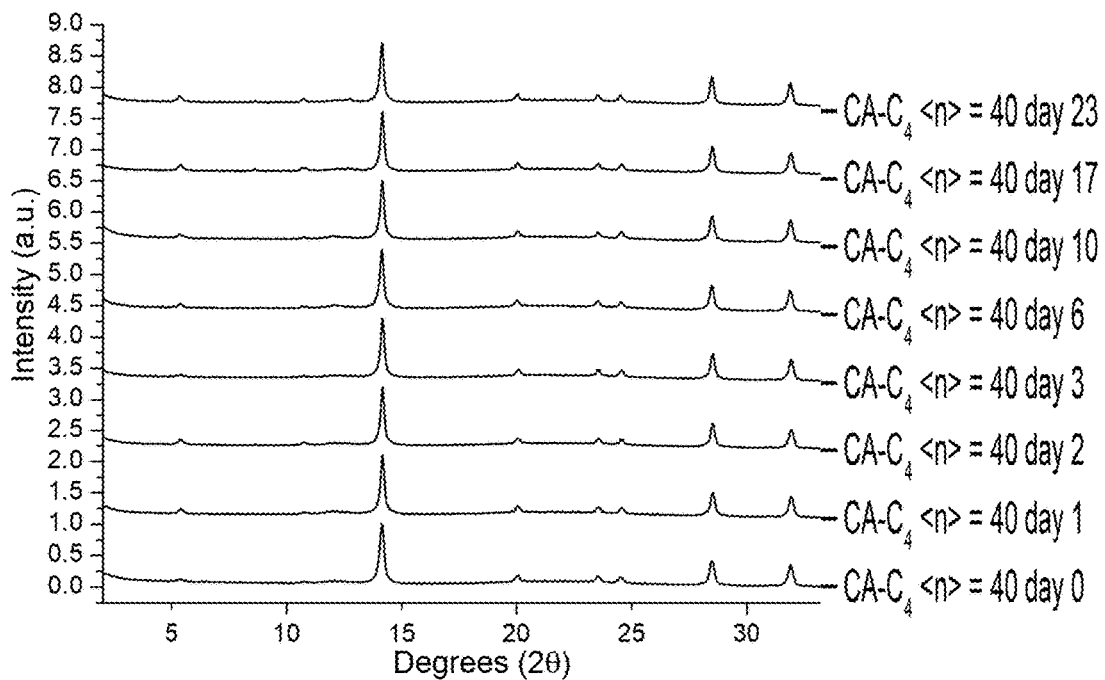
FIG. 7 shows XRD patterns of a CA-C4 <n>=40 film hot-cast at 110° C., measured at different times being stored at 77% RH.
Figure 8:
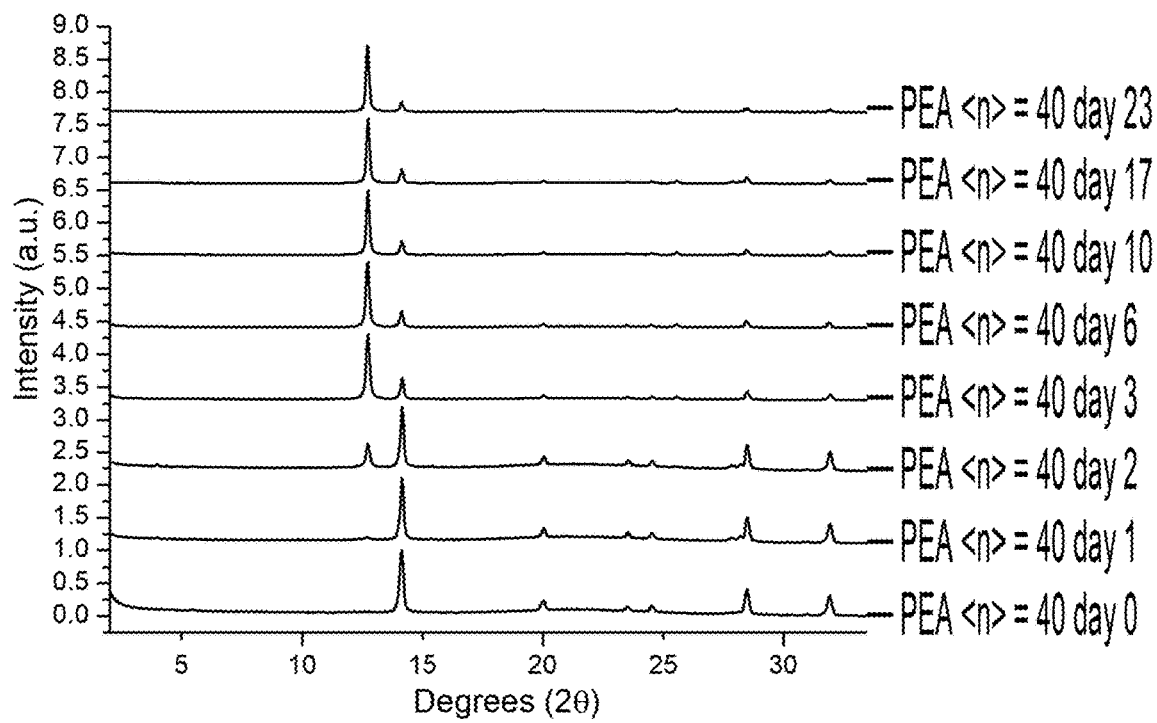
FIG. 8 shows XRD patterns of a PEA <n>=40 film hot-cast at 110° C., measured at different times being stored at 77% RH.
Figure 9:
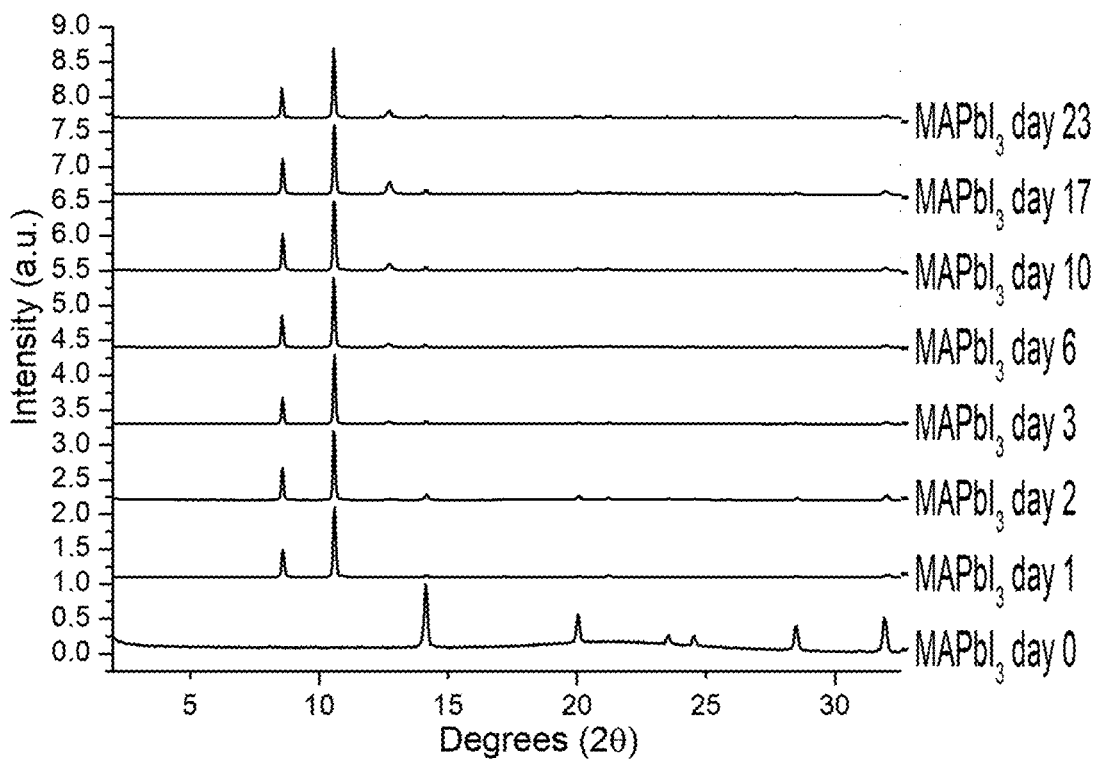
FIG. 9 shows XRD patterns of a MAPI film hot-cast at 110° C., measured at different times being stored at 77% RH.
Figure 10:
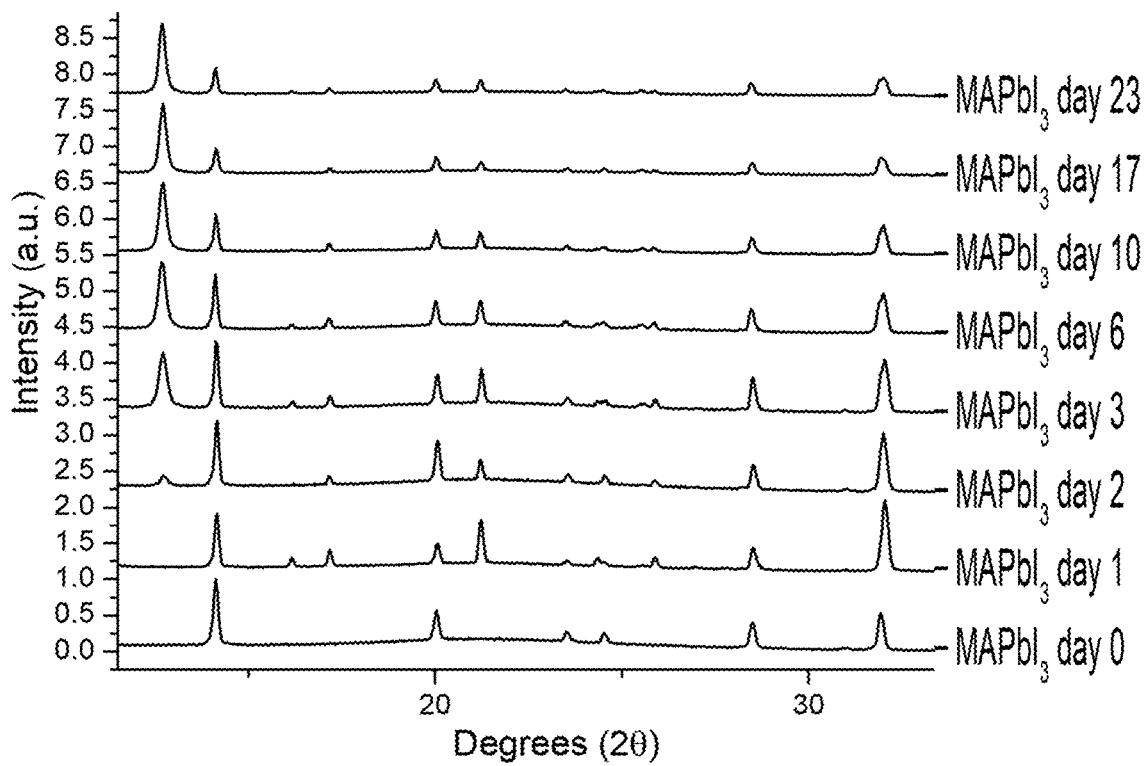
FIG. 10 shows XRD patterns of a MAPI film hot-cast at 110° C., measured at different times being stored at 77% RH, showing the range of 11.5° till 35° 2θ.

These results are consistent with the XRD patterns of the films subjected to 77% RH. For the MAPI film, initially the monohydrate (main reflections at ~8.5° and ~10.6°; FIG. 9) is formed followed by slower formation of lead iodide (main reflection at ~12.6°; FIG. 10). For the PEA <n>=40 film (FIG. 8), there is no clear sign of hydrate formation but lead iodide is slowly formed over time. For the CA-$C_4$ <n>=40 film (FIG. 7), no clear changes in the diffraction pattern can be noticed. We hypothesize that the enhanced moisture stability of the PEA and CA-$C_4$ <n>=40 films compared to MAPI is related to the presence of the more hydrophobic PEA and CA-$C_4$ organic cations at the grain boundaries. The enhanced stability for CA-$C_4$ compared to PEA could be related to the more bulky nature of the carbazole molecules and π-π stacking of the molecules, which makes water intrusion through a layer of the organic molecules more difficult.

Figure 3:
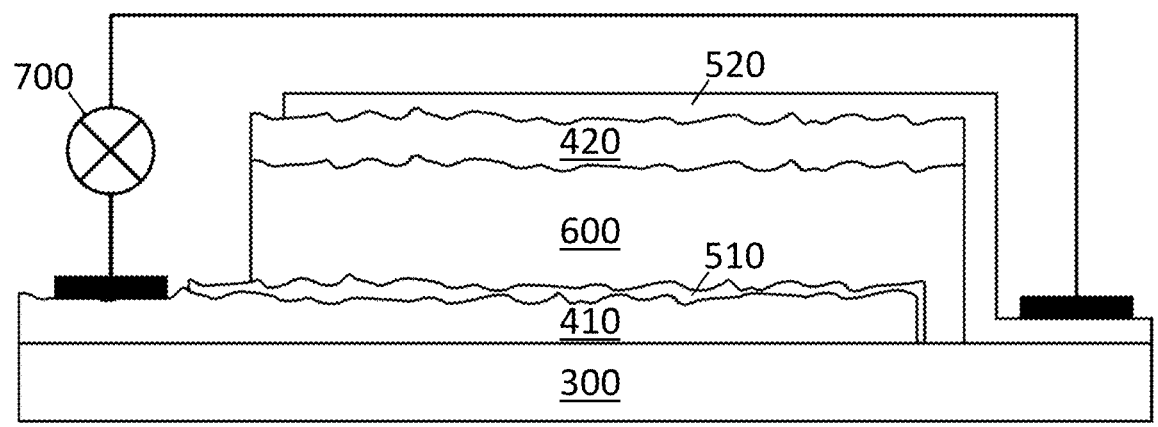
FIG. 3 is a schematic representation of a solar cell in accordance with an embodiment of the present invention.

Example 4. Photovoltaic Cells Incorporating Layered Perovskite Materials as Active Layer We now refer to FIG. 3. A planar device architecture is used for the evaluation of the layered perovskite materials according to any of examples 2b-g in actual photovoltaic cells. The planar device is comprised of a glass substrate (300) carrying a transparent conductive oxide (TCO) electrode (410). A compact TiO$_2$ charge collection layer (510) covers part of the TCO electrode (410) and the perovskite material active layer (600) is provided thereon. A hole transporting charge collection layer (520) overlaying the active layer (600) facilitates charge collection to the back electrode (420). The electrical circuit is closed by connecting a load (700) inbetween the TCO electrode (410) and the back electrode (420).

The opto-electrical testing mainly consists of current-voltage (I-V) measurements under simulated solar illumination (AM1.5 spectrum) and subsequent spectral response testing for current extraction under monochromatic light for the wavelengths ranging over the full solar spectrum. This results in a clear identification of the power conversion efficiency of the photovoltaic cells. Additionally, different scan-speeds and sweep-directions for these I-V measurements are implemented to identify and quantify the hysteresis effect.

Example 5: Further Photovoltaic Cells Incorporating Layered Perovskite Materials as Active Layer

Example 5a: Device Fabrication

Devices were made in an ITO/SnO$_2$/perovskite/Spiro-OMeTAD/Au configuration. The ITO-coated glass substrates were successively cleaned in ultrasonic baths containing detergent, deionized water, acetone and isopropanol for 5 min, respectively. Afterwards, these cleaned substrates were treated with oxygen plasma. Then a 2.5 wt % water dispersion of SnO$_2$ nanoparticles was spin coated on the substrates at 2800 rpm. Substrates coated with SnO$_2$ were pre-heated at 110° C. Then perovskite solution in DMF was spin-coated on these heated substrates at 3000 rpm for 60 s, followed by annealing at 110° C. for 15 min. An 80 mg/mL Spiro-OMeTAD solution doped with 17.5 μl lithium bis (trifluoromethanesulfonyl) imide (520 mg/mL in acetonitrile) and 28.5 μL 4-tert-butylpyridine was spin coated onto the perovskite films. These films were exposed overnight to air with 26% relative humidity for oxygen doping. In the end, the devices were completed by depositing an 80 nm Au layer onto the Spiro-OMeTAD through a shadow mask, defining an active area of 0.13 cm$^2$.

Example 5b: Solar Cell Behavior and Device Stability Under Moisture

Figure 11:
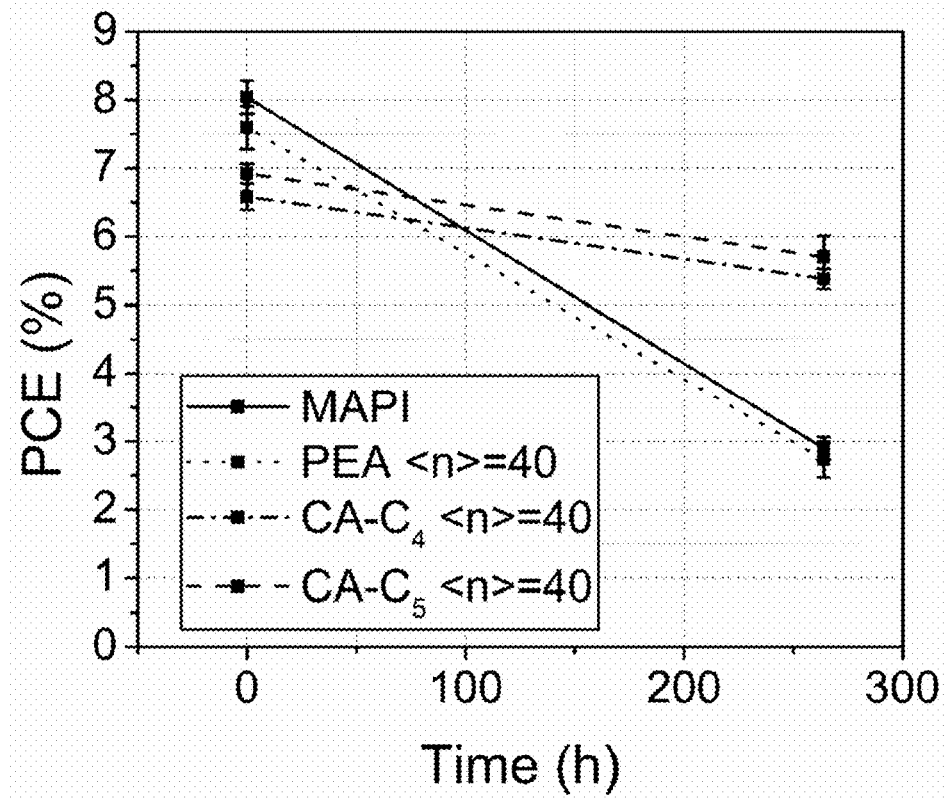
FIGS. 11 to 14 show changes of device metrics after being stored in 77% RH air for 264 h. Average value and standard deviation shown on each data point are obtained from 12 devices.
Figure 12:
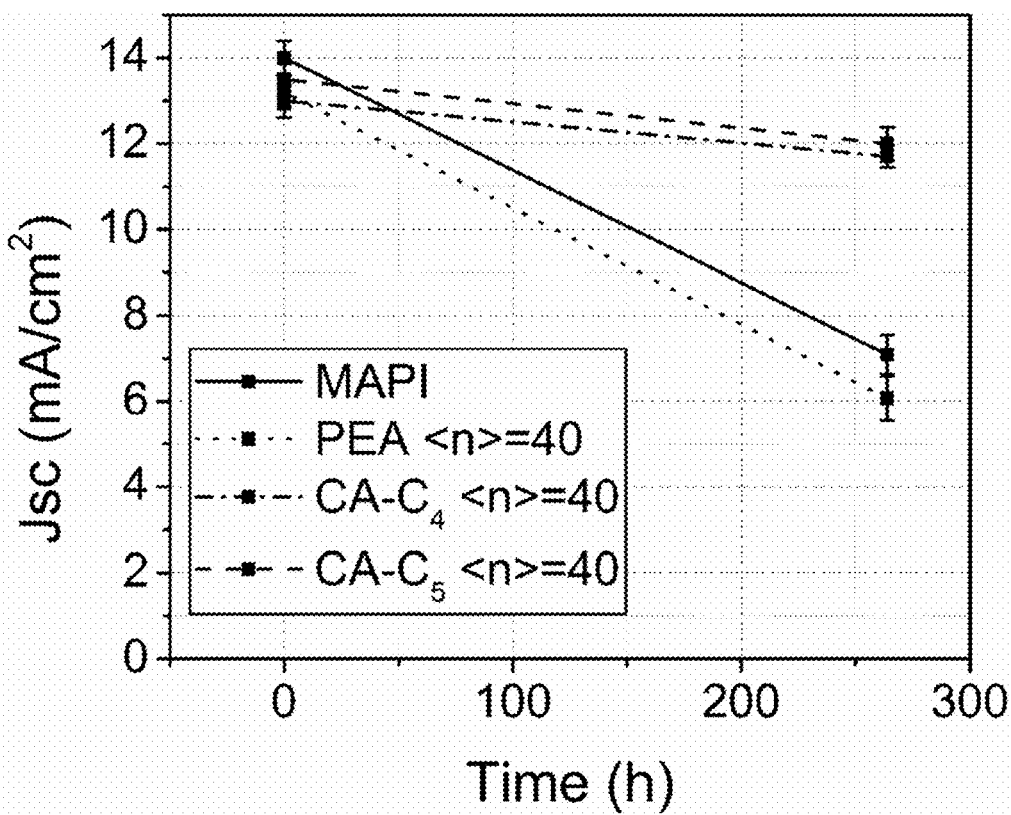
Figure 13:
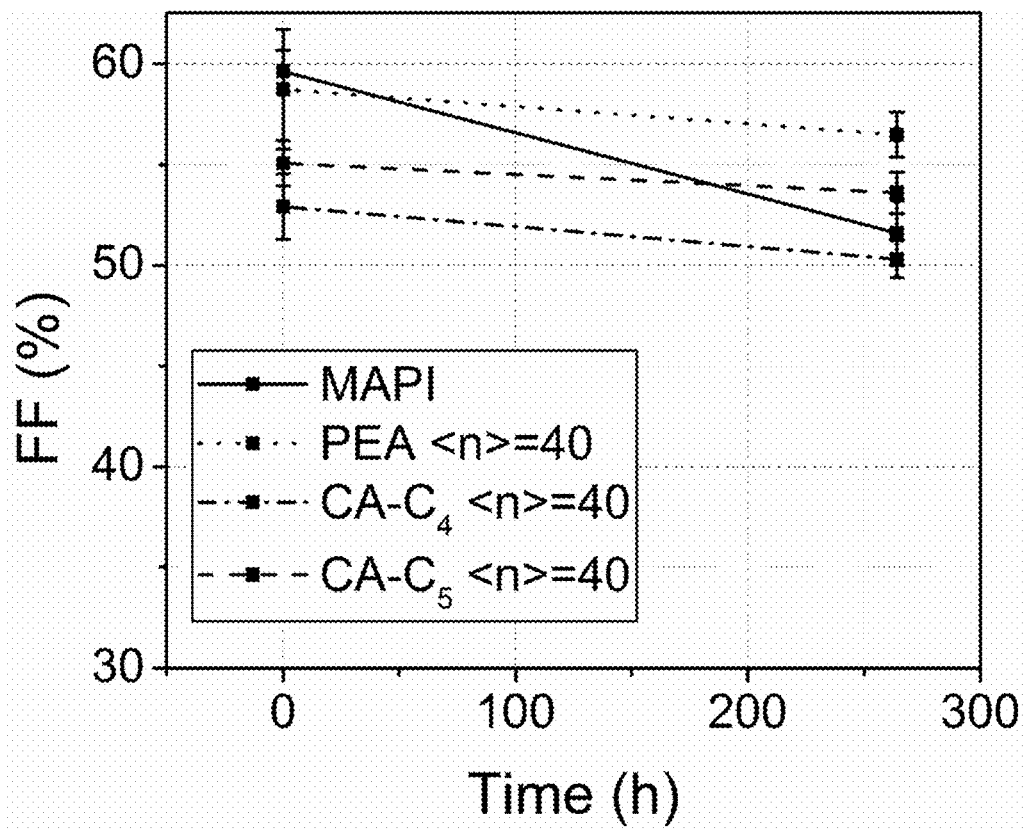

As discussed in the section related to stability, we already see a clear increase in moisture resistance when only a small amount of carbazole is added (<n>=40). In this section, we show photovoltaic performance and moisture stability of carbazole <n>=40 solar cell devices compared to MAPI and PEA <n>=40 devices. Devices were made in an ITO/SnO$_2$/perovskite/Spiro-OMeTAD/Au configuration. Perovskite films are around 200 nm thick, therefore initial short circuit current (Jsc) of devices are between 12.5 and 14.5 mA/cm$^2$ (FIG. 12). FIG. 11 shows that initial power conversion efficiency of carbazole <n>=40 devices are slightly lower than MAPI and PEA <n>=40 devices, which is mainly attributed to lower fill factors (FIG. 13).

Figure 14:
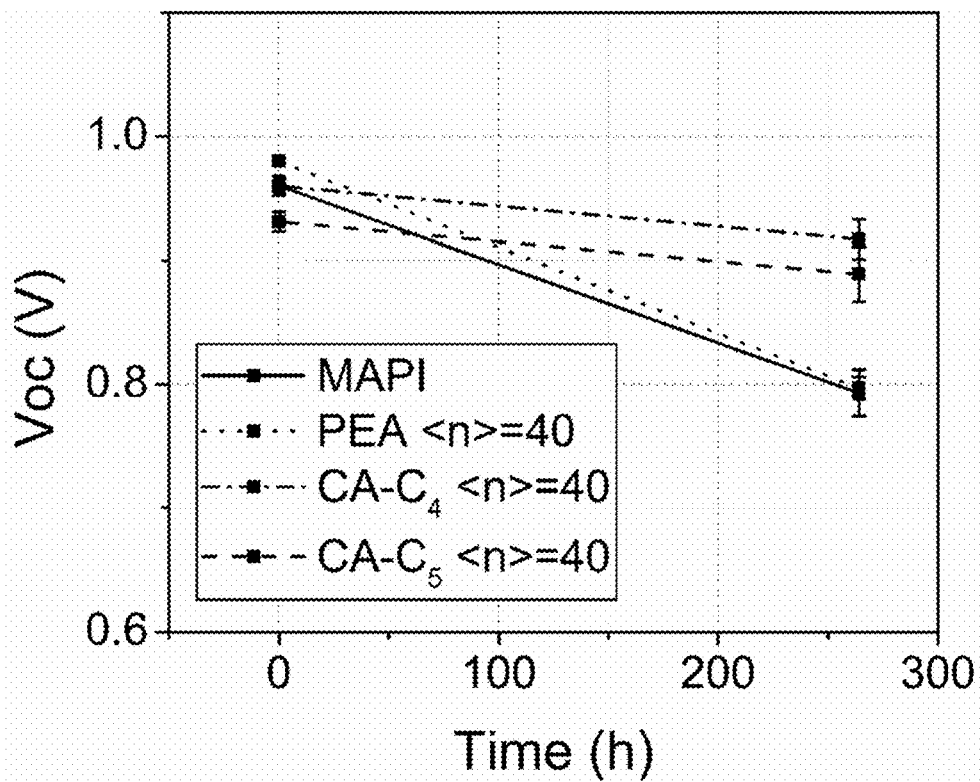

After these devices had been stored in 77% RH air for 264 h in the dark, the color of the carbazole <n>=40 perovskite films stays dark, while MAPI and PEA <n>=40 films turn transparent, indicating they are hydrated. This hydration leads to a drastic decrease of Jsc for MAPI and PEA <n>=40 devices (FIG. 12). In contrast, Jsc of Carbazole <n>=40 devices only slightly decreases. Open circuit voltages of Carbazole <n>=40 devices are also more stable than that of MAPI and PEA <n>=40 devices (FIG. 14). As a result, Carbazole <n>=40 devices main-tain more than 80% of their initial efficiencies, while MAPI and PEA <n>=40 devices lose more than 60% of their initial efficiencies (FIG. 11). These results reveal that adding a small amount of carbazole (<n>=40) in perovskite can remarkably enhance moisture stability of devices and the enhancement effect of carbazole significantly outperforms PEA.

Figure 4:
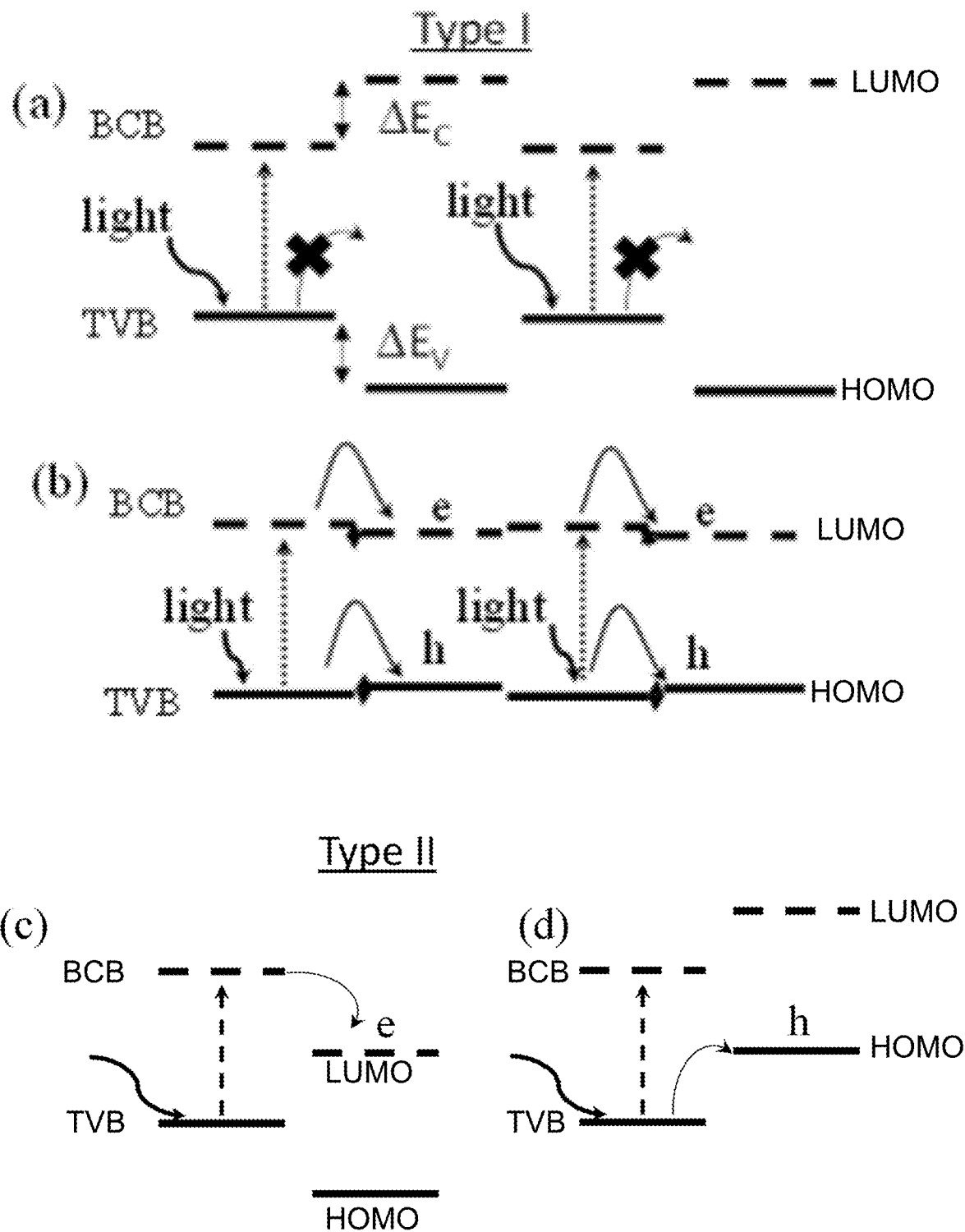
FIG. 4 shows Possible band alignments between the negatively charged layer (left) and Q, Q' or Z (right) for a (a and b) straddling (type I) and (c,d) staggered band alignment (type II).

FIG. 4 shows Possible band alignments between the negatively charged layer (left) and Q or Q' (right) for a (a and b) straddling (type I) and (c,d) staggered band alignment (type II). In case (a), the electron and holes are confined in the negatively charged layer and have to jump through the band gap of the Q or Q' to contribute to the current. In case b, the electron and/or holes are delocalized and can use the electronic structure of the Q or Q' to reach the electrodes. In cases c and d, electrons(c) and holes (d) can be injected into the Q or Q' and transported through this channel to the electrodes. BCB stands for "bottom of the conduction band"; TVB stands for "top of the valence band"; e stands for "electron"; h stands for "hole", (ΔEc) stands for "difference in the bottom of the conduction bands", and (ΔEv) stands for "difference in the top of the valence bands".

It is to be understood that although preferred embodiments, specific constructions and configurations, as well as materials, have been discussed herein for devices according to the present invention, various changes or modifications in form and detail may be made without departing from the scope and technical teachings of this invention. For example, any formulas given above are merely representative of procedures that may be used. Functionality may be added or deleted from the block diagrams and operations may be interchanged among functional blocks. Steps may be added or deleted to methods described within the scope of the present invention.

What is claimed is:

1. A perovskite material comprising:
negatively charged layers alternated with and neutralized by positively charged layers;
the negatively charged layers having a general formula selected from the list consisting of:

$L_{n-1}M_nX_{3n+1}$, $L_nM_nX_{3n+2}$, and $L_{n-1}M'_nX_{3n+3}$;

the positively charged layers comprising:
one or more organic ammonium cations independently selected from monovalent cations (Q) and divalent cations (Q'), or
a polyvalent cationic conjugated organic polymer (Z);
wherein
Q, Q' and Z each comprise a π-conjugated system in which at least 6 atoms participate,
L is a monovalent cation,
$M_n$ are n independently selected metal cations M averaging a valence of two,
$M'_n$ are n independently selected metal cations M' averaging a valence equal to 2+2/n,
X is a monovalent anion, and
n is 1 or larger than 1; and wherein:
the one or more organic ammonium cations are two organic ammonium cations that together form an intermolecular charge-transfer complex within the positively charged layers, or
each positively charged layer comprises a further compound capable of forming an intermolecular charge-transfer complex within the positively charged layer with at least one of the one or more organic ammonium cations,
wherein the intermolecular charge-transfer complex comprises an organic electron donor and an organic electron acceptor that are ionized or partly ionized, and
wherein the organic electron donor and organic electron acceptor are charge-neutral compounds before being mixed to form the intermolecular charge-transfer complex.

2. The perovskite material of claim 1, wherein Q has a general chemical formula R—$(CH_2)_m$—$NH_3^+$ and Q' has a general chemical formula $NH_3^+$—$(CH_2)_m$—R—$(CH_2)_{m'}$—$NH_3^+$ wherein R comprises the π-conjugated system; wherein 0≤m≤20; and 0≤m'≤20.

3. The perovskite material of claim 1, wherein an ammonium group in the Q or the Q' is directly attached to the conjugated system.

4. The perovskite material of claim 1, wherein the monovalent cations Q and/or the divalent cations Q' interact with one another by π-π stacking of the π-conjugated systems they comprise.

5. The perovskite material of claim 1, wherein a bandgap of a monovalent cation Q, a divalent cation Q' or a polyvalent cationic conjugated organic polymer Z is within 0.5 eV of a bandgap of the material making the negatively charged layer.

6. The perovskite material of claim 1, wherein a top of a valence band of a monovalent cation Q, a divalent cation Q' or a polyvalent cationic conjugated organic polymer Z is within 1 eV of a top of a valence band of the material making the negatively charged layer, and/or wherein a bottom of a conduction band of a monovalent cation Q or divalent cation Q' is within 1 eV of a bottom of a conduction band of the material making the negatively charged layer.

7. The perovskite material of claim 1, wherein one or more X in the formulae is substituted by a corresponding number of anions independently selected from $Se^{2-}$ and $S^{2-}$ if a corresponding number of divalent metal cations M or M' are replaced by a corresponding number of trivalent metal cations M or M'.

8. The perovskite material of claim 1, wherein Q, Q' and Z each comprise a π-conjugated system in which at least 8 atoms participate.

9. The perovskite material of claim 1, wherein Q, Q' and Z each comprise a π-conjugated system in which at least 10 atoms participate.

10. The perovskite material of claim 1, wherein a top of a valence band of a monovalent cation Q, a divalent cation Q' or a polyvalent cationic conjugated organic polymer Z is within 0.5 eV of a top of a valence band of the material making the negatively charged layer, and/or wherein a bottom of a conduction band of a monovalent cation Q or divalent cation Q' is within 0.5 eV of a bottom of a conduction band of the material making the negatively charged layer.

11. The perovskite material of claim 1, wherein a top of a valence band of a monovalent cation Q, a divalent cation Q' or a polyvalent cationic conjugated organic polymer Z is within 0.1 eV of a top of a valence band of the material making the negatively charged layer, and/or wherein a bottom of a conduction band of a monovalent cation Q or divalent cation Q' is within 0.1 eV of a bottom of a conduction band of the material making the negatively charged layer.

12. A method for forming the perovskite material of claim 1, comprising:
    forming a precursor mixture by mixing:
        one or more compounds independently selected from $MX$, $MX_2$, and $MX_3$ in such a way that the molar average of the metal M valence is equal to 2 if the perovskite material is selected from $L_{n-1}M_nX_{3n+1}$ and $L_nM_nX_{3n+2}$, and is equal to $2+2/n$ if the perovskite material is $L_{n-1}M'_nX_{3n+3}$,
        a compound LX, and
        one or more organic ammonium salts independently selected from QX and $Q'X_2$, or a conjugated organic polymer salt $ZX_v$, wherein v is the valence of the polyvalent cationic conjugated organic polymer Z; and
    annealing the precursor mixture;
    wherein M, M', X, L, Q, Q', and Z are as defined in claim 1.

13. The method of claim 12, wherein the forming the precursor mixture by mixing comprises dissolving the MX, $MX_2$, $MX_3$, the LX and the one or more organic ammonium salts selected from QX and $Q'X_2$ or the conjugated organic polymer salt $ZX_v$ in a solvent.

14. The method of claim 12, further comprising after the forming the precursor mixture by mixing and before the annealing the precursor mixture, of providing the precursor mixture on a substrate.

15. A photovoltaic cell comprising the perovskite material of claim 1.

16. The photovoltaic cell of claim 15, comprising an active layer, wherein the active layer is interposed between two charge collection layers, and wherein the negatively charged layers are oriented such that there is an angle between the negatively charged layers on the one hand and the charge collection layers on the other hand of between 30° and 150°.

17. The photovoltaic cell of claim 15, comprising an active layer, wherein the active layer is interposed between two charge collection layers, and wherein the negatively charged layers are oriented such that there is an angle between the negatively charged layers on the one hand and the charge collection layers on the other hand of between 80° and 100°.

18. A perovskite material comprising:
    negatively charged parts neutralized by positively charged parts;
    the negatively charged parts having a general formula selected from the list consisting of:
        $MX_3$,
        $L_{n-1}M_nX_{3n+1}$,
        $L_nM_nX_{3n+2}$, and
        $L_{n-1}M'_nX_{3n+3}$;
    the positively charged parts comprising:
        one or more organic ammonium cations independently selected from monovalent cations (Q) and divalent cations (Q'), or
        a polyvalent cationic conjugated organic polymer (Z);
    wherein
        Q, Q' and Z each comprise a π-conjugated system in which at least 6 atoms participate,
        L is a monovalent cation,
        $M_n$ are n independently selected metal cations M averaging a valence of two,
        $M'_n$ are n independently selected metal cations M' averaging a valence equal to $2+2/n$,
        X is a monovalent anion, and
        n is 1 or larger than 1; and
    wherein:
        the one or more organic ammonium cations are two organic ammonium cations that together form an intermolecular charge-transfer complex within the positively charged parts, or
        each positively charged part comprises a further compound capable of forming an intermolecular charge-transfer complex within the positively charged part with at least one of the one or more organic ammonium cations,
    wherein the intermolecular charge-transfer complex comprises an organic electron donor and an organic electron acceptor that are ionized or partly ionized, and
    wherein the organic electron donor and organic electron acceptor are charge-neutral compounds before being mixed to form the intermolecular charge-transfer complex.

19. The perovskite material of claim 18, wherein the negatively charged parts have a general formula $MX_3$, wherein each negatively charged part is formed of parallel strings, each string having the general formula $MX_3$ and sharing no atom with another string.

20. A method for forming crystals of a perovskite material of claim 18, the method comprising:
    forming a precursor mixture by mixing in a solvent:
        one or more compounds independently selected from $MX$, $MX_2$, and $MX_3$ in such a way that the molar average of the metal M valence is equal to 2,
        one or more organic ammonium salts independently selected from QX and $Q'X_2$, or a conjugated organic polymer salt $ZX_v$, wherein v is the valence of the polyvalent cationic conjugated organic polymer Z, and
        one or more further compounds capable of forming a charge-transfer complex with at least one organic ammonium cation of the one or more organic ammonium salts; and
    adding gradually a nonsolvent to the precursor mixture;
    wherein M, X, Q, Q', and Z are as defined in claim 18.

* * * * *

UNITED STATES PATENT AND TRADEMARK OFFICE
CERTIFICATE OF CORRECTION

PATENT NO. : 11,557,440 B2
APPLICATION NO. : 16/744686
DATED : January 17, 2023
INVENTOR(S) : Laurence Lutsen et al.

Page 1 of 3

It is certified that error appears in the above-identified patent and that said Letters Patent is hereby corrected as shown below:

On the Title Page

Column 1, Line 2, under Related U.S. Application Data, delete "Jul. 25, 2017." and insert --Jul. 24, 2018.--.

In the Specification

In Column 5, Line 16, delete "1:1" and insert --1:1.--.

In Column 6, Line 54, after "materials)" insert --.--.

In Column 9, Line 43, delete "$X_{3n+2}$," and insert --$X_{3n+2}$,--.

In Column 10, Line 54, delete "$M_n^{2+}$" and insert --$Mn^{2+}$--.

In Column 17, Lines 15-26, delete " 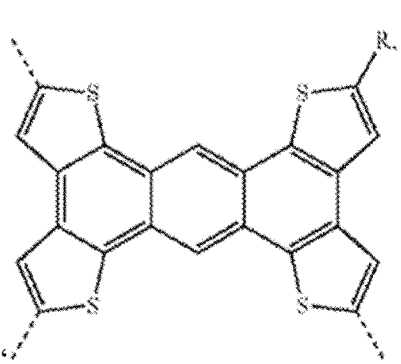 " and

Signed and Sealed this
Nineteenth Day of September, 2023

Katherine Kelly Vidal
*Director of the United States Patent and Trademark Office*

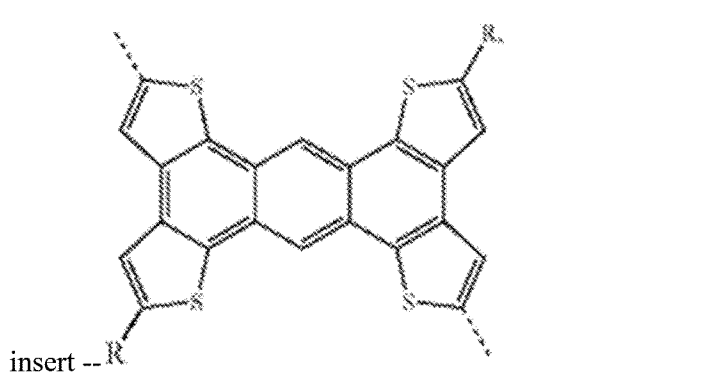
insert -- --.
In Column 19, Line 19 (Approx.), insert
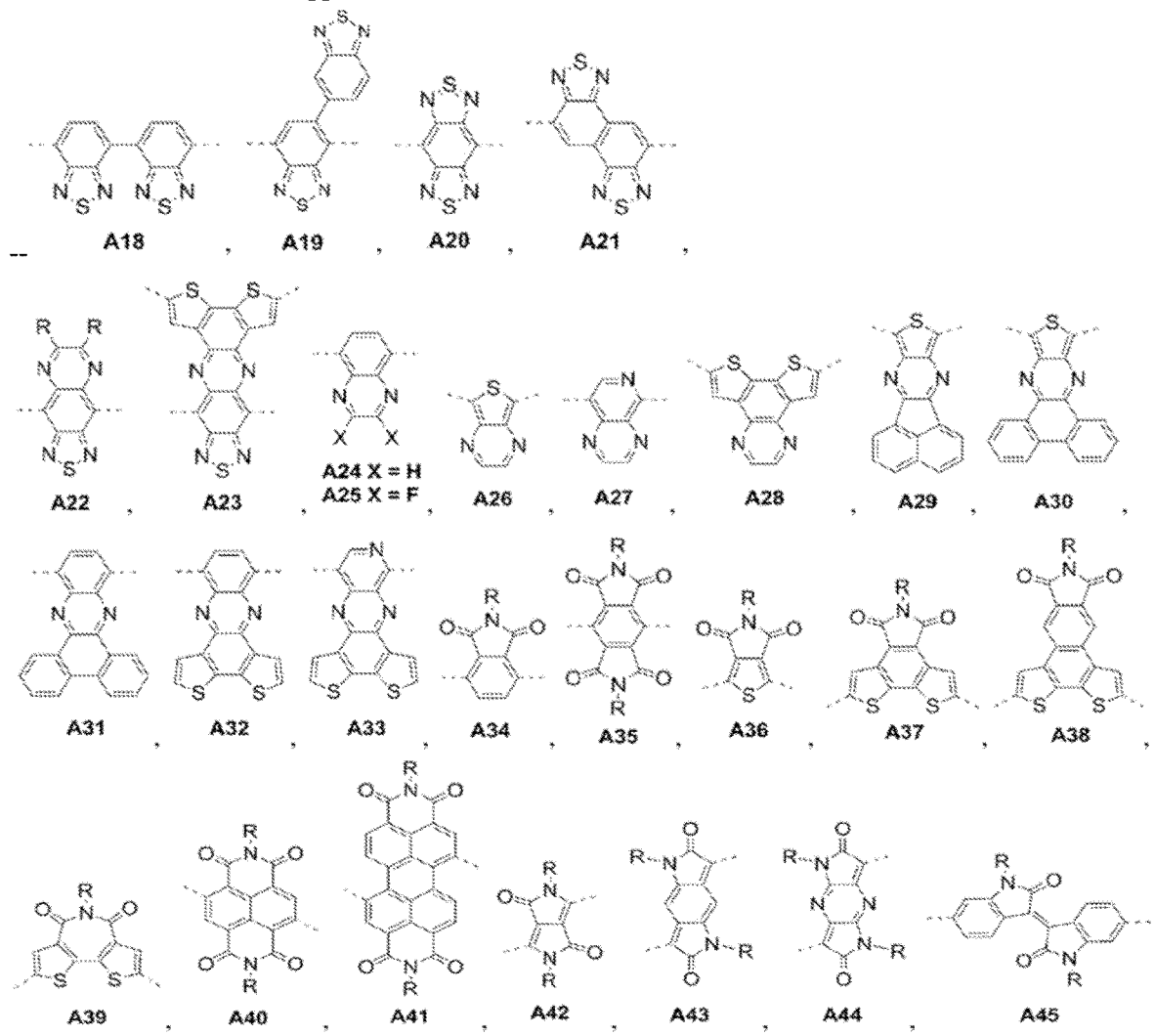

CERTIFICATE OF CORRECTION (continued)

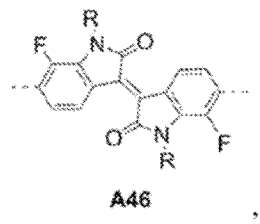

A46 '--.

In Column 27, Line 10, delete "oxidiazole" and insert --oxadiazole--.

In Column 27, Line 10, after "below)" insert --.--.

In Column 31, Line 41, delete "invention" and insert --invention.--.

In Column 32, Line 56, delete "Photoluminesence" and insert --Photoluminescence--.

In Column 45, Line 10 (Approx.), delete "oxidiazole" and insert --oxadiazole--.

In Column 45, Line 15 (Approx.), delete "oxidiazole" and insert --oxadiazole--.

In Column 51, Line 25, delete "(Marcomolecules," and insert --(Macromolecules,--.

In Column 52, Line 10 (Approx.), delete "inbetween" and insert --in between--.

In Column 53, Line 7, delete "main-tain" and insert --maintain--.

In the Claims

In Column 53, Claim 1, Line 58, delete "wherein" and insert --wherein:--.

In Column 56, Claim 18, Line 6, delete "wherein" and insert --wherein:--.

In Column 56, Claim 20, Line 41, delete "a" and insert --the--.